(12) United States Patent
Park et al.

(10) Patent No.: US 8,139,387 B2
(45) Date of Patent: Mar. 20, 2012

(54) METHOD OF ERASING A MEMORY DEVICE INCLUDING COMPLEMENTARY NONVOLATILE MEMORY DEVICES

(75) Inventors: Yoon-dong Park, Yongin-si (KR); Jo-won Lee, Suwon-si (KR); Chung-woo Kim, Seongnam-si (KR); Eun-hong Lee, Anyang-si (KR); Sun-ae Seo, Hwaseong-si (KR); Woo-joo Kim, Suwon-si (KR); Hee-soon Chae, Yongin-si (KR); Soo-doo Chae, Seongnam-si (KR); I-hun Song, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/662,989

(22) Filed: May 14, 2010

(65) Prior Publication Data

US 2010/0296347 A1 Nov. 25, 2010

Related U.S. Application Data

(62) Division of application No. 12/025,372, filed on Feb. 4, 2008, now Pat. No. 7,719,871, which is a division of application No. 11/154,941, filed on Jun. 17, 2005, now Pat. No. 7,345,898.

(30) Foreign Application Priority Data

Jun. 17, 2004 (KR) .......................... 10-2004-0045044

(51) Int. Cl.
*G11C 5/06* (2006.01)
(52) U.S. Cl. .............................. 365/63; 365/51; 365/49

(58) Field of Classification Search ............. 365/185.29, 365/63, 51, 49, 185.33, 185.26, 185.18, 185.27
See application file for complete search history.

(56) References Cited

U.S. PATENT DOCUMENTS

| | | | |
|---|---|---|---|
| 5,095,461 A * | 3/1992 | Miyakawa et al. ...... 365/185.14 |
| 5,306,935 A | 4/1994 | Esquivel et al. |
| 7,042,030 B2 | 5/2006 | Balasuramanian et al. |
| 7,313,026 B2 | 12/2007 | Shiba et al. |
| 2002/0159297 A1* | 10/2002 | Yoshida ................... 365/185.28 |
| 2003/0030074 A1 | 2/2003 | Walker et al. |
| 2004/0173830 A1* | 9/2004 | Yokozeki et al. ............. 257/296 |
| 2005/0013166 A1* | 1/2005 | Chen et al. ............... 365/185.03 |
| 2006/0097306 A1* | 5/2006 | Kim et al. ..................... 257/315 |
| 2006/0203541 A1 | 9/2006 | Toda |
| 2008/0025096 A1 | 1/2008 | Kim et al. |

FOREIGN PATENT DOCUMENTS

| | | |
|---|---|---|
| JP | 06-077500 A | 3/1994 |
| JP | 06-125091 A | 5/1994 |
| JP | 11-284500 A | 10/1999 |
| JP | 2001-110916 A | 4/2001 |
| JP | 2003-152192 A | 5/2003 |
| JP | 2003-338559 A | 11/2003 |
| WO | WO 03/017285 A1 | 2/2003 |

* cited by examiner

*Primary Examiner* — Dang Nguyen
(74) *Attorney, Agent, or Firm* — Lee & Morse, P.C.

(57) ABSTRACT

Provided are a complementary nonvolatile memory device, methods of operating and manufacturing the same, a logic device and semiconductor device having the same, and a reading circuit for the same. The complementary nonvolatile memory device includes a first nonvolatile memory and a second nonvolatile memory which are sequentially stacked and have a complementary relationship. The first and second nonvolatile memories are arranged so that upper surfaces thereof are contiguous.

10 Claims, 35 Drawing Sheets

METHOD OF ERASING A MEMORY DEVICE INCLUDING COMPLEMENTARY NONVOLATILE MEMORY DEVICES

CROSS REFERENCE TO RELATED APPLICATION(S)

This is a divisional application based on application Ser. No. 12/025,372, filed Feb. 4, 2008 now U.S. Pat. No. 7,719,871, which in turn is a division of application Ser. No. 11/154,941, filed Jun. 17, 2005, now U.S. Pat. No. 7,345,898 B2, the entire contents of which is hereby incorporated by reference.

BACKGROUND OF THE INVENTION

1. Field of the Invention

The present invention relates to a memory device, and a method of manufacturing the same. More particularly, the present invention relates to a complementary nonvolatile memory device, methods of operating and manufacturing the same, a logic device and semiconductor device including the same, and a reading circuit for the same.

2. Description of the Related Art

Nonvolatile memory devices include read only memory (ROM), which can be categorized as a mask ROM, which is programmed during manufacture, an electrically erasable and programmable read only memory (EEPROM), and others. A flash memory, which is also a nonvolatile memory device, is a modification of a conventional EEPROM, and includes a cell array in which erasing is performed in block units, sector units, or chip units and programming is performed in bit units.

The architecture of a flash memory can be divided into a NOR type and a NAND type. Cells of a NOR type flash memory are arrayed in parallel between a bit line and a ground line. Cells of a NAND type flash memory are arrayed in series.

In more detail, a NOR type flash memory can be classified into an AND type, a DINOR type, and a virtual ground array (VGA) type. In a NOR type flash memory, since address decoding required for reading and programming is similar to that for a DRAM, a peripheral circuit may be simple and access time may be shortened. On the other hand, each and every cell requires a contact electrode of a bit line, thus increasing cell area and lengthening time for erasing and programming as compared with a NAND type flash memory.

In a NAND type flash memory, erasing and programming are faster than in a NOR type flash memory. However, reading speed may be relatively slow, since a pertinent block must be selected before being read and serial connection of cells leads to an increase in operating resistance.

A conventional flash memory is typically an N-type memory that can store only one bit per cell on the principle that the threshold voltage of a channel depends upon injection or emission of electrons into or from nitride. That is, the number of bits to be stored per cell may be restricted. Also, since the conventional flash memory operates in such a manner that previous data may be entirely erased and new data may be rewritten irrespective of previous memory state, resulting in significant power dissipation.

Particularly, in a read operation, data "0" or "1" may be detected depending on a current difference measured at a reading voltage using a current displacement according to a shift in threshold voltage. If the number of bits per cell is two or more, a current difference measured at the reading voltage may be high and a large current may be supplied, thus dissipating a large amount of power. Thus, a continuous bit scale-up may be difficult.

To overcome this drawback, data may be read using a method of measuring a threshold voltage when reaching a reference current. However, this method is a current detecting method and typically requires complicated circuit construction including comparators and sense amplifiers.

SUMMARY OF THE INVENTION

The present invention is therefore directed to a complementary nonvolatile memory device, methods of operating and manufacturing the same, a logic device and semiconductor device including the same, and a reading circuit for the same, which substantially overcomes one or more of the problems due to the limitations and disadvantages of the related art.

It is a feature of an embodiment of the present invention to provide a complementary nonvolatile memory device that increases the number of bits per cell.

It is another feature of an embodiment of the present invention to provide a voltage detecting method that overcomes the limitations of a bit scale-up of nonvolatile memory device.

It is still another feature of an embodiment of the present invention to provide a nonvolatile memory device that improves operating speed.

It is yet another feature of an embodiment of the present invention to provide a nonvolatile memory device that reduces power dissipation during operation.

It is still another feature of an embodiment of the present invention to provide a nonvolatile memory device that enables access by cell unit.

It is yet another feature of an embodiment of the present invention to provide a nonvolatile memory device that performs reading, erasing, and writing at the same time.

It is still another feature of an embodiment of the present invention to provide a nonvolatile memory device that shortens a process.

It is yet another feature of an embodiment of the present invention to provide a nonvolatile memory device that has a high level of integration.

It is still another feature of an embodiment of the present invention to provide a nonvolatile memory device that embodies a memory and a logic circuit as a single chip.

At least one of the above and other features and advantages of the present invention may be realized by providing a complementary memory device including a first nonvolatile memory and a second nonvolatile memory, which are sequentially stacked and have a complementary relationship to each other, wherein the second nonvolatile memory may be inverted.

The complementary memory device may further include a bonding member disposed between the first and second nonvolatile memories.

Each nonvolatile memory may include a substrate including isolation layers, a first impurity region and a second impurity region disposed between the first isolation layers, and a channel region disposed between the first and second impurity regions, and a gate stacked structure disposed on the first channel region. The first and second impurity regions of the first nonvolatile memory may have a first impurity type and the first and second impurity regions of the second nonvolatile memory may have a second impurity type. Each nonvolatile memory may further include a first contact pad layer and a second contact pad layer disposed on and extending outside the first and second impurity regions, respectively. The second impurity region of the first nonvolatile memory and the second impurity region of the second nonvolatile memory may be connected to each other.

The nonvolatile memories may further include a first contact pad layer and a second contact pad layer disposed on and extending outside the first and second impurity regions, respectively; and a first interlayer dielectric covering the first and second contact pad layers and the gate stacked structure.

The extending length of the first and second contact pad layers in the second nonvolatile memory may be shorter than that of the first and second contact pad layers of the first nonvolatile memory.

The first substrate may include a SOI substrate or a silicon substrate. The gate stacked structure may include a data storage layer, which may include one of a silicon nitride layer, a nano-dot layer, and a high-k layer.

The complementary nonvolatile memory device may further include a first conductive plug and a second conductive plug disposed in a stacked structure including the substrate, the isolation layers, the interlayer dielectric of the second nonvolatile memory, and the interlayer dielectric of the first nonvolatile memory, and connected to the first and second contact pad layers of the first nonvolatile memory, respectively. The complementary nonvolatile memory device may further include a third conductive plug and a fourth conductive plug disposed in a stacked structure including the substrate and the isolation layers of the second nonvolatile memory, and connected to the first and second contact pad layers of the second nonvolatile memory, respectively. The complementary nonvolatile memory device may further include a first gate conductive plug disposed in a stacked structure including the substrate, the isolation layers, and the interlayer dielectric of the second nonvolatile memory, and the first interlayer dielectric of the first nonvolatile memory and connected to the gate stacked structure of the first nonvolatile memory; a second gate conductive plug disposed in the substrate of the and connected to the gate stacked structure of the second nonvolatile memory. First through fourth contact pads may disposed around the first through fourth conductive plugs of the second substrate and covering the entire surfaces of the first through fourth conductive plugs, respectively. A first gate contact pad and a second gate contact pad may be disposed around the first and second gate conductive plugs and may cover the entire surfaces of the first and second gate conductive plugs, respectively.

The interlayer dielectric of the first nonvolatile memory may be disposed such that the top surface of the gate stacked structure of the first nonvolatile memory may be exposed. The interlayer dielectric of the second nonvolatile memory may be disposed such that the top surface of the gate stacked structure of the second nonvolatile memory may be exposed.

The first and second contact pad layers of the first nonvolatile memory may extend onto or over the isolation layers of the first nonvolatile memory. The first and second contact pad layers of the second nonvolatile memory may extend onto or over the isolation layers of the second nonvolatile memory.

The complementary nonvolatile memory device may further include an interlayer dielectric covering the gate stacked structure of the second nonvolatile memory and bonded to the interlayer dielectric of the first nonvolatile memory. Alternatively, the first through fourth conductive plugs may be connected to the first and second impurity regions of the first and second nonvolatile memories, respectively At least one of the above and other features and advantages of the present invention may be realized by providing a method including reading data written in the first and second nonvolatile memories; and comparing the read data (hereinafter, first data) with data to be written (hereinafter, second data).

When the comparison result is that the first data is the same as the second data, the data written in the first and second nonvolatile memories may remain stored. When the comparison result is that the first data is wholly different from the second data, the method may further include applying a voltage between the first and second impurity regions of the first nonvolatile memory such that there may be an electric potential difference therebetween, applying a first write voltage to the gate stacked structure of the first nonvolatile memory, applying a voltage between the first and second impurity regions of the second nonvolatile memory such that there may be an electric potential difference therebetween; and applying a second write voltage to the gate stacked structure of the second nonvolatile memory.

When the comparison result is that the first data is partially different from the second data, data written in one of the first and second nonvolatile memories may remain stored, and data written in the other of the first and second nonvolatile memories may be changed.

Data written in the second nonvolatile memory may remain stored by applying 0 V to the first and second impurity regions and the gate stacked structure of the second nonvolatile memory. Data may be written in the second nonvolatile memory by applying a voltage between the first and second impurity regions such that there is an electric potential difference therebetween and applying a write voltage to the gate stacked structure of the second nonvolatile memory.

At least one of the above and other features and advantages of the present invention may be realized by providing an erasing method of the complementary nonvolatile memory device including applying a voltage between the first and second impurity regions of the second nonvolatile memory such that there is an electric potential difference therebetween; and erasing data written in the second nonvolatile memory by applying an erase voltage to the gate structure of second nonvolatile memory.

The erasing method may further include applying a voltage between the first and second impurity regions of the first nonvolatile memory such that there is an electric potential difference therebetween; and erasing data written in the first nonvolatile memory by applying an erase voltage to the gate structure of the first nonvolatile memory.

Before erasing the data, reading and confirming data written in the first and second nonvolatile memories may be performed. Also, before erasing the data written in the first nonvolatile memory, reading and confirming data written in the first and second nonvolatile memories may be performed.

At least one of the above and other features and advantages of the present invention may be realized by providing an erasing method of the complementary nonvolatile memory device including applying a voltage between the first and second impurity regions of the first nonvolatile memory such that there is an electric potential difference therebetween; and erasing data written in the first nonvolatile memory by applying an erase voltage to the gate stacked structure of the first nonvolatile memory. Before erasing the data, reading and confirming data written in the first and second nonvolatile memories may be performed.

At least one of the above and other features and advantages of the present invention may be realized by providing a reading method of the complementary nonvolatile memory device including applying a voltage to the first and second gate stacked structure and lowering the voltage slowly until an output voltage may be detected from the nonvolatile memory device, reading first data written in the first nonvolatile memory by perceiving a voltage applied to the first and second gate stacked structure when a first output voltage may be detected from the nonvolatile memory device, cutting off the voltage applied to the first and second gate stacked structures at the same time as when the first output voltage may be detected from the nonvolatile memory device, directly after the voltage may be cut off, measuring a second output voltage of the nonvolatile memory device when a voltage that enables reading of data written in the second nonvolatile memory may be applied to the first and second gate stacked structures, based on a complementary characteristic curve of input voltage-to-output voltage characteristics of the first and second nonvolatile memories, reading second data written in the second nonvolatile memory by comparing the voltage applied to the first and second gate stacked structures when the first output voltage may be detected with the second output voltage, and combining and outputting the first and second data.

The reading of the first data written in the first nonvolatile memory may further include comparing a voltage output from the nonvolatile memory device with a first reference voltage while a voltage may be being applied to the first and second gate stacked structures, comparing the voltage applied to the first and second gate stacked structures with a second reference voltage at the moment when the voltage output from the nonvolatile memory device becomes the first output voltage, and outputting bit data corresponding to data written in the first nonvolatile memory when the voltage applied to the first and second gate stacked structures at the moment when the voltage output from the nonvolatile memory device becomes the first output voltage may be higher than the second reference voltage.

The second output voltage may be measured using a voltage comparing circuit connected to output terminals of the first and second nonvolatile memories. The measuring of the second output voltage of the nonvolatile memory device may include applying a voltage of 0 V to the first and second gate stacked structures directly after the voltage may be cut off. The voltage of 0 V may be applied from a transistor, which may be turned on at the same time as when the voltage may be cut off and has one terminal that may be grounded and the other terminal connected between a power supply and the first and second gate stacked structures of the nonvolatile memory device.

The reading method may further include, after data written in the nonvolatile memory device may be read, partially or wholly changing the read data. At least 1-bit data may be written in each of the first and second nonvolatile memories.

At least one of the above and other features and advantages of the present invention may be realized by providing a reading method of the complementary nonvolatile memory device including reading first data written in the first nonvolatile memory; reading second data written in the second nonvolatile memory; and combining the first and second data and outputting at least 2-bit data.

The reading of the first data written in the first nonvolatile memory may further include applying a voltage to the first and second gate stacked structures and lowering the voltage until an output voltage may be detected from the nonvolatile memory device, detecting a first output voltage from the nonvolatile memory device; cutting off the voltage applied to the first and second gate stacked structure after the first output voltage may be detected, comparing the voltage applied to the first and second gate stacked structures with a reference voltage at the moment when the first output voltage may be detected, and outputting bit data by encoding the comparison result.

The reading of the second data written in the second nonvolatile memory may include applying a voltage to the first and second gate stacked structures and lowering the voltage slowly until an output voltage may be detected from the nonvolatile memory device, detecting a first output voltage from the nonvolatile memory device, cutting off the voltage applied to the first and second gate stacked structures after the first output voltage may be detected, applying a voltage that enables reading of data written in the second nonvolatile memory to the first and second gate stacked structures, based on a complementary characteristic curve of input voltage-to-output voltage characteristics of the first and second nonvolatile memories, measuring a second output voltage of the nonvolatile memory device when the voltage that enables reading of data written in the second nonvolatile memory may be applied to the first and second gate stacked structures; comparing the second output voltage with a reference voltage; and outputting bit data by encoding the comparison result. The reading method may further include, directly after the voltage applied to the first and second gate stacked structures may be cut off, applying a voltage of 0 V to the first and second gate stacked structures.

The voltage of 0 V may be applied using a transistor, which may be turned on at the same time when the voltage applied to the first and second gate stacked structures may be cut off and has one terminal that may be grounded and the other terminal connected between a power supply and the first and second gate stacked structures of the nonvolatile memory device.

The reading method may further include, after data written in the nonvolatile memory may be read, partially or wholly changing the read data to other data.

At least one of the above and other features and advantages of the present invention may be realized by providing a method of manufacturing the complementary nonvolatile memory device including forming a first nonvolatile memory on a first substrate; forming a second nonvolatile memory on a second substrate, the second nonvolatile memory having a complementary relationship to the first nonvolatile memory; and bonding the first and second substrates such that the first and second nonvolatile memories face each other.

The forming of the first nonvolatile memory may include forming first isolation layers at predetermined regions of the first substrate, forming first and second impurity regions of a first impurity type apart from each other in the first substrate between the first isolation layers, and forming a first channel region between the first and second impurity regions; forming a first gate stacked structure on the first channel region, the first gate staked structure including at least a data storage layer; forming a first contact pad layer and a second contact pad layer on the first and second impurity regions, respectively; forming a first interlayer dielectric on the first substrate, the first interlayer dielectric covering the first gate stacked structure and the first and second contact pad layers; and planarizing the surface of the first interlayer dielectric.

The forming of the first gate stacked structure may include sequentially forming a first insulating layer, a first data storage layer, a second insulating layer, and a first control gate on the first substrate; forming a photoresist pattern on the first control gate, the photoresist pattern defining the first channel region; and sequentially etching the first control gate, the second insulating layer, the first data storage layer, and the first insulating layer using the photoresist pattern as an etch mask. The first and second contact pad layers may be formed such that they extend over or onto the first isolation layers.

The first substrate may be one of a silicon substrate of a second impurity type and a SOI substrate. The second substrate may be one of a silicon substrate of the first impurity type and a SOI substrate.

The forming of the second nonvolatile memory may include forming second isolation layers on the second substrate, forming first and second impurity regions of the second type in the second substrate between the second isolation layers, and forming a second channel between the first and second impurity regions; forming a second gate stacked structure on the second channel region, the second stacked structure including at least a data storage layer; forming a third contact pad layer and a fourth contact pad layer on the first and second impurity regions of the second type, respectively; forming a second interlayer dielectric on the second substrate, the second interlayer dielectric covering the second gate stacked structure and the third and fourth contact pad layers; and planarizing the surface of the second interlayer dielectric.

The surface of the first interlayer dielectric may be planarized until the first gate stacked structure may be exposed. The surface of the second interlayer dielectric may be planarized until the second gate stacked structure may be exposed.

The forming of the second nonvolatile memory may include forming second isolation layers on the second substrate, forming first and second impurity regions of the second type in the second substrate between the second isolation layers, and forming a second channel region between the first and second impurity regions of the n-type, forming a second gate stacked structure on the second channel, the second gate stacked structure including at least a data storage layer, forming a third contact pad layer and a fourth contact pad layer on the first and second impurity regions of the second type, respectively, forming a second interlayer dielectric on the second substrate, the second interlayer dielectric covering the second gate stacked structure and the third and fourth contact pad layers, and planarizing the surface of the second interlayer dielectric.

The forming of the second gate stacked structure may include sequentially forming a third insulating layer, a second data storage layer, a fourth insulating layer, and a second control gate on the second substrate, forming a photoresist pattern on the second control gate, the photoresist pattern defining the second channel region, and sequentially etching the second control gate, the third insulating layer, the second data storage layer, and the fourth insulating layer using the photoresist pattern as an etch mask. The third and fourth contact pad layers may be formed such that they extend over or onto the second isolation layers.

The forming of the second nonvolatile memory may include forming second isolation layers on the second substrate, forming n-type first and second impurity regions in the second substrate between the second isolation layers, and forming a second channel between the n-type first and second impurity regions, forming a second gate stacked structure on the second channel region, the second gate stacked structure including at least a data storage layer, forming a second interlayer dielectric on the second substrate, the second interlayer dielectric covering the second gate stacked structure, and planarizing the surface of the second interlayer dielectric.

The forming of the second interlayer dielectric may include forming second isolation layers on the second substrate, forming n-type first and second impurity regions in the second substrate between the second isolation layers, and forming a second channel between the n-type first and second impurity regions, forming a second gate stacked structure on the second channel region, the second gate stacked structure including at least a data storage layer, forming a second interlayer dielectric on the second substrate, the second interlayer dielectric covering the second gate stacked structure, and planarizing the surface of the second interlayer dielectric.

The manufacturing method may further include, after the bonding of the first and second substrates, forming a first via hole and a second via hole in a stacked structure including the second substrate, the second isolation layers, the second interlayer dielectric, and the first interlayer dielectric, the first and second via holes exposing the first and second contact pad layers, respectively, filling the first and second via holes with a first conductive plug and a second conductive plug, respectively, forming a third via hole and a fourth via hole in a stacked structure including the second substrate, the second isolation layers, and the second interlayer dielectric, the third and fourth via holes exposing the third and fourth contact pad layers, respectively, filling the third and fourth via holes with a third conductive plug and a fourth conductive plug, respectively, forming a first gate via hole in the stacked structure including the second via hole, the second isolation layers, the second interlayer dielectric, and the first interlayer dielectric, the first gate via hole exposing the first gate stacked structure, filling the first gate via hole with a first gate conductive plug, forming a second gate via hole in the second substrate, the second gate via hole exposing the second gate stacked structure, filling the second gate via hole with a second gate conductive plug, and forming a first gate pad and a second gate pad around the first and second gate via holes, respectively, to cover the entire surfaces of the first and second gate conductive plugs, respectively, while forming first through fourth contact pads around the first through fourth via holes, respectively, to cover the entire surfaces of the first through fourth conductive plugs, respectively.

The manufacturing method may further include, after the bonding of the first and second substrates, forming a first via hole and a second via hole in a stacked structure including the second substrate, the second isolation layers, the second interlayer dielectric, and the first interlayer dielectric, the first and second via holes exposing the first and second contact pad layers, respectively, filling the first and second via holes with a first conductive plug and a second conductive plug, respectively, forming a third via hole and a fourth via hole in a stacked structure including the second substrate and the second isolation layers, the third and fourth via holes exposing the third and fourth contact pad layers, respectively, filling the third and fourth via holes with a third conductive plug and a fourth conductive plug, respectively, forming a first gate via hole in the stacked structure including the second via hole, the second isolation layers, the second interlayer dielectric, and the first interlayer dielectric, the first gate via hole exposing the first gate stacked structure, filling the first gate via hole with a first gate conductive plug, forming a second gate via hole in the second substrate, the second gate via hole exposing the second gate stacked structure, filling the second gate via hole with a second gate conductive plug, and forming a first gate pad and a second gate pad around the first and second gate via holes, respectively, to cover the entire surfaces of the first and second gate conductive plugs, respectively, while forming first through fourth contact pads around the first through fourth via holes, respectively, to cover the entire surfaces of the first through fourth conductive plugs, respectively.

After the bonding of the first and second substrates, the manufacturing method may further include forming a first via hole and a second via hole in a stacked structure including the second substrate, the second isolation layers, the second interlayer dielectric, and the first interlayer dielectric, the first and second via holes exposing the first and second contact pad layers, respectively, filling the first and second via holes with a first conductive plug and a second conductive plug, respectively, forming a third via hole and a fourth via hole in the second substrate, the third and fourth via holes exposing the n-type first and second impurity regions, respectively, filling the third and fourth via holes with a third conductive plug and a fourth conductive plug, respectively, forming a first gate via hole in the stacked structure including the second via hole, the second isolation layers, the second interlayer dielectric, and the first interlayer dielectric, the first gate via hole exposing the first gate stacked structure, filling the first gate via hole with a first gate conductive plug, forming a second gate via hole in the second substrate, the second gate via hole exposing the second gate stacked structure, filling the second gate via hole with a second gate conductive plug, and forming a first gate pad and a second gate pad around the first and second gate via holes, respectively, to cover the entire surfaces of the first and second gate conductive plugs, respectively, while forming first through fourth contact pads around the first through fourth via holes, respectively, to cover the entire surfaces of the first through fourth conductive plugs, respectively.

Before the forming of the n-type first and second impurity regions, the manufacturing method may further include forming an impurity layer at a deeper position than positions in which the n-type first and second impurity regions are disposed, the impurity layer dividing the second substrate into two portions. Before the bonding of the first and second substrates, the manufacturing method may further include removing portion of the second substrate divided by the impurity layer, in which the n-type first and second impurity regions are not formed.

At least one of the above and other features and advantages of the present invention may be realized by providing a logic device including the complementary nonvolatile memory device. The logic device may include a first nonvolatile memory, a second nonvolatile memory having a complementary relationship to the first nonvolatile memory, a third nonvolatile memory, and a fourth nonvolatile memory having a complementary relationship to the third nonvolatile memory, wherein the first through fourth nonvolatile memories are sequentially stacked, and the second and fourth nonvolatile memories are inverted and stacked.

The first and fourth nonvolatile memories may be nonvolatile memories of a first type, and the second and third nonvolatile memories may be nonvolatile memories of a second type.

The first nonvolatile memory may include a first substrate including first isolation layers, first and second impurity regions disposed between the first isolation layers, and a first channel region disposed between the first and second impurity regions, a first gate stacked structure disposed on the first channel region, a first contact pad layer and a second contact pad layer disposed on the first and second impurity regions, respectively, and a first interlayer dielectric covering the first and second contact pad layers and the first gate stacked structure.

The second nonvolatile memory may include a second substrate including second isolation layers, third and fourth impurity regions disposed between the second isolation layers, and a second channel region disposed between the third and fourth impurity regions, a second gate stacked structure disposed on the second channel region, a third contact pad layer and a fourth contact pad layer disposed on the third and fourth impurity regions, respectively, and a second interlayer dielectric covering the third and fourth contact pad layers and the second gate stacked structure and bonded to the first interlayer dielectric.

The third nonvolatile memory may include a third substrate including third isolation layers, fifth and sixth impurity regions disposed between the third isolation layers, and a third channel region disposed between the fifth and sixth impurity regions, the third substrate bonded to the second substrate, a third gate stacked structure disposed on the third channel region, a fifth contact pad layer and a sixth contact pad layer disposed on the fifth and sixth impurity regions, respectively, and a third interlayer dielectric covering the fifth and sixth contact pad layers and the third gate stacked structure.

The fourth nonvolatile memory may include a fourth substrate including fourth isolation layers, seventh and eighth impurity regions disposed between the fourth isolation layers, and a fourth channel region disposed between the seventh and eighth impurity regions, a fourth gate stacked structure disposed on the fourth channel region, a seventh contact pad layer and an eighth contact pad layer disposed on the seventh and eighth impurity regions, respectively, and a fourth interlayer dielectric covering the seventh and eighth contact pad layers and the fourth gate stacked structure and bonded to the third interlayer dielectric.

The fourth nonvolatile memory may include a fourth substrate including fourth isolation layers, seventh and eighth impurity regions disposed between the fourth isolation layers, and a fourth channel region disposed between the seventh and eighth impurity regions, a fourth gate stacked structure disposed on the fourth channel region, and a fourth interlayer dielectric covering the fourth gate stacked structure and bonded to the third interlayer dielectric.

Each of the first through fourth substrates may be one of a SOI substrate and a silicon substrate. Also, each of the first through eighth contact pad layers may extend an adjacent isolation layer. Each of some of the first through eight contact pad layers may extend over an adjacent isolation layer, and each of the other extends onto an adjacent isolation layer.

The logic device may further include a first conductive plug and a second conductive plug disposed on a stacked structure disposed on the first and second contact pad layers, respectively, such that they are connected to the first and second contact pad layers, respectively, a third conductive plug and a fourth conductive plug disposed on a stacked structure disposed on the third and fourth contact pad layers, respectively, such that they are connected to the third and fourth contact pad layers, respectively, a fifth conductive plug and a sixth conductive plug disposed on a stacked structure disposed on the fifth and sixth contact pad layers, respectively, such that they are connected to the fifth and sixth contact pad layers, respectively, a seventh conductive plug and an eight conductive plug disposed on a stacked structure disposed on the seventh and eighth contact pad layers, respectively, such that they are connected to the seventh and eight contact pad layers, respectively, a first gate conductive plug disposed on a stacked structure disposed on the first gate stacked structure such that it may be connected to the first gate stacked structure, a second gate conductive plug disposed on a stacked structure disposed on the second gate stacked structure such that it may be connected to the second gate stacked structure, a third gate conductive plug disposed on a stacked structure disposed on the third gate stacked structure such that it may be connected to the third gate stacked structure, a fourth gate conductive plug disposed on a stacked structure disposed on the fourth gate stacked structure such that it may be connected to the fourth gate stacked structure, a first contact pad connecting the first, third, and seventh conductive plugs, a second contact pad connecting the fourth and sixth conductive plugs, a third contact pad connecting the second and eighth conductive plugs, a fourth contact pad connected to the fifth conductive plug, a first gate contact pad connecting the first and second gate conductive plugs, and a second gate contact pad connecting the third and fourth gate conductive plugs.

The logic device may further include a first conductive plug and a second conductive plug disposed on a stacked structure disposed on the first and second contact pad layers, respectively, such that they are connected to the first and second contact pad layers, respectively, a third conductive plug and a fourth conductive plug disposed on a stacked structure disposed on the third and fourth contact pad layers, respectively, such that they are connected to the third and fourth contact pad layers, respectively, a fifth conductive plug and a sixth conductive plug disposed on a stacked structure disposed on the fifth and sixth contact pad layers, respectively, such that they are connected to the fifth and sixth contact pad layers, respectively, a seventh conductive plug and an eight conductive plug disposed on a stacked structure disposed on the seventh and eighth contact pad layers, respectively, such that they are connected to the seventh and eight contact pad layers, respectively, a first gate conductive plug disposed on a stacked structure disposed on the first gate stacked structure such that it may be connected to the first gate stacked structure, a second gate conductive plug disposed on a stacked structure disposed on the second gate stacked structure such that it may be connected to the second gate stacked structure, a third gate conductive plug disposed on a stacked structure disposed on the third gate stacked structure such that it may be connected to the third gate stacked structure, a fourth gate conductive plug disposed on a stacked structure disposed on the fourth gate stacked structure such that it may be connected to the fourth gate stacked structure, a first contact pad connecting the first, third, fifth, and seventh conductive plugs, a second contact pad connecting the fourth and sixth conductive plugs, a third contact pad connecting the second and eighth conductive plugs, a first gate contact pad connecting the first and second gate conductive plugs, and a second gate contact pad connecting the third and fourth gate conductive plugs.

Each of the first through fourth gate stacked structures may include a first insulating layer, one or more data storage layers, a second insulating layer, and a control gate, which are sequentially stacked. The first through eighth contact pad layers may have the same extending length. Some of the first through eighth contact pad layers may have a different extending length than the extending length of the other thereof.

Among the first, third, fifth, and seventh contact pad layers, the first contact pad layer may have the longest extending length, the third contact pad layer may have the second longest extending length, the fifth contact pad layer may have the third longest extending length, and the seventh contact pad layer may have the shortest extending length.

At least some of the first through eighth contact pad layers may extend in different directions. The first through sixth contact pad layers may extend to the same length. At least some of the first through sixth contact pad layers may extend in different directions. Also, among the first, third, and fifth contact pad layers, the first contact pad layer may have the longest extending length, the third contact pad layer has a second longest extending length, and the fifth contact pad layer has the shortest extending length. Also, among the first, third, fifth, and seventh contact pad layers, the first contact pad layer may have the longest extending length, the third contact pad layer may have the second longest extending length, the fifth contact pad layer may have the third longest extending length, and the seventh contact pad layer may have the shortest extending length.

At least one of the above and other features and advantages of the present invention may be realized by providing a CMOSFET including a first transistor and a second transistor having a complementary relationship to the first transistor, wherein the first and second transistors may be bonded to each other such that the gates of the first and second transistors face each other.

The semiconductor device may further include a first semiconductor device on which the CMOSFET may be disposed and also further include a second semiconductor device disposed on the CMOSFET. The first semiconductor device may include at least one of an input (output (I/O) & control device, a radio-frequency (RF) application specific integrated circuits (ASIC) device, and an analog ASIC device. The second semiconductor device may include at least one of a central processing unit (CPU), a cache memory, a main memory, and a digital signal processor (DSP) chip, etc.

At least one of the above and other features and advantages of the present invention may be realized by providing a reading circuit for the complementary nonvolatile memory device including a first nonvolatile memory and a second nonvolatile memory which have a complementary relationship, a first voltage comparing unit comparing an output voltage of the memory device with a first reference voltage, a first power supply unit supplying a sweeping voltage having a predetermined range to the memory device, a second voltage comparing unit operating in response to an output signal of the first voltage comparing unit and comparing a voltage applied to an input terminal of the memory device with a second reference voltage, an encoder encoding an output signal of the second voltage comparing unit, a first regulating unit regulating the sweeping voltage applied from the first power supply unit to the memory device, a second regulating unit cutting off between the memory device and the second voltage comparing unit in response to the output signal of the first voltage comparing unit, a control unit controlling the operations of the first and second regulating units in response to the output signal of the first voltage comparing unit, a second power supply unit applying a predetermined voltage to the memory device in response to the output signal of the first voltage comparing unit, and a voltage comparing circuit comparing an output voltage of the memory device with a voltage corresponding to an output signal of the encoder and outputting predetermined bit data when the predetermined voltage may be applied from the second power supply unit to the memory device.

The reading circuit may include a memory device including a first nonvolatile memory and a second nonvolatile memory which have a complementary relationship, a first voltage comparing unit comparing an output voltage of the memory device with a first reference voltage, a first power supply unit supplying a sweeping voltage having a predetermined range to the memory device, a second voltage comparing unit operating in response to an output signal of the first voltage comparing unit and comparing a voltage applied to an input terminal of the memory device with a second reference voltage, a first encoder encoding an output signal of the second voltage comparing unit, a first regulating unit regulating the sweeping voltage applied from the first power supply unit to the memory device, a second regulating unit regulating cutting off between the memory device and the second voltage comparing unit in response to the output signal of the first voltage comparing unit, a control unit controlling the operations of the first and second regulating units in response to the output signal of the first voltage comparing unit, a second power supply unit applying a predetermined voltage to the memory device in response to the output signal of the first voltage comparing unit, a third voltage comparing unit starting to operate with the application of the predetermined voltage from the second power supply unit to the memory device and then comparing an output voltage of the memory device with a third reference voltage, a second encoder encoding an output signal of the third voltage comparing unit, and a third encoder encoding output signals of the first and second encoders and outputting predetermined bit data.

The third voltage comparing unit may include one or more comparators. The second voltage comparing unit may have the same number of comparators as the third voltage comparing unit. The first and second nonvolatile memories may be a p-type nonvolatile memory and an n-type nonvolatile memory, respectively, in each of which at least 1-bit data may be written, the p- and n-type nonvolatile memories being sequentially stacked. The second voltage comparing unit may include one or more comparators.

The first regulating unit may be a first pass transistor located between the first power supply unit and the memory device. The second regulating unit may be a second pass transistor located between the memory device and the second voltage comparing unit. The control unit may be an inverter inverting the output signal of the first voltage comparing unit and applying the inverted signal to the first and second regulating units. The second power supply unit may be a grounded transistor applying a voltage of 0 V to the memory device.

As described above, the nonvolatile CMOS memory device of an embodiment of the present invention may include a p-type nonvolatile memory and an n-type nonvolatile memory, which are 3-dimensionally stacked. To form the nonvolatile CMOS memory device, the p- and n-type nonvolatile memories may be formed on separate substrates, and the substrates are bonded to each other.

Accordingly, the mobility of the memory device can be improved, a well process required for forming the two nonvolatile memories on a single substrate can be omitted, and the integration density of the memory device can be increased more than when the two nonvolatile memories are disposed as described.

Also, since a unit memory cell may be a CMOS memory including nonvolatile PMOS and NMOS memories, at least two bits may be stored per cell, and one chip can include both a CMOS memory and a CMOS logic.

Data may be read based on an output voltage detecting method using a complementary action between the nonvolatile PMOS and NMOS memories, so that the limitations on bit scale-up can be overcome.

After the data state of any one of the nonvolatile PMOS and NMOS memories may be read, the data state of the other may be read using a curve showing a complementary relationship therebetween. Thus, a read operation may be shortened. Write and erase operations may be performed in cell units, rather than in block units, which may improve operating speed and reduce power dissipation.

BRIEF DESCRIPTION OF THE DRAWINGS

The above and other features and advantages of the present invention will become more apparent to those of skill in the art by describing in detail exemplary embodiments thereof with reference to the attached drawings in which.

DETAILED DESCRIPTION OF THE INVENTION

Figure 1:
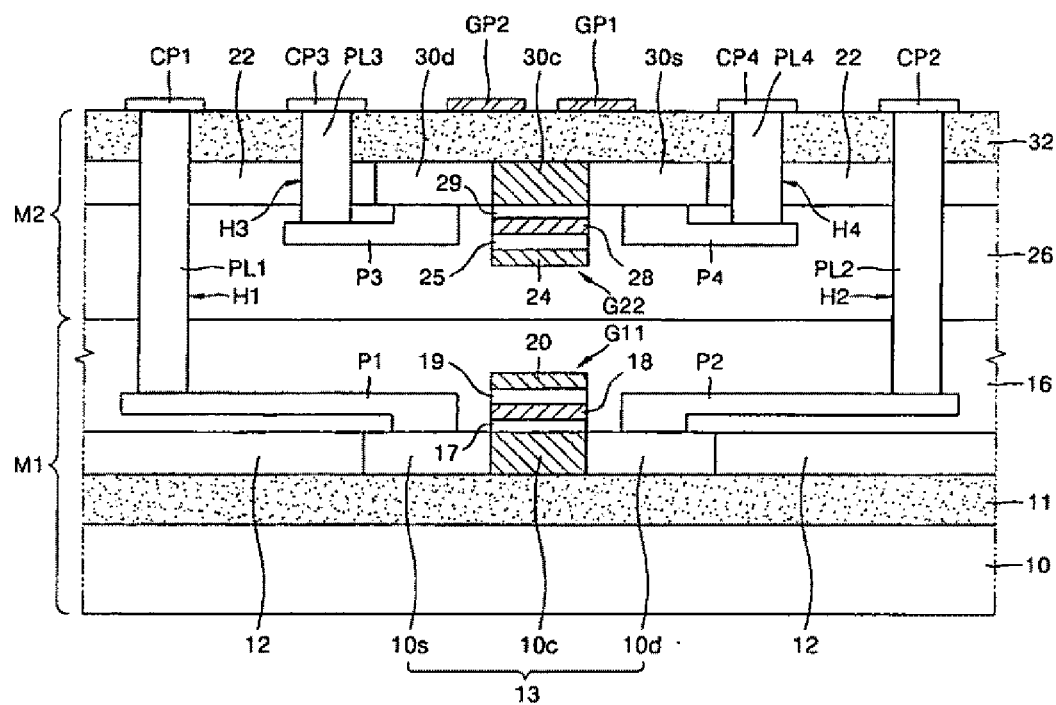
FIGS. 1 through 6 illustrate cross-sectional views of nonvolatile memory devices according to first through sixth embodiments of the present invention.

Korean Patent Application No. 10-2004-0045044, filed on Jun. 17, 2004, in the Korean Intellectual Property Office, and entitled: "COMPLEMENTARY NONVOLATILE MEMORY DEVICE, METHODS OF OPERATING AND MANUFACTURING THE SAME, LOGIC DEVICE AND SEMICONDUCTOR DEVICE INCLUDING THE SAME, AND READING CIRCUIT FOR THE SAME," is incorporated by reference herein in its entirety.

Hereinafter, a complementary memory device, methods of operating and manufacturing the same, a logic circuit and semiconductor device including the same, and a reading circuit for the same according to embodiments of the present invention will now be described. The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. is used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

At the outset, a complementary nonvolatile memory device according to a first embodiment of the present invention (hereinafter, referred to as a "first memory device") will be described. In subsequent embodiments, only different characteristics than in the first embodiment will be described.

Embodiment 1

Referring to FIG. 1, a first memory device may include a first nonvolatile memory M1 and a second nonvolatile memory M2, which is vertically and sequentially stacked. The first and second nonvolatile memories M1 and M2 are secured together. The first and second nonvolatile memories M1 and M2 may include a storage unit for storing multi-bit data in a gate stacked structure. The first and second nonvolatile memories M1 and M2 may be a P-type transistor and an N-type transistor, e.g., a P-type SONOS memory and an N-type SONOS memory, respectively, each of which can store data and function as a switch.

The first nonvolatile memory M1 may include a first substrate 10 and an insulating layer 11 disposed on the first substrate 10. Shallow trench isolation (STI) layers 12 may be disposed on the insulating layer 11 and separated from each other. A semiconductor substrate 13 may be disposed on the insulating layer 11 between the STI layers 12. The semiconductor substrate 13 may include a first impurity region 10$s$, a second impurity region 10$d$, and a channel region 10$c$. The first and second impurity regions 10$s$ and 10$d$ may be doped with p-type conductive impurities. Each of the first and second impurity regions 10$s$ and 10$d$ may be a source region or a drain region. In other words, if the first impurity region 10$s$ is a source region, the second impurity region 10$d$ is a drain region, and vice versa. The channel region 10$c$ is disposed between the first and second impurity regions 10$s$ and 10$d$. The semiconductor substrate 13 may be an n-type semiconductor substrate having a predetermined crystalline direction, for example, an n-type <100> semiconductor substrate. A first gate stacked structure G11 may be disposed on the channel region 10$c$. The first gate stacked structure G11 may include a first insulating layer 17, a data storage layer 18, a second insulating layer 19, and a control gate 20, which are sequentially stacked. The first insulating layer 17 may be a tunneling layer, e.g., a silicon oxide ($SiO_2$) layer. The data storage layer 18 may be a material layer for trapping carriers that tunnel through the first insulating layer 17.

In the data storage layer 18, the trap density of carriers, e.g., electrons, may vary with an externally applied voltage. The number of carriers trapped in the data storage layer 18 varies with an externally applied voltage. In other words, the state of the data storage layer 18 varies with the externally applied voltage. When the data storage layer 18 is in a particular state, bit data written in the data storage layer 18 may be read. By adjusting the externally applied voltage, not only one bit data, such as "0" or "1", but also two or more multi-bit data, such as "11", "10", "01", "00", "111" . . . "001", "000", "1111" . . . "0001", or "0000", may be written in and read from the data storage layer 18.

The data storage layer 18 may be a silicon nitride (SiN) layer. The second insulating layer 19 may be formed of the same material as the first insulating layer 17, or may be formed of another material. The control gate 20, to which an external voltage may be applied, may be a polysilicon gate. A first contact pad layer P1 may be disposed on the first impurity region 10$s$ and may extend over the STI layer 12 adjacent to the first impurity region 10. A second contact pad layer P2 may be disposed on the second impurity region 10$d$ and may extend, e.g., laterally, over the STI layer 12 adjacent to the second impurity region 10$d$. The first and second contact pad layers P1 and P2 may extend by the same length. The first and second contact pad layers P1 and P2 may extend to a further than third and fourth contact pad layers P3 and P4, which are respectively connected to first and second impurity regions 30$s$ and 30$d$ of the second nonvolatile memory M2, as will be described later. The first gate stacked structure G11 and the first and second contact pad layers P1 and P2 may be covered by a third insulating layer 16. The third insulating layer 16 may be formed of the same material as the first and second insulating layers 17 and 19, or of other insulating materials.

The second nonvolatile memory M2 may be turned over or inverted and bonded to the first nonvolatile memory M1. However, for ease of description, the second nonvolatile memory M2 will be described as if the second nonvolatile memory M2 may be not turned over. In other words, although FIG. 1 illustrates that elements of the second nonvolatile memory M2, which correspond to the elements disposed on the insulating layer 11 of the first nonvolatile memory M1, are disposed under an insulating layer 32, the elements of the second nonvolatile memory M2 will be described as if that they are disposed on the insulating layer 32. Such an assumption is similarly relevant to the second through sixth embodiments that will be described later.

The second nonvolatile memory M2 may include STI layers 22, which may be disposed on the insulating layer 32 and separated from each other. The insulating layer 32 disposed between the STI layers may be covered by a semiconductor substrate. The semiconductor substrate may be a substrate having a predetermined crystalline direction, e.g., a p-type <110> substrate. The semiconductor substrate may include a first impurity region 30s, a second impurity region 30d and a channel region 30c. The channel region 30c may be disposed between the first and second impurity regions 30s and 30d. The first and second impurity regions 30s and 30d may be doped with n-type conductive impurities. Each of the first and second impurity regions 30s and 30d may be a source region or a drain region. A second gate stacked structure G22 may be disposed on the channel region 30c. The first and second gate stacked structures G11 and G22 may be in a vertical line. The second gate stacked structure G22 may include a first insulating layer 29, a data storage layer 28, a second insulating layer 25, and a control gate 24, which may be sequentially stacked. In the second gate stacked structure G22, the first and second insulating layers 29 and 25 may be formed an insulating material, e.g., $SiO_2$. The control gate 24 and the data storage layer 28 may respectively be formed of the same materials as the control gate 20 and the data storage layer 18 of the first nonvolatile memory M1, or may be formed of different materials.

The third contact pad layer P3 may be disposed on the second impurity region 30d, and the fourth contact pad layer P4 may be disposed on the first impurity region 30s. Each of the third and fourth contact pad layers P3 and P4 may extend over an adjacent STI layer 22 to a predetermined length. As mentioned above, the third and fourth contact pad layers P3 and P4 may extend to a shorter length than the first and second contact pad layers P1 and P2. In this case, the third and fourth contact pad layers P3 and P4 and the first and second contact pad layers P1 and P2 of may be stacked on one another. When the third and fourth contact pad layers P3 and P4 are not in a stacked relationship with the first and second contact pad layers P1 and P2, the third and fourth contact layers P3 and P4 may extend to the same length as the first and second contact pad layers P1 and P2. In the second nonvolatile memory M2, the third and fourth contact pad layers P3 and P4 and the second gate stacked structure G22 may be covered by a third insulating layer 26. The third insulating layer 26 may be $SiO_2$.

A first via hole H1 and a second via hole H2 may be formed in a stacked structure including the third insulating layers 16 and 26 of the first and second nonvolatile memories M1 and M2 and the STI layer 22 and the insulating layer 32 of the second nonvolatile memory M2. The first via hole H1 may expose the first contact pad layer P1 of the first nonvolatile memory M1, and the second via hole H2 may expose the second contact pad layer P2 thereof. The first and second via holes H1 and H2 may be filled with a first conductive plug PL1 and a second conductive plug PL2, respectively. The first and second conductive plugs PL1 and PL2 may be formed of the same material, or may be formed of different materials.

A third via hole H3 and a fourth via hole H4 may be formed in a stacked structure including the third insulating layer 26, the STI layer 22, and the insulating layer 32 of the second nonvolatile memory M2. The third via hole H3 exposes the first contact pad layer P3 of the second nonvolatile memory M2, and the fourth via hole H4 exposes the fourth contact pad layer P4 thereof. The third and fourth via holes H3 and H4 may be filled with a third conductive plug PL3 and a fourth conductive plug PL4, respectively. The third and fourth conductive plugs PL3 and PL4 may be formed of the same material, but may be formed of different materials.

A first gate via hole (not shown) may be formed in a stacked structure including the third insulating layer 16 of the first nonvolatile memory M1 and the third insulating layer 26 and the insulating layer 32 of the second nonvolatile memory M2. The first gate via hole may expose the control gate 20 of the first gate stacked structure G11. A second gate via hole (not shown) may be formed in a stacked structure including the third insulating layer 26 and the insulating layer 32 of the second nonvolatile memory M2. The second gate via hole may expose the control gate 24 of the second gate stacked structure G22. Here, the first and second gate via holes are not shown in FIG. 1 because they may be formed in a different vertical cross-section than the vertical cross-section in which the $1^{st}$ through $4^{th}$ via holes H1, H2, H3 and H4 are formed. The first and second gate via holes may be filled with conductive plugs, respectively.

On a surface of the insulating layer 32 of the second nonvolatile memory M2, contact pads CP1, CP2, CP3, and CP4, which are connected to the $1^{st}$ through $4^{th}$ conductive plugs PL1, PL2, PL3, and PL4, respectively, may be disposed. Also, a first gate contact pad GP1 and a second gate contact pad GP2 may be disposed on the surface of the insulating layer 32 and connected to the conductive plugs filled in the first and second gate via holes, respectively. The first and second gate contact pads GP1 and GP2 may be integral if required, e.g., when the first and second nonvolatile memories M1 and M2 have a common gate. Further, the contact pads CP2 and CP4 may be integral, or the contact pads CP1 and CP3 may be integral.

Embodiment 2

A nonvolatile memory device according to a second embodiment of the present invention (hereinafter, referred to as a "second memory device") may be different from the first memory device in that it includes a second nonvolatile memory M22 instead of the second nonvolatile memory M2. In the second nonvolatile memory M22, the same reference numerals are used to denote the same elements as in the second nonvolatile memory M2. Also, since a first nonvolatile memory M1 of the second memory device may be the same as that of the first memory device, a detailed illustration thereof may be omitted in FIG. 2.

Figure 2:
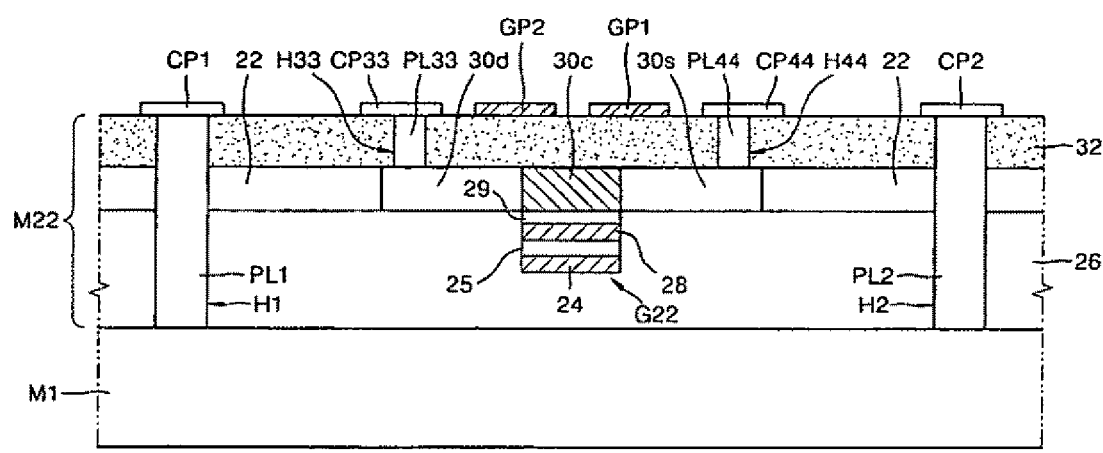

Referring to FIG. 2, the second nonvolatile memory M22 may include the insulating layer 32, the semiconductor substrate (not shown) disposed on the insulating layer 32, and the second gate stacked structure G22 disposed on the semiconductor substrate. The semiconductor substrate may be surrounded by the STI layer 22. The semiconductor substrate may include the first impurity region 30d, the second impurity region 30s, and the channel region 30c. The second gate stacked structure G22 may be disposed on the channel region 30c. The second gate stacked structure G22 may be covered by a third insulating layer 26. The first via hole H1 and the second via hole H2 are formed through the third insulating layer 26, the STI layer 22, and the insulating layer 32 and respectively expose a first contact pad layer P1 and a second contact pad layer P2 of the first nonvolatile memory M1. In contrast to the first memory device, the first and second via holes H1 and H2 may be filled with first and second conductive plugs PL1 and PL2, respectively. Also, a third via hole H33 and a fourth via hole H44 may be formed in the insulating layer 32 and expose the first and second impurity regions 30d and 30s, respectively. The third and fourth via holes H33 and H44 may be filled with third and fourth conductive plugs PL33 and PL44, respectively. On a surface of the insulating layer 32, a contact pad CP33 connected to the third conductive plug PL33, and another contact pad CP44, connected to the fourth conductive plug PL44, may be disposed. Also, the contact pad CP1 connected to the first conductive plug PL1 and the contact pad CP2 connected to the second conductive plug PL2 may be disposed on the bottom surface of the insulating layer 32. Similarly, the first gate contact pad GP1 and the second gate contact pad GP2 may be disposed on the bottom surface of the insulating layer 32.

Embodiment 3

Figure 3:
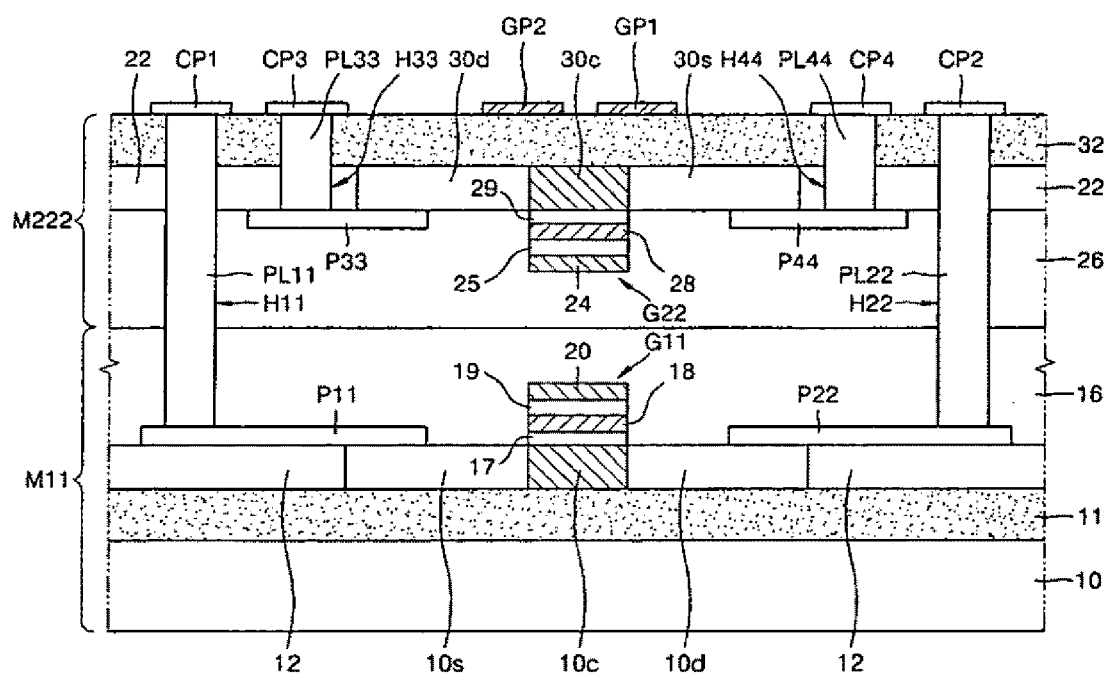

Referring to FIG. 3, a nonvolatile memory device according to a third embodiment of the present invention (hereinafter, referred to as a "third memory device") may include a first nonvolatile memory M11 and a second nonvolatile memory M222, which may be sequentially stacked. The first and second nonvolatile memories M11 and M222 may be bonded to each other.

A first contact pad layer P11 and a second contact pad layer P22 of the first nonvolatile memory M11 may have different shapes from the first and second contact pad layers P1 and P2 of the first nonvolatile memory M1 of the first memory device shown in FIG. 1. Likewise, a third contact pad layer P33 and a fourth contact pad layer P44 of the second nonvolatile memory M222 may have different shapes from the third and fourth contact pad layers P3 and P4 of the second nonvolatile memory M2 of the first memory device.

Specifically, while the first and second contact pad layers P1 and P2 of the first nonvolatile memory M1 may extend above and apart from the adjacent STI layers 12, as shown in FIG. 1, the first and second contact pad layers P11 and P22 of the first nonvolatile memory M11 may extend on the adjacent STI layer 12 as shown in FIG. 3. Likewise, the third and fourth contact pad layers P33 and P44 of the second nonvolatile memory M222 may extend on adjacent STI layers 22. The first and second contact pad layers P11 and P22 of the first nonvolatile memory M11 may extend to the same length, or may extend to different lengths according to the contact positions. Similarly, the third and fourth contact pad layers P33 and P44 of the second nonvolatile memory M222 may extend to the same length, or may have different lengths according to the contact positions.

As shown in FIG. 3, when the first and second contact pad layers P11 and P22 of the first nonvolatile memory M11 and the third and fourth contact pad layers P33 and P44 of the second nonvolatile memory M222 are stacked, the extending length of the first and second contact pad layers P11 and P22 on the STI layer 12 may be different from the extending length of the third and fourth contact pad layers P33 and P44 on the STI layer 22.

However, the first and second contact pad layers P11 and P22 of the first nonvolatile memory M11 and the third and fourth contact pad layers P33 and P44 of the second nonvolatile memory M222 need not be disposed on the same vertical surface. For example, the first and second contact pad layers P11 and P22 of the first nonvolatile memory M11 may be horizontally disposed, while the third and fourth contact pad layers P33 and P44 of the second nonvolatile memory M222 may be vertically disposed. If the first contact pad layer P11 does not overlap the third contact pad layer P33 of the second nonvolatile memory M222 and the second contact pad layer P22 does not overlap the fourth contact pad layer P44, then the third contact pad layer P33 may not be in a path formed by the first via hole H11. Thus, the extending length of the first contact pad layer P11 may be arbitrarily determined. For the same reason, the extending length of the second contact pad layer P22 may be arbitrarily determined. Therefore, the extending length of the first and/or second contact pad layers P11 and P22 may be longer than that of the third and/or fourth contact pad layers P33 and P44, or may be equal to or shorter than the same.

Further, the contact pads CP1, CP2, CP3, and CP4 and the first and second gate contact pads GP1 and GP2 may be disposed at an interface between the first and second nonvolatile memories M11 and M222. In this case, the first and second via holes H11 and H22, which expose the first and second contact pad layers P11 and P22, respectively, need only be formed in the third insulating layer 16 of the first nonvolatile memory M11. Thus, even if the first and second contact pad layers P11 and P22 and the third and fourth contact pad layers P33 and P44 are disposed on the same vertical surface, the third and fourth contact pad layers P33 and P44 extending the length of the first and second contact pad layers P11 or P22 on the STI layer 22 may not interfere with the formation of the first and second via holes H11 and H22. Accordingly, even if the contact pads CP1, CP2, CP3, and CP4 and the first and second gate contact pads GP1 and GP2 are disposed at the interface between the first and second nonvolatile memories M11 and M222, the extending length of the first and second contact pad layers P11 and P22 on the STI layer 12 may be arbitrarily determined.

Embodiment 4

Figure 4:
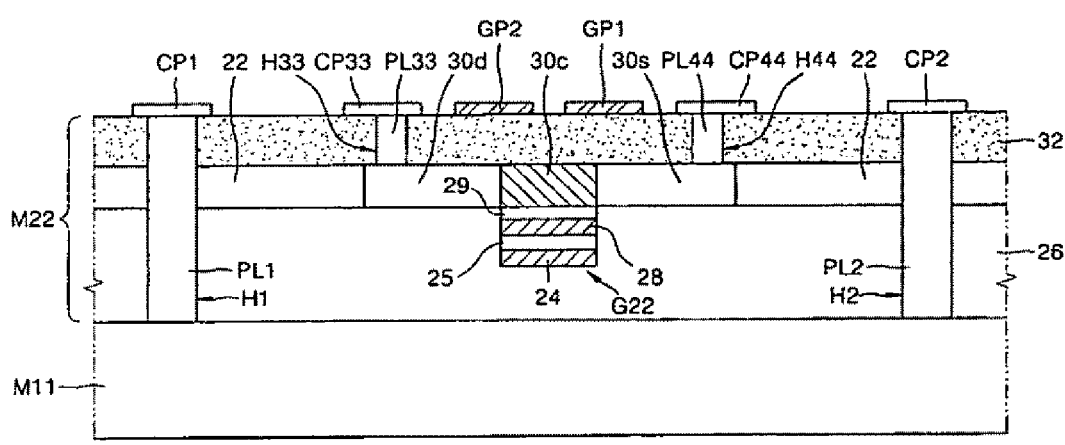

As shown in FIG. 4, a nonvolatile memory device according to a fourth embodiment of the present invention (hereinafter, referred to as a "fourth memory device") may be a combination of the foregoing second and third memory devices.

Referring to FIG. 4, the fourth memory device may include the first nonvolatile memory M11 shown in FIG. 3 and the second nonvolatile memory M22 shown in FIG. 2. A description of the nonvolatile memories M11 and M22 will not be repeated here. The first and second nonvolatile memories M11 and M22 may be sequentially stacked and bonded to each other. In this case, contact pads CP1, CP2, CP3, and CP4 and first and second gate contact pads GP1 and GP2 may be disposed at an interface between the first and second nonvolatile memories M11 and M22.

Embodiment 5

Figure 5:
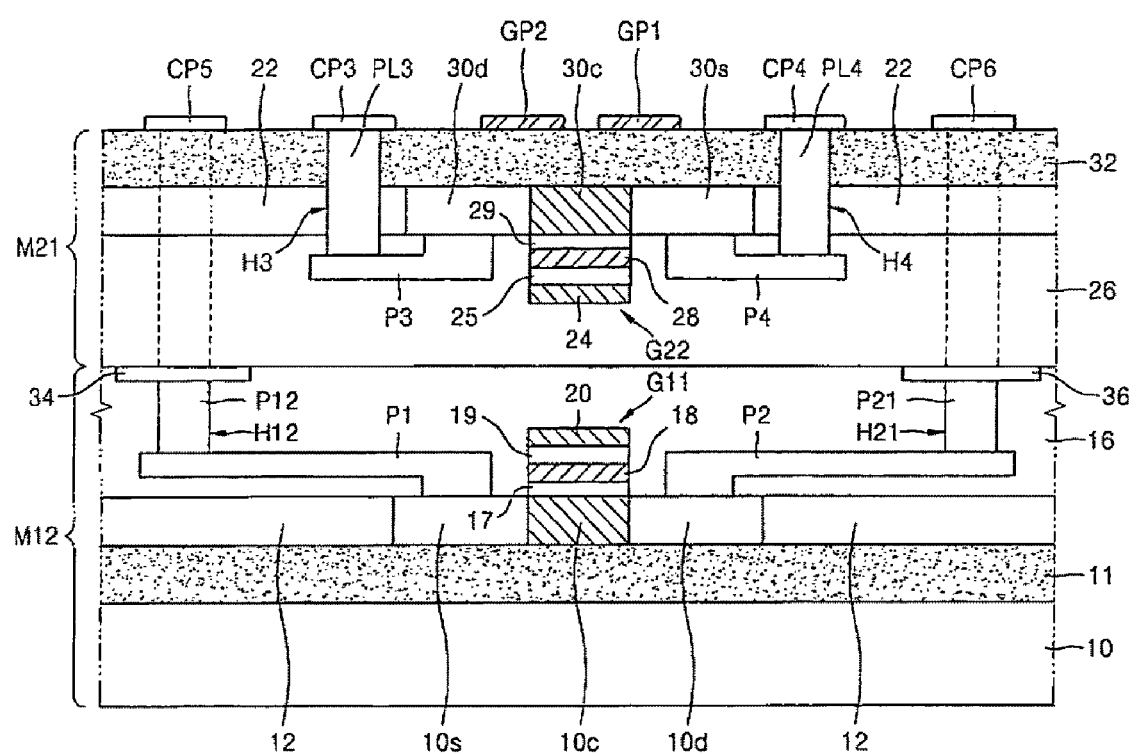

Referring to FIG. 5, a nonvolatile memory device according to a fifth embodiment (hereinafter, referred to as a "fifth memory device") may include a first nonvolatile memory M12 and a second nonvolatile memory M21. The first and second nonvolatile memories M12 and M21 may be sequentially stacked and bonded to each other. A first via hole H12 and a second via hole H21 may be formed in the third insulating layer 16 of the first nonvolatile memory M12 and expose a first contact pad layer P1 and a second contact pad layer P2, respectively. The first and second via holes H12 and H21 may be filled with first and second conductive plugs P12 and P21, respectively. The first and second conductive plugs P12 and P21 may be covered by third and fourth contact pad layers 34 and 36, respectively. The third and fourth contact pad layers 34 and 36 may extend on the third insulating layer 16 around the first and second conductive plugs P12 and P21. The first and second nonvolatile memories M12 and M32 may be bonded to each other by the third insulating layer 16 and another third insulating layer 26. For this structure, bonded surfaces of the third insulating layers 16 and 26 should be very flat. Thus, surfaces of the third and fourth contact pad layers 34 and 36 should be coplanar with the surface of the third insulating layer 16, rather than being disposed on the third insulating layer 16. Alternatively, if the third and fourth contact pad layers 34 and 36 are disposed on the third insulating layer 16, an additional insulating layer (not shown) may be formed on the third insulating layer 16, to form a planar surface covering the third and fourth contact pad layers 34 and 36. The rest of the first nonvolatile memory M12 may be the same as that of the first nonvolatile memory M1 of the first memory device shown in FIG. 1.

In the second nonvolatile memory M21, contact pads CP5 and CP6 may be disposed on a bottom surface of an insulating layer 32. The contact pads CP5 and CP6 may be connected to the third and fourth contact pad layers 34 and 36, respectively, of the first nonvolatile memory M12. The contact pads CP5 and CP6 may be respectively connected to the third and fourth contact pad layers 34 and 36 by conductive plugs, which may be formed in via holes which lie in a different vertical cross-section than that shown in FIG. 5. As illustrated with dotted lines, the conductive plugs that connect the contact pads CP5 and CP6 to the third and fourth contact pad layers 34 and 36, respectively, may lie in the same cross-section as the first and second conductive plugs P12 and P21. The rest of the construction of the second nonvolatile memory M21 may be the same as that of the second nonvolatile memory M2 of the first memory device shown in FIG. 1.

Embodiment 6

A nonvolatile memory device according to a sixth embodiment of the present invention (hereinafter, referred to as a "sixth memory device") may include a common gate.

Figure 6:
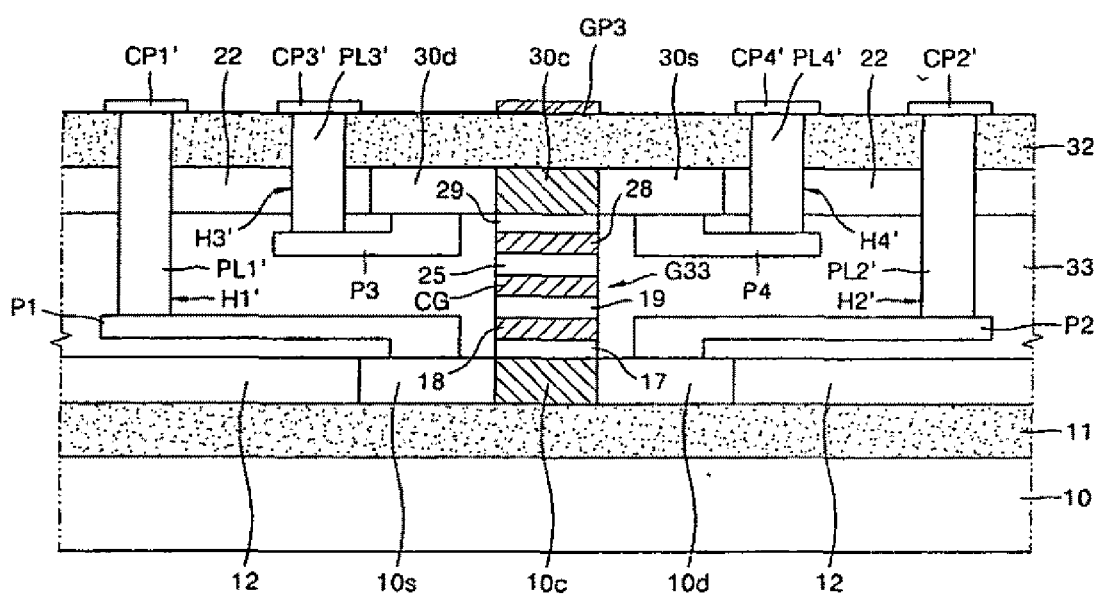

Referring to FIG. 6, the insulating layer 11 may be disposed on the first semiconductor substrate 10, and STI layers 12 may be disposed on the insulating layer 11. A semiconductor substrate (not shown) may be disposed on the insulating layer 11 between the STI layers 12. The semiconductor substrate may include the first impurity region 10s, the second impurity region 10d, and the channel region 10c. A third gate stacked structure G33 may be disposed on the channel region 10c. The third gate stacked structure G33 may be for a common gate and may include, the first insulating layer 17, the data storage layer 18, the second insulating layer 19, a control gate CG, the second insulating layer 25, the data storage layer 28, and the first insulating layer 29. In other words, the third gate stacked structure G33 may include the first gate stacked structure G11 of the first nonvolatile memory M1 and the second gate stacked structure G22 of the second nonvolatile memory M2, which may be bonded together. Thus, the control gate CG of the third gate stacked structure G33 may correspond to a bonded structure of the control gate 20 of the first gate stacked structure G11 and the control gate 24 of the second gate stacked structure G22. Assuming that the control gates 20 and 24 are formed of the same material, the control gate CG may be illustrated as a single layer in FIG. 6.

The semiconductor substrate and the isolation layer 12 disposed around the third gate stacked structure G33 may be covered by an interlayer dielectric (ILD) 33. The ILD 33 may have the same height as the third gate stacked structure G33. The first contact pad layer P1 and the second contact pad layer P2 may be disposed in the ILD 33. One end portion of the first contact pad layer P1 may be connected to a first impurity region 10s, while one end portion of the second contact pad layer P2 may be connected to a second impurity region 10s. STI layers 22 may be disposed on the ILD 33. A semiconductor substrate (not shown) may be disposed on the ILD 33 disposed between the STI layers 22 and may cover the third gate stacked structure G33. The semiconductor substrate may include the channel region 30c and the first and second impurity regions 30d and 30s, which are disposed on both sides of the channel region 30c. The channel region 30c may be disposed on the third gate stacked structure G33. The third contact pad layer P3 and the fourth contact pad layer P4 may be disposed in an upper portion of the ILD 33. One end portion of the third contact pad layer P3 may be connected to the first impurity region 30d, while one end portion of the fourth contact pad layer P4 may be connected to the second impurity region 30s. When the third and fourth contact pad layers P3 and P4 may be disposed in the same vertical cross-section as the first and second contact pad layers P1 and P2, as described above, the extending length of the third and fourth contact pad layers P3 and P4 may be shorter than that of the first and second contact pad layers P1 and P2.

However, if the cross-section in which the third and fourth contact pad layers P3 and P4 lie may be different from the cross-section in which the first and second contact pad layers P1 and P2 lie (not shown), the extended length of the third and fourth contact pad layers P3 and P4 and the extended length of the first and second contact pad layers P1 and P2 may be arbitrarily determined.

The STI layers 22 and the semiconductor substrate may be covered by the insulating layer 32. A first via hole H1' and a second via hole H2' may be formed in a stacked structure including the insulating layer 32, the STI layers 22 and the ILD 33, to expose the first and second contact pad layers P1 and P2, respectively. The first and second via holes H1' and H2' may be filled with a first conductive plug PL1' and a second conductive plug PL2', respectively. A third via hole H3' and a fourth via hole H4' may be formed in a stacked structure including the insulating layer 32, the STI layers 22 and a portion of the ILD 33, to expose the third and fourth contact pad layers P3 and P4, respectively. The third and fourth via holes H3' and H4' may be filled with a third conductive plug PL3' and a fourth conductive plug PL4', respectively. Another via hole (not shown) may lie in a different cross-section from that illustrates in FIG. 6, and thus lie in a different cross-section from that of the $1^{st}$ through $4^{th}$ via holes H1', H2', H3', and H4'. The another via hole may expose the control gate CG of the third gate stacked structure G33 and may be filled with a conductive plug.

A first contact pad CP1', a second contact pad CP2', a third contact pad CP3', and a fourth contact pad CP4' may be disposed on the insulating layer 32, and connect the first, second, third, and fourth conductive plugs PL1', PL2', PL3', and PL4', respectively. Also, a gate contact pad GP3 may be disposed on the insulating layer 32. The gate contact pad GP3 may cover the entire exposed surface of the conductive plug filled in the another via hole that exposes the control gate CG of the third gate stacked structure G33.

In the sixth memory device, the first and third contact pads CP1' and CP3' may be integral and/or the second and fourth contact pads CP2' and CP4' may be integral.

Figure 7:
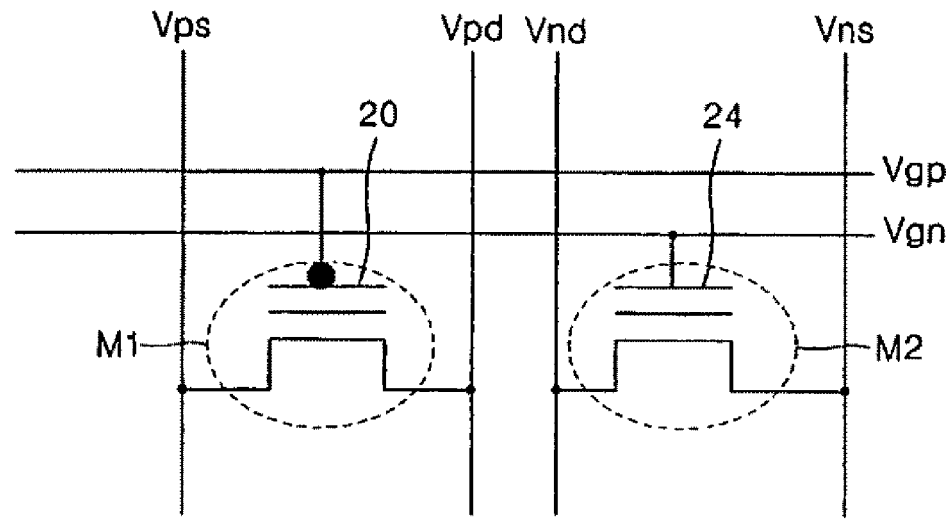
FIG. 7 illustrates an equivalent circuit of the nonvolatile memory devices shown in FIGS. 1 through 6.

FIG. 7 shows an equivalent circuit of any one of the first through sixth memory devices shown in FIGS. 1 through 6. While the first and second nonvolatile memories shown therein are labeled M1 and M2 of the first embodiment, it may be to be understood that any of the first and second nonvolatile memories discussed above may be substituted.

In FIG. 7, a voltage Vgn may be applied to the control gate 24 of the second nonvolatile memory M2, and a voltage Vgp may be applied to the control gate 20 of the first nonvolatile memory M1. A voltage Vps may be applied to the first impurity region 10s of the first nonvolatile memory M1, and a voltage Vns may be applied to the second impurity region 30s of the second nonvolatile memory M2. A voltage Vpd may be applied to the second impurity region 10d of the first nonvolatile memory M1, and a voltage Vnd may be applied to the first impurity region 30d of the second nonvolatile memory M2.

Since the first and second memory devices are a p-type nonvolatile memory and an n-type nonvolatile memory vertically bonded to each other, they may have a high integration density and mobility when formed as horizontally bonded structure. If p- and n-type nonvolatile memories are horizontally bonded, different wells should be formed in the same substrate. However, because the first through sixth embodiments are each manufactured by forming the p- and n-type nonvolatile memories on separate substrates and then bonding them, it may be not necessary to form different wells in the same substrate. Thus, a well forming process can be omitted.

Hereinafter, a method of operating the memory devices according to the foregoing embodiments of the present invention will be described. Herein, a method of operating the first memory device will be described as an example, although this method may be equally applicable to the second through sixth embodiments as well.

Operations of the first memory device, namely, write, erase, and read operations, will be described with reference to an equivalent circuit of the first memory device shown in FIG. 8.

Figure 8:
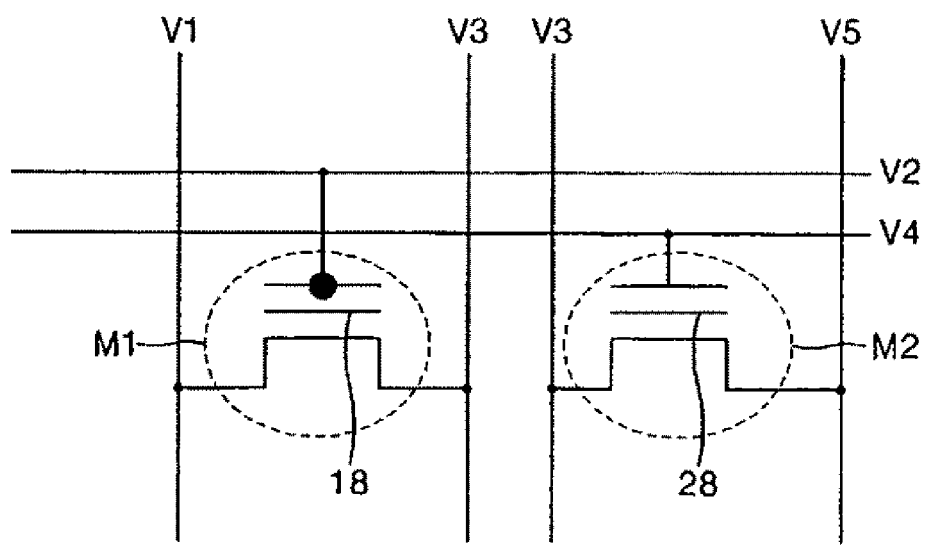
FIG. 8 illustrates an equivalent circuit used in explaining reading and writing operation of the nonvolatile memory devices shown in FIGS. 1 through 6.

In FIG. 8, a first voltage V1 may be applied to the first impurity region 10s of the nonvolatile memory M1, which may be a p-type nonvolatile memory, and a second voltage V2 may be applied to the first gate stacked structure G11 thereof. A fourth voltage V4 may be applied to the second gate stacked structure G22 of the second nonvolatile memory M2, which may be an n-type nonvolatile memory, and a fifth voltage V5 may be applied to the second impurity region 30s thereof. A third voltage V3 may be applied to the second impurity region 10d of the first nonvolatile memory M1 and the first impurity region 30d of the second nonvolatile memory M2.

<Write Operation>

The write operation of the first memory device using channel hot electron injection (CHEI) will be described.

Initially, a case where data may be written in both the first and second nonvolatile memories M1 and M2 (hereinafter, a "first case") will be described.

Figure 9:
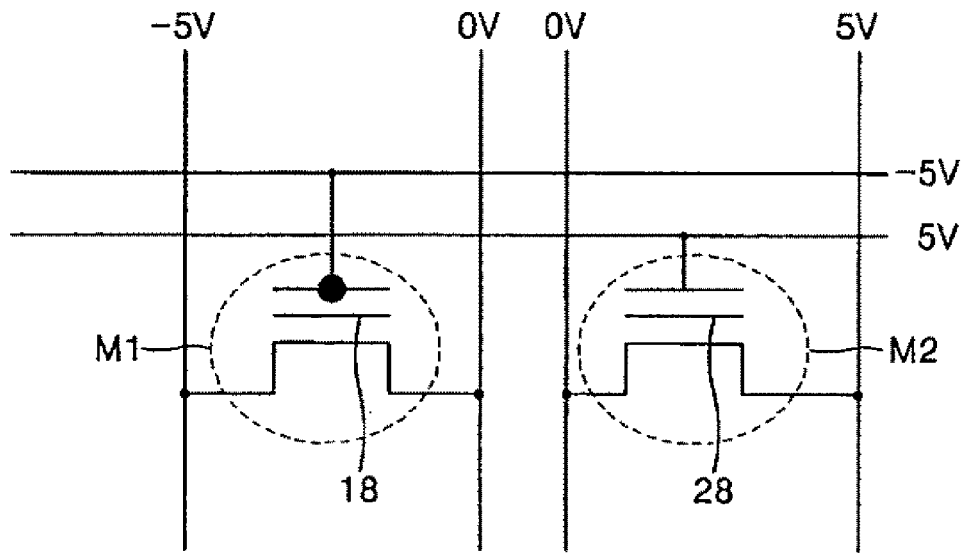
FIG. 9 illustrates an equivalent circuit diagram for a case where data is written in both a P-type nonvolatile memory and an N-type nonvolatile memory, which are included in the nonvolatile memory devices shown in FIGS. 1 through 6.

Referring to FIG. 9, in the first case, a predetermined voltage, e.g., −5 V, may be provided as the first and second voltages V1 and V2. Also, a predetermined voltage, e.g., 5 V, may be provided as the fourth and fifth voltages V4 and V5, and 0 V may be provided as the third voltage V3 to the second impurity region 10d of the first nonvolatile memory M1 and the first impurity region 30d of the second nonvolatile memory M2. With the application of the 1$^{st}$ through 5$^{th}$ voltages V1, V2, ..., and V5, holes are trapped in the data storage layer 18 of the first nonvolatile memory M1, while electrons are trapped in the data storage layer 28 of the second nonvolatile memory M2. As a result, threshold voltages of the first and second nonvolatile memories M1 and M2 are increased. That may be, threshold voltage curves of the first and second nonvolatile memories M1 and M2 are shifted.

Next, a case where data may be written in only one of the first and second nonvolatile memories M1 and M2 (hereinafter, a "second case") will be described.

Figure 10:
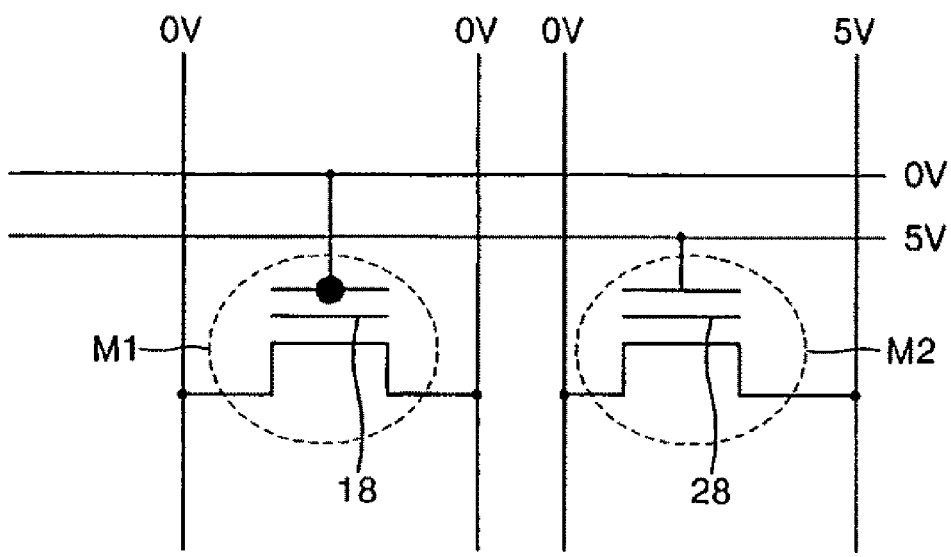
FIG. 10 illustrates an equivalent circuit diagram for a case where data is written in only the N-type nonvolatile memory included in the nonvolatile memory devices shown in FIGS. 1 through 6.

FIG. 10 illustrates an equivalent circuit diagram showing a case where data is written in only the second nonvolatile memory M2. In this case, the 1$^{st}$ through 3$^{rd}$ voltages V1, V2, and V3 are maintained at 0 V, while a predetermined voltage, e.g., 5 V, may be provided as the fourth and fifth voltages V4 and V5.

On applying the voltages as described above, data written in the data storage layer 18 of the first nonvolatile memory M1 remains stored, and electrons are trapped in the data storage layer 28 of the second nonvolatile memory M2. Thus, a threshold voltage curve of the second nonvolatile memory device M2 may be shifted in the direction in which a voltage increases.

Figure 11:
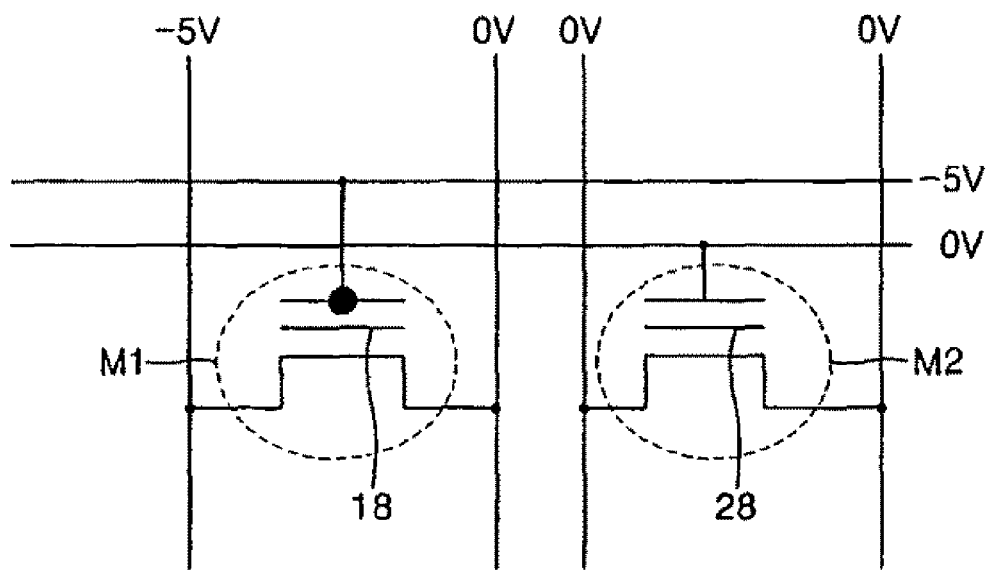
FIG. 11 illustrates an equivalent circuit diagram for a case where data is written in only the P-type nonvolatile memory included in the nonvolatile memory devices shown in FIGS. 1 through 6.

FIG. 11 illustrates an equivalent circuit diagram for a case where data may be written in only the first nonvolatile memory M1. In this case, voltages applied to the second nonvolatile memory M2, i.e., the third through fifth voltages V3, V4, and V5 are maintained at 0 V, while a predetermined voltage, e.g., −5 V, may be provided as the first and second voltages V1 and V2. On applying the voltages as described above, holes are trapped in the data storage layer 18 of the first nonvolatile memory M1, while data written in the second nonvolatile memory M2 remains stored.

<Erase Operation>

The erase operation of the first memory device using hot hole injection (HHI) will be described.

Initially, a case where data may be erased from only one of the first and second nonvolatile memories M1 and M2 (hereinafter, a "third case") will be described.

Figure 12:
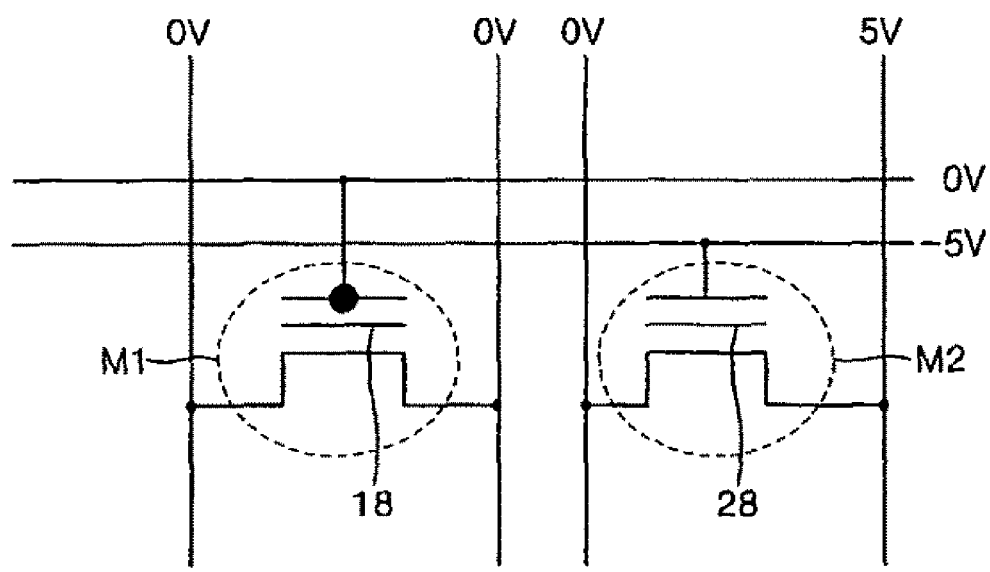
FIG. 12 illustrates an equivalent circuit diagram for a case where written data is erased from only the N-type nonvolatile memory included in the nonvolatile memory devices shown in FIGS. 1 through 6.

FIG. 12 illustrates an equivalent circuit diagram for the third case in which data is erased from only the second nonvolatile memory M2. In this case, a predetermined voltage, e.g., −5 V, may be applied as the fourth voltage V4, and a predetermined voltage, e.g., 5 V, may be applied as the fifth voltage V5. Also, 0 V may be applied as the 1$^{st}$ through 3$^{rd}$ voltages V1, V2, and V3. With the application of voltages V1, V2, ..., and V5, electrons trapped in the data storage layer 28 of the second nonvolatile memory M2 are emitted to the substrate, i.e., data written in the second nonvolatile memory M2 may be erased.

Figure 13:
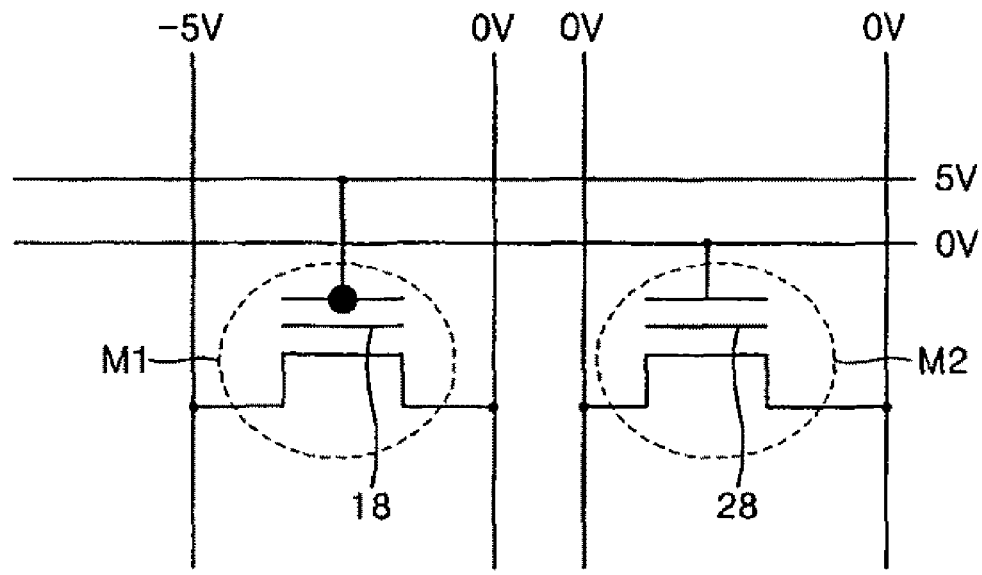
FIG. 13 illustrates an equivalent circuit diagram for a case where written data is erased from only the P-type nonvolatile memory included in the nonvolatile memory devices shown in FIGS. 1 through 6.

FIG. 13 illustrates an equivalent circuit diagram for the case in which data is erased from only the first nonvolatile memory M1. In this case, 0 V may be applied to the first and second impurity regions 30d and 30s and the second gate stacked structure G22 of the second nonvolatile memory M2. In this state, a predetermined voltage, e.g., 5 V, may be applied to the first gate stacked structure G11 of the first nonvolatile memory M1, and a predetermined voltage, e.g., −5 V, may be applied to the first impurity region 10s. However, 0 V may be applied to the second impurity region 10d of the first nonvolatile memory M1. On applying the voltages as described above, holes trapped in the data storage layer 18 of the first nonvolatile memory M1 are emitted to the substrate, i.e., data written in the first nonvolatile memory M1 may be erased.

Next, a case where data may be erased from both the first and second nonvolatile memories M1 and M2 (hereinafter, a "fourth case") will be described with reference to FIG. 14.

Figure 14:
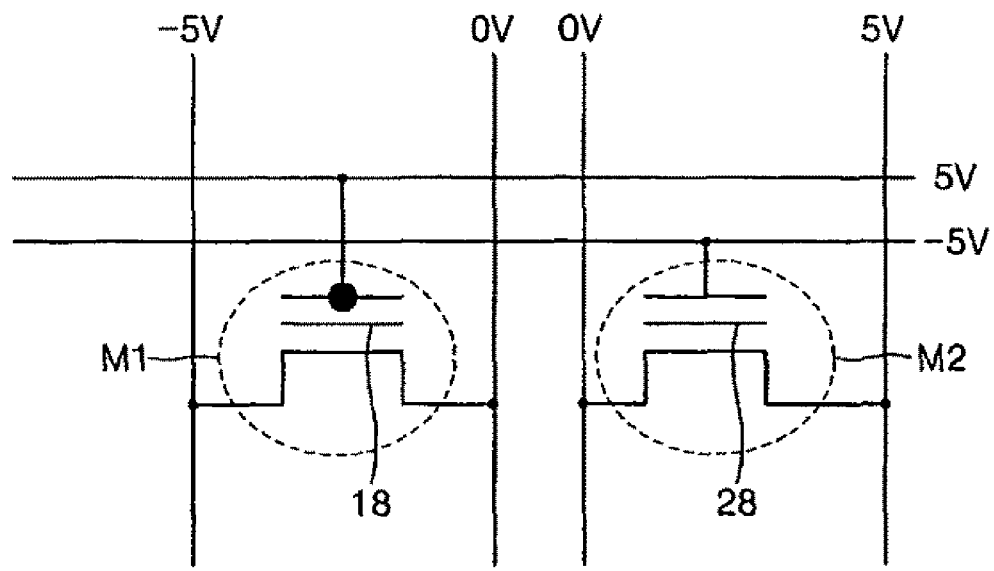
FIG. 14 illustrates an equivalent circuit diagram for a case where data is written in the N-type nonvolatile memory and written data is erased from the P-type nonvolatile memory in the nonvolatile memory devices shown in FIGS. 1 through 6.

Referring to FIG. 14, in the fourth case, a predetermined voltage, e.g., 5 V, may be applied to the first gate stacked structure G11 of the first nonvolatile memory M1, and predetermined voltages, e.g., −5 V and 0 V, are respectively applied to the first and second impurity regions 10s and 10d thereof. Also, a predetermined voltage, e.g., −5 V, may be applied to the second gate stacked structure G22 of the second nonvolatile memory M2, and predetermined voltages, e.g., 0 V and 5 V, are respectively applied to the first and second impurity regions 30d and 30s thereof.

On applying the voltages as described above, holes trapped in the data storage layer 18 of the first nonvolatile memory M1 and electrons trapped in the data storage layer 28 of the second nonvolatile memory M2 are emitted to the substrate such that data written in the first and second nonvolatile memories M1 and M2 are erased.

Hereinafter, a case where data may be erased from and written to the first memory device at the same time will be described.

Figure 15:
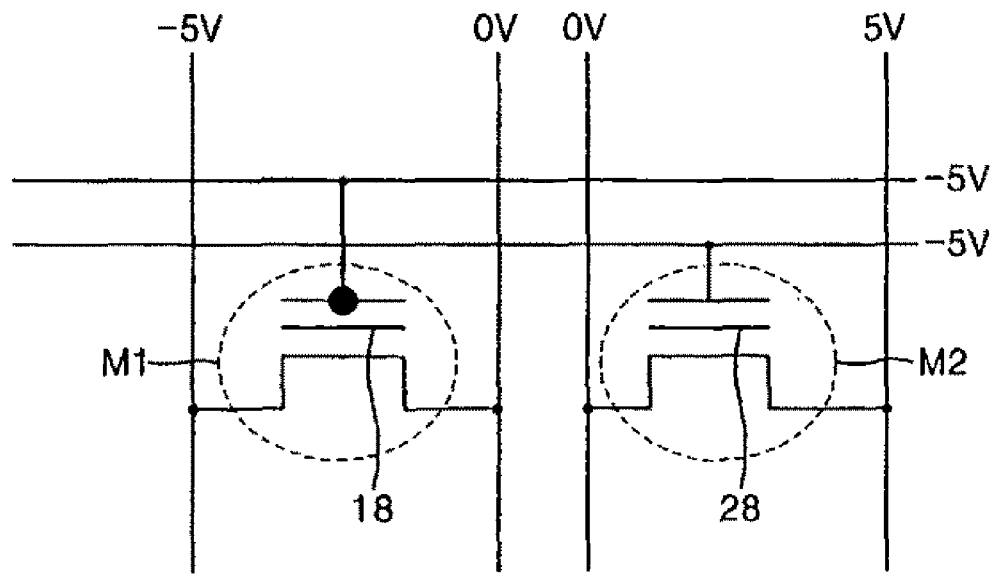
FIG. 15 illustrates an equivalent circuit diagram for a case where data is written in the P-type nonvolatile memory and written data is erased from the N-type nonvolatile memory in the nonvolatile memory devices shown in FIGS. 1 through 6.

Referring to FIG. 15, which illustrates an equivalent circuit diagram for a case in which data is written in the first nonvolatile memory M1 and stored data is erased from the second nonvolatile memory M2, a predetermined voltage, e.g., −5 V, may be applied to the first gate stacked structure G11 and the first impurity region 10s of the first nonvolatile memory M1. Also, a predetermined voltage, e.g., 0 V, may be applied to the second impurity region 10d. Simultaneously, predetermined voltages, e.g., −5 V and 5 V, are respectively applied to the second gate stacked structure G22 and the second impurity region 30s of the second nonvolatile memory M2. Also, a predetermined voltage, e.g., 0 V, may be applied to the first impurity region 30d.

As a result, whereas holes are tunneled from the substrate and trapped in the data storage layer 18 of the first nonvolatile memory M1, electrons trapped in the data storage layer 28 of the second nonvolatile memory M2 are emitted to the substrate. Thus, data may be written in the first nonvolatile memory, and data written in the second nonvolatile memory may be erased.

Figure 16:
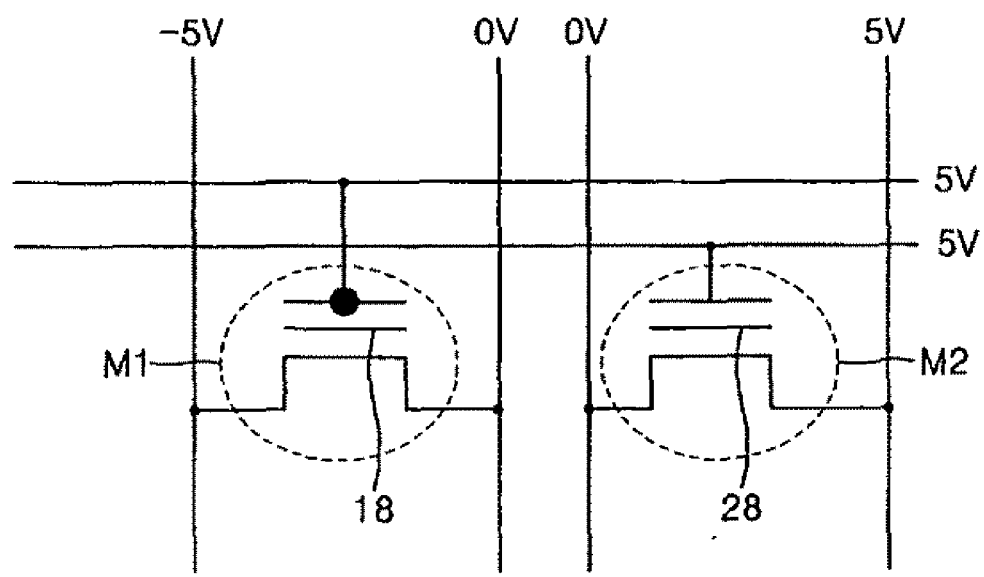
FIG. 16 illustrates an equivalent circuit diagram for a case where written data is erased from both the P-type and N-type nonvolatile memories in the nonvolatile memory devices shown in FIGS. 1 through 6.

Referring to FIG. 16, which illustrates an equivalent circuit diagram for a case in which data stored in the first nonvolatile memory M1 is erased and data is written in the second nonvolatile memory, a predetermined voltage, e.g., 5 V, may be applied to the first gate stacked structure G11 of the first nonvolatile memory M1, and a predetermined voltage, e.g., −5 V, may be applied to the first impurity region 10s thereof. Also, a predetermined voltage, e.g., 0 V, may be applied to the second impurity region 10d of the first nonvolatile memory M1. Simultaneously, a predetermined voltage, e.g., 5 V, may be applied to the second gate stacked structure G22 and the second impurity region 30s of the second nonvolatile memory M2, and a predetermined voltage, e.g., 0 V, may be applied to the first impurity region 30d.

As a result, whereas electrons are tunneled from the substrate and trapped in the data storage layer 28 of the second nonvolatile memory M2, holes trapped in the data storage layer 18 of the first nonvolatile memory M1 are emitted to the substrate. Thus, data may be written in the second nonvolatile memory M2, and data written in the first nonvolatile memory M1 may be erased.

Figure 17:
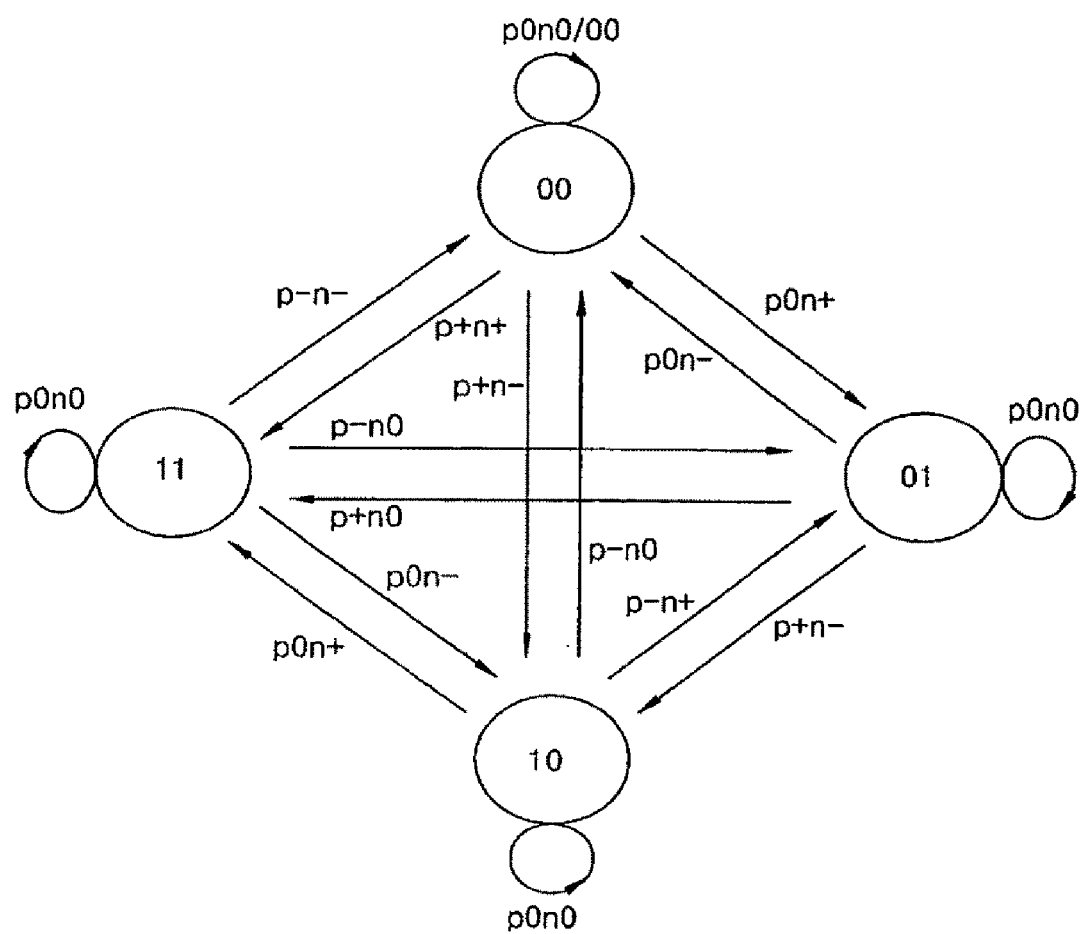
FIG. 17 illustrates transitions between data states and conditions required for the transitions between data states when the nonvolatile memory devices shown in FIGS. 1 through 6 are 2-bit memory devices.

FIG. 17 illustrates transitions between data states and conditions required for the transitions between data states when the nonvolatile memory devices shown in FIGS. 1 through 6 are 2-bit memory devices. Specifically, when each of the first and second nonvolatile memories M1 and M2 may be a 1-bit memory device, the first memory device may be a 2-bit memory device. FIG. 17 shows four data states that can be expressed by the first memory device, i.e., 00, 01, 10, and 11, and operating conditions required for transitions from one data state of the first memory device to another data state. To transition from one data state to another data state, data should be written in the first and/or second nonvolatile memories M1 and M2 or data stored therein should be still retained.

More specifically, in FIG. 17, reference character p0n+ denotes a condition for a transition from data state 00 to data state 01 in the first memory device. In other words, reference character p0n+ refers to characteristics of voltages applied to the first and second nonvolatile memories M1 and M2 to transition bit data written in the first memory device from 00 to 01. In p0n+, p refers to the first nonvolatile memory M1, n refers to the second nonvolatile memory M2, 0 refers to retention of written bit data, and + refers to application of a write voltage.

In this sense, p0n+ means that in the first memory, bit data written in the first nonvolatile memory M1 may be retained, and a predetermined write voltage may be applied to the second nonvolatile memory M2.

Based on the conditions required for transitions between data states, the $1^{st}$ through $5^{th}$ voltages V1, V2, V3, V4, and V5 to be applied to the first and second nonvolatile memories M1 and M2 are determined. Thus, bit data written in the first memory device can be changed, for example, from 00 to 01 or from 11 to 00. To transition bit data "00" written in the first memory device to "01" may be to write bit data "01" in the first memory device. Also, to transition bit data "11" written in the first memory device may be to erase bit data "11" from the first memory device.

If the first memory device may be a multi-bit memory device, for example, a 2-bit memory device, nine conditions for transitions between data states can be provided as shown in Table 1.

TABLE 1

| Transition Conditions | Input Voltage | | | | |
|---|---|---|---|---|---|
| | V1 | V2 | V3 | V4 | V5 |
| p0n0 | 0 | 0 | 0 | 0 | 0 |
| p0n+ | 0 | 0 | 0 | 5 | 5 |
| p0n− | 0 | 0 | 0 | −5 | 5 |
| p+n0 | −5 | −5 | 0 | 0 | 0 |
| p+n+ | −5 | −5 | 0 | 5 | 5 |
| p+n− | −5 | −5 | 0 | −5 | 5 |
| p−n0 | −5 | 5 | 0 | 0 | 0 |
| p−n+ | −5 | 5 | 0 | 5 | 5 |
| p−n− | −5 | 5 | 0 | −5 | 5 |

As shown in Table 1, under the transition conditions p0n0, p0n+, and p0n−, while bit data written in the first nonvolatile memory M1 (P-NVM) remains stored (i.e., p0), bit data written in the second nonvolatile memory M2 (N-NVM) also remains stored or may be changed. Under the transition conditions p+n0, p+n+, and p+n−, while bit data written in the first nonvolatile memory M1 may be changed from "0" to "1" (i.e., p+), bit data written in the second nonvolatile memory M2 remains stored or may be changed. Also, under the transition conditions p−n0, p−n+, and p−n−, while bit data written in the first nonvolatile memory M1 may be changed from "1" to "0" (i.e., p−), bit data written in the second nonvolatile memory M2 remains stored or may be changed.

Meanwhile, the first memory device may be a 4-bit memory device. In this case, sixteen multi-bit data (i.e., "0000", "0001", "0010", . . . , and "1111") can be written in the first memory device. Thus, as shown in FIG. 18, there are a greater number of conditions required for transitioning multi-bit data written in the first memory device, which may be the 4-bit memory device, than the transition conditions of the 2-bit memory device.

Figure 18:
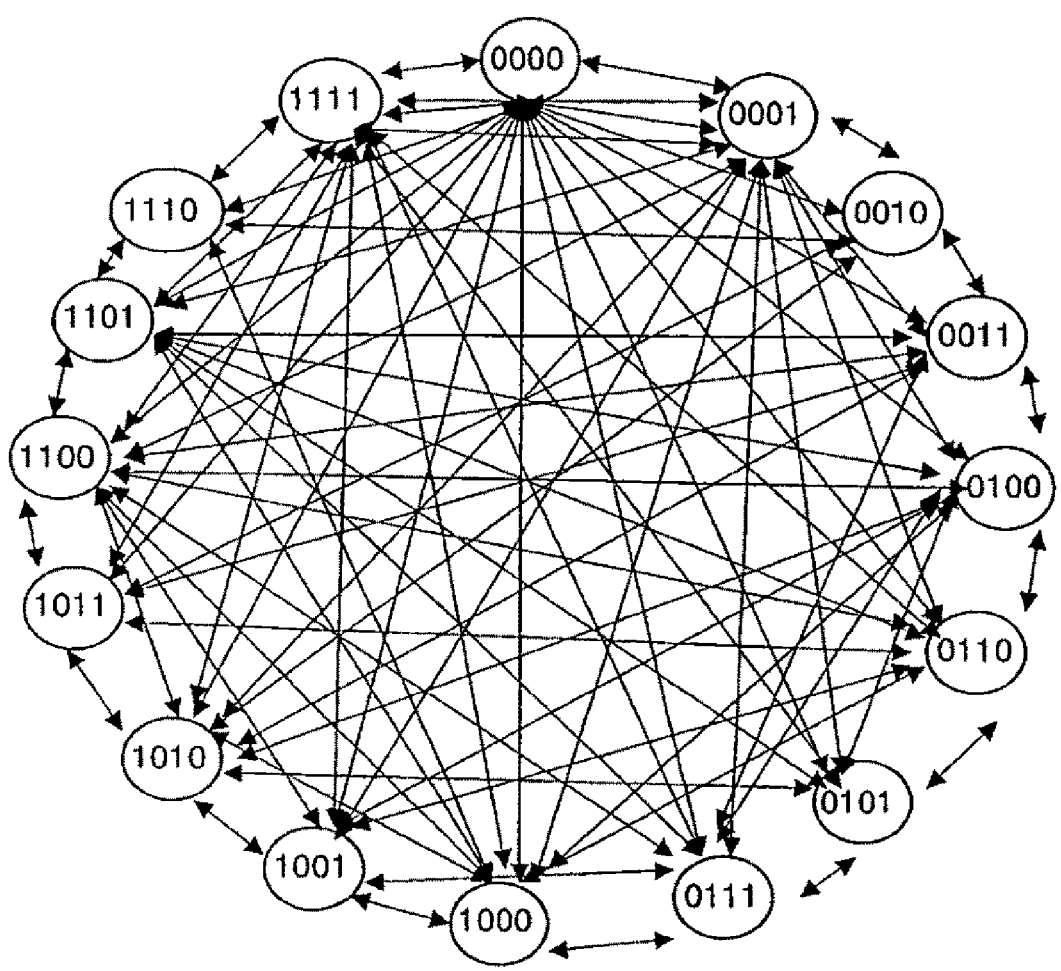
FIG. 18 illustrates transitions between data states when the nonvolatile memory devices shown in FIGS. 1 through 6 are 4-bit memory devices.

In FIG. 18, a bi-directional arrow shows that two multi-bit data indicated by the bi-directional arrow can be transitioned to each other. For example, a bi-directional arrow between multi-bit data "0000" and "0111" means that "0000" can be transitioned to "0111", and vice versa. Based on such transition conditions, the $1^{st}$ through $5^{th}$ voltages V1, V2, . . . , and V5 applied to the first and second gate stacked structures G11 and G22, the first impurity regions 10s and 30d, and the second impurity regions 10d and 30s of the first and second nonvolatile memories M1 and M2 are determined.

As stated above, the first memory device of the present invention can erase or write data in cell units based on transition conditions, unlike a conventional nonvolatile memory that erases or writes data in block units. Therefore, the first memory device of the present invention may obtain a high operating speed and reduce power consumption.

The foregoing can be applied likewise to the second to sixth memory devices of the present invention.

<Read Operation>

The read operation of the first memory device will be described with reference to FIG. 21, which may be a graph of input voltage versus output voltage when the nonvolatile memory devices shown in FIGS. 1 through 6 are 2-bit memory devices.

Figure 21:
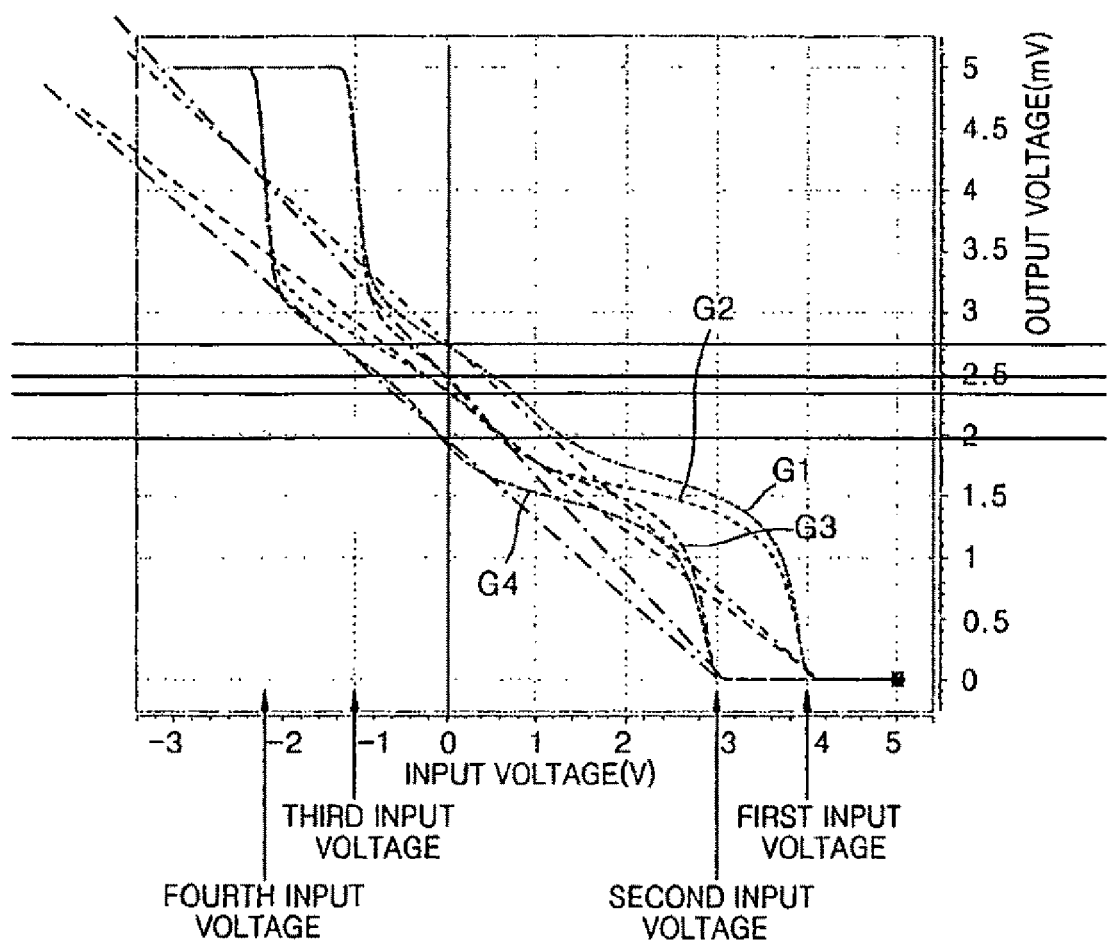
FIG. 21 illustrates a graph of input voltage versus output voltage when the nonvolatile memory devices shown in FIGS. 1 through 6 are 2-bit memory devices.

Referring to FIG. 21, the input voltage-to-output voltage curve may be obtained by a complementary action between the first and second nonvolatile memories M1 and M2 included in the first memory device, which may be a 2-bit memory device. In FIG. 21, the horizontal axis may be a voltage applied to the gate of the first memory device, and the vertical axis may be a voltage output from the first memory device.

In FIG. 21, first through fourth curves G1, G2, G3, and G4 show the voltage characteristics of the first memory device with respect to 2-bit data written in the first memory device.

Specifically, the first curve G1 shows the voltage characteristic of the first memory device that includes the first nonvolatile memory M1 in which holes are trapped and the second nonvolatile memory M2 in which electrons are not trapped. The second curve G2 shows the voltage characteristic of the first memory device that includes the first nonvolatile memory M1 in which holes are trapped and the second nonvolatile memory M2 in which electrons are trapped. The third curve G3 shows the voltage characteristic of the first memory device that includes the first nonvolatile memory M1 in which holes are not trapped and the second nonvolatile memory M2 in which electrons are not trapped. The fourth curve G4 shows the voltage characteristic of the first memory device that includes the first nonvolatile memory M1 in which holes are not trapped and the second nonvolatile memory M2 in which electrons are trapped.

Referring to the first and second curves G1 and G2, the first and second curves G1 and G2 start from the same positive applied voltage (hereinafter, a first threshold voltage), e.g., 4 V, and then gradually diverge with a reduction of applied voltage. Thus, at an applied voltage of 0 V, the output voltages are different. The first and second curves G1 and G2 remain diverged until the applied voltage reaches a predetermined negative value, e.g., −1 V.

Once the applied voltage becomes a predetermined negative voltage (hereinafter, a third input voltage), e.g., −1 V, the first curve G1 show essentially no change. Also, once the applied voltage becomes a negative voltage lower than the third input voltage (hereinafter, a fourth input voltage), e.g., −2 V, the second curve G2 may be also substantially unchanged.

By using the characteristics of the first and second curves G1 and G2, bit data written in the first memory device can be read. That may be, the first and second curves G1 and G2 correspond to cases where holes are trapped in the first nonvolatile memory M1 of the first memory. A predetermined voltage, for example, 5 V, may be applied to the first memory device, and then a voltage at which the first and second curves G1 and G2 start may be perceived while lowering the applied voltage. The speed with which the applied voltage may be lowered may be performed in accordance with a desired level of reading precision. If the output voltage may be higher than the second input voltage, e.g., 3.5 V, then the output voltage may be known to be on one of either of curves G1 or G2. Thus, it can be inferred that the first nonvolatile memory M1 has a data bit "1" written to it. As a result, the data bit in the first nonvolatile memory M1 of the first memory device can be read.

Next, when a predetermined voltage, e.g., 0 V, which keeps the first and second curves G1 and G2 diverged, may be applied, an output voltage of the first memory device may be measured. If the output voltage is higher than, e.g., 2.7 V, then the output voltage is known to be on the curve G1. Thus, it can be inferred that the second nonvolatile memory M2 has a bit data "0" written to it. If the output voltage is lower, it can be inferred that the second nonvolatile memory M2 has a bit data "1" written to it. As a result, the bit data in the second nonvolatile memory M2 of the first memory device can be read For instance, after a voltage at which the first and second curves G1 and G2 start is detected, when an output voltage of the first memory device measured by applying 0 V to the first memory device satisfies a value obtained from the first curve G1, it may be inferred that electrons are not trapped in the second nonvolatile memory M2 of the first memory device. Accordingly, bit data "1" is considered to be written in the first nonvolatile memory M1 and bit data "0" is written in the second nonvolatile memory M2. Thus, multi-bit data written in the first memory device is read as "10". In the same manner, multi-bit data written in the first memory device is read as "11".

Similarly, based on the third and fourth curves G3 and G4, other bit data written in the first memory device, e.g., "01" or "00", can be read. Since this process may be the same as the above-described process of reading bit data "10" or "11" written in the first memory device based on the first and second curves G1 and G2, a detailed description thereof will not be presented here.

Figure 19:
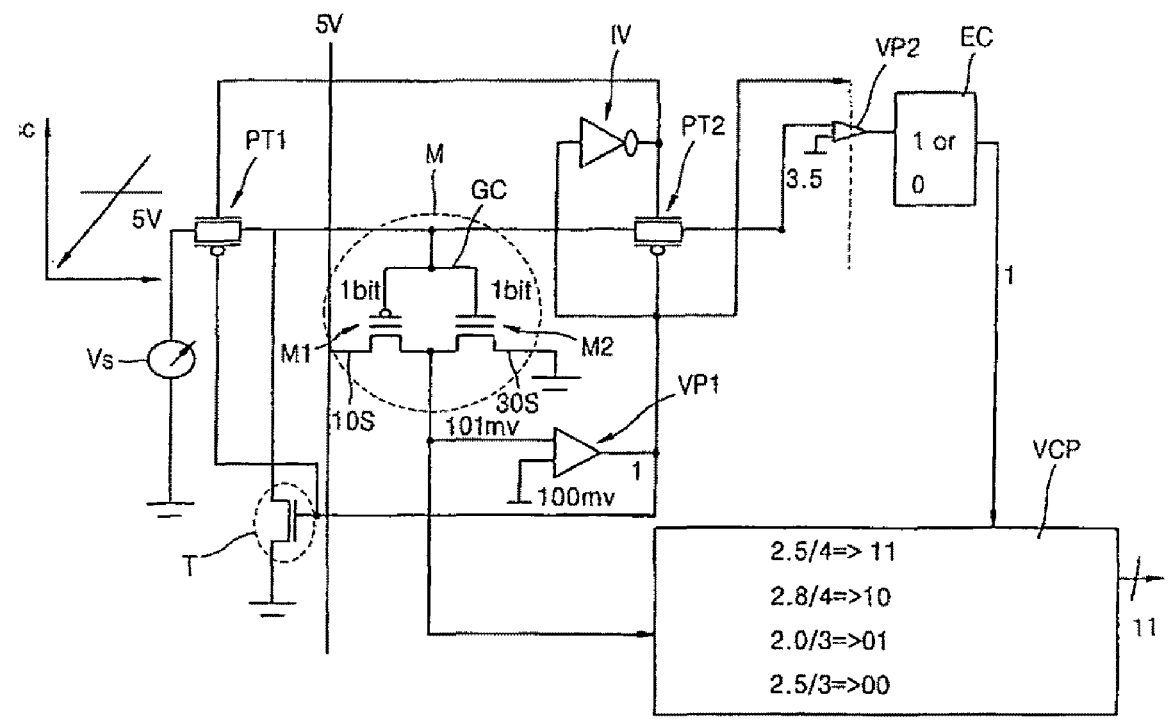
FIGS. 19 and 20 illustrate reading circuits used when the nonvolatile memory devices shown in FIGS. 1 through 6 are 2-bit memory devices.

FIG. 19 illustrates a reading circuit that reads 2-bit data from the first memory device, which may be a 2-bit memory device, using the input voltage-to-output voltage curves shown in FIG. 21.

A process of reading 2-bit data from the first memory device M will be described with reference to FIG. 19.

At the outset, a predetermined voltage (e.g., 5 V), which is higher than the voltage at which the first and second curves G1 and G2 start, may be applied to the common gate GC of the first and second nonvolatile memories M1 and M2. At the same time, a predetermined voltage, e.g., 5 V, may be applied to the first impurity region 10s of the first nonvolatile memory M1. Also, the second impurity region 30s of the second nonvolatile memory M2 may be grounded.

Thereafter, an output voltage of the first memory device M, which may be higher than a reference voltage (e.g., 100 mV), may be measured while lowering the applied voltage of the common gate GC slowly. The reference voltage may be a voltage measured before the first and second curves G1 and G2 or the third and fourth curves G3 and G4 diverge. To measure the output voltage of the first memory device M, a first voltage comparator VP1 may be connected to an output terminal of the first memory device M, while the reference voltage may be applied to the other input terminal of the first voltage comparator VP1.

The process of measuring the output voltage of the first memory device M while lowering the applied voltage of the common gate GC slowly may be performed in the same manner as the process of detecting the voltage at which the first and second curves G1 and G2 or the third and fourth curves G3 and G4 start as shown in FIG. 21.

Since the output voltage of the first memory device is preferably measured rapidly, the first voltage comparator VP1 should detect a low output voltage to allow data to be read as soon as possible. Accordingly, the first voltage comparator VP1 may measure a voltage lower than the voltage at which the first and second curves G1 and G2 (or the third and fourth curves G3 and G4) diverge.

Thus, a voltage (e.g., 100 mV), which may be far lower than the output voltage at which the first and second curves G1 and G2 (or the third and fourth curves G3 and G4) diverge, may be applied as the reference voltage to the first voltage comparator VP1. If the output voltage of the first memory device M is equal to or higher than the reference voltage applied to the first voltage comparator VP1, the first voltage comparator VP1 generates a signal corresponding to "1", and if not, the first voltage comparator VP1 generates a signal corresponding to "0".

The first voltage comparator VP1 may be connected to a P-MOSFET of a first pass transistor PT1 disposed between the common gate CG and a power supply Vs, a P-MOSFET of a second pass transistor PT2 disposed between the common gate GC and a second voltage comparator VP2, an inverter IV may be connected to N-MOSFETs of the first and second pass transistors PT1 and PT2, and a transistor T may be connected between the first pass transistor PT1 and the common gate GC.

Accordingly, when the first voltage comparator VP1 generates a signal corresponding to "1" (hereinafter, a comparator signal), the comparator signal may be applied to the P-MOSFETs of the first and second pass transistors PT1 and PT2, the inverter IV, and the transistor T simultaneously. Thus, a signal corresponding to "0" is output from the inverter IV so that the N-MOSFETs of the first and second pass transistors PT1 and PT2 are turned off. Also, as the comparator signal may be applied to the P-MOSFETs of the first and second pass transistors PT1 and PT2, the P-MOSFETs are turned off. As a result, both the first and second pass transistors PT1 and PT2 are turned off, so that a voltage applied from the power supply Vs to the common gate GC may be cut off and then a voltage applied through the second pass transistor PT2 to the second voltage comparator VP2 may also be cut off.

Before the second pass transistor PT2 may be turned off, a voltage applied to the common gate GC may be applied to an input terminal of the second voltage comparator VP2, which may be connected to the second pass transistor PT2. As the second pass transistor PT2 may be turned off, the voltage applied to the input terminal of the second voltage comparator VP2 may be cut off. However, because the same voltage as the voltage applied from the power supply Vs to the common gate GC may be continuously applied to the input terminal of the second voltage comparator VP2 until it may be cut off, although the second pass transistor PT2 may be turned off, the same voltage as the voltage applied to the common gate GC may be continuously applied to the input terminal of the second voltage comparator VP2, which may be connected to the second pass transistor PT2.

Thereafter, as the comparator signal may be applied also to the second voltage comparator VP2, the second voltage comparator VP2 operates. Since the first voltage comparator VP1 generates a signal corresponding to "0" until the second pass transistor PT2 may be turned off, the second voltage comparator VP2 does not operate.

The second voltage comparator VP2 compares a voltage input to an input terminal connected to the second pass transistor PT2 (hereinafter, a first input terminal) with a reference voltage applied to the other input terminal (hereinafter, a second input terminal). From the first and second curves G1 and G2 of FIG. 21, a voltage input to the first input terminal when the second voltage comparator VP2 starts to operate may be an input voltage at which the first and second curves G1 and G2 start (hereinafter, a first input voltage) or an input voltage at which the third and fourth curves G3 and G4 start (hereinafter, a second input voltage). Bit data written in the first nonvolatile memory M1 at a point in time when the first input voltage may be applied to the common gate GC differs from bit data written at a point in time when the second input voltage may be applied thereto. Therefore, by determining whether a voltage input to the first input terminal of the second voltage comparator VP2 may be the first input voltage or the second input voltage, bit data written in the first nonvolatile memory can be read. Accordingly, in order to determine whether the voltage applied to the first input terminal of the second voltage comparator VP2 is the first input voltage or the second input voltage, a voltage between the first and second input voltages is applied as a reference voltage to the second input terminal. For example, when the first input voltage is +4 V and the second input voltage is +3 V, a reference voltage of 3.5 V can be applied to the second input terminal of the second voltage comparator VP2. In this example, when the first input voltage is applied to the first input terminal, since the first input voltage is higher than the reference voltage, the second voltage comparator VP2 outputs a signal corresponding to "1", indicating graphs G1 and G2. When the second input voltage is applied to the first input terminal, the second voltage comparator VP2 outputs a signal corresponding to "0", indicating graphs G3 and G4.

As described above, when the first and second curves G1 and G2 of FIG. 21 start at the first input voltage, holes are known to be trapped in the first nonvolatile memory M1, i.e., bit data "1" is written in the first nonvolatile memory M1. When the third and fourth curves G3 and G4 of FIG. 21 start at the second input voltage, holes are known not to be trapped in the first nonvolatile memory M1, i.e., bit data "0" is written in the first nonvolatile memory M1. Thus, a signal corresponding to "1" or "0" output from the second voltage comparator VP2 can be regarded as bit data "1" or "0" written in the first nonvolatile memory M1.

The signal output from the second voltage comparator VP2 may be input to an encoder EC connected thereto. When the signal input from the second voltage comparator VP2 to the encoder EC corresponds to "1", the encoder EC regards the signal as "1". On the other hand, when the signal input from the second voltage comparator VP2 to the encoder EC corresponds to 0, the encoder EC regards the signal as "0". The encoder EC encodes the input signal and sends the encoded signal to a voltage comparing circuit VCP of a central processing unit (CPU). The voltage comparing circuit VCP compares an output voltage of the first memory device M when 0 V is applied to the common gate GC with a voltage (the first or second input voltage) input to the first input terminal of the second voltage comparator VP2, which may be calculated from a signal input from the encoder EC. Then, the voltage comparing circuit VCP outputs data written in the first memory device M.

More specifically, if the output voltage of the first memory device M is equal to or higher than the reference voltage of the first voltage comparator VP1, the first and second pass transistors PT1 and PT2 are turned off, and a voltage applied from the power supply Vs to the common gate GC is cut off. Also, the grounded transistor T is turned on so that a voltage of 0 V is applied to the common gate GC. At this time, a predetermined voltage is output from the first memory device M and input to the voltage comparing circuit VCP. When 0 V is applied to the common gate GC, the voltage output from the first memory device M depends on bit data written in the first memory device M.

The foregoing may be supported by the fact that the first through fourth curves C1, G2, G3, and G4 of FIG. 21 have respectively different output voltages at the input voltage of 0 V.

That is, after a voltage applied to the common gate GC of the first memory device M becomes the first input voltage, when a voltage applied to the common gate GC becomes 0 V, the output voltage of the first memory device M becomes equal to the output voltage of one of the first and second curves G1 and G2 obtained at the input voltage of 0 V.

If the output voltage of the first memory device M obtained when 0 V is applied to the common gate GC is equal to the output voltage of the first curve G1 of FIG. 21, it can be seen from the characteristic of the first curve G1 that electrons are not trapped in the second nonvolatile memory M2 of the first memory device M. In this case, it may be inferred that bit data "0" is written in the second nonvolatile memory M2.

If the output voltage of the first memory device M obtained when 0 V is applied to the common gate GC is equal to the output voltage of the second curve G2 of FIG. 21, it can be seen from the characteristic of the second curve G2 that electrons are trapped in the second nonvolatile memory M2 of the first memory device M. In this case, it can be inferred that bit data "1" is written in the second nonvolatile memory M2.

To express the output voltage of the first memory device M based on the first or second curve G1 or G2 of FIG. 21 means that holes are trapped in the first nonvolatile memory M1, i.e., bit data "1" is written in the first nonvolatile memory M1. This can be confirmed by the fact that a signal corresponding to "1" is output from the second voltage comparator VP2 to which a voltage between the first and second input voltages, for example, 3.5 V, is applied as the reference voltage.

As a signal corresponding to "1" is input from the encoder EC, the voltage comparing circuit VCP perceives that the first input voltage, e.g., 4 V, is applied to the common gate GC of the first memory device M. Also, the voltage comparing circuit VCP measures a voltage input from the first memory device M in which 0 V is applied to the common gate GC, and compares the perceived voltage with the measured voltage. Based on the comparison result, the voltage comparing circuit VCP determines a value of bit data written in the second nonvolatile memory M2.

For example, if a voltage from the first memory device M to which 0 V is applied is on the first curve G1 of FIG. 21, i.e., 2.8 V, the voltage comparing circuit VCP compares the perceived voltage (i.e., 4 V) with the measured voltage (i.e., 2.8 V) and determines that bit data written in the second nonvolatile memory M2 is "0". On the other hand, if a voltage from the first memory device M to which 0 V is applied is on the first curve G2 of FIG. 21, i.e., 2.5 V, the voltage comparing circuit VCP compares the two values and determines that bit data written in the second nonvolatile memory M2 is "1".

By analyzing the comparison result and the signal input from the encoder EC, the voltage comparing circuit VCP determines whether bit data written in the first memory device M is "11" or "10", and outputs corresponding bit data.

In FIG. 19, "2.5/4=>11" described in the voltage comparing circuit VCP indicates that bit data "1" is written in the first nonvolatile memory M1 and bit data "1" is written in the second nonvolatile memory M2. The remaining contents described in the voltage comparing circuit VCP can be interpreted in the same manner.

As described above, during the process of reading bit data written in the first memory device M, once bit data written in the first nonvolatile memory M1 is read, bit data written in the second nonvolatile memory M2 can be known by measuring an output voltage of the first memory device M obtained when 0 V is applied to the first memory device M, based on a complementary voltage characteristic curve of the first and second nonvolatile memories M1 and M2 as shown in FIG. 21. Accordingly, it may be not required to perform a read operation on the second nonvolatile memory M2. As a result, time required to read data from the first memory device can be shortened.

When the second input voltage, which may be a voltage at which the third and fourth curves G3 and G4 start, is applied to the common gate GC of the first memory device M, a process of reading bit data written in the first memory device M, e.g., "01" or "00", using the voltage comparing circuit VCP can be explained in the same manner as when the first input voltage is applied to the common gate GC.

In FIG. 19, "2.0/3=>01" and "2.5/3=>00" described in the voltage comparing circuit VCP indicate that when the second input voltage of 3 V is applied to the common gate GC and then 0 V is applied to the common gate GC, if an output voltage of the first memory device M is 2.0 V, data written in the first memory device M is regarded as "01", and if an output voltage of the first memory device M is 2.5 V, data written in the first memory device M is regarded as "00".

Figure 20:
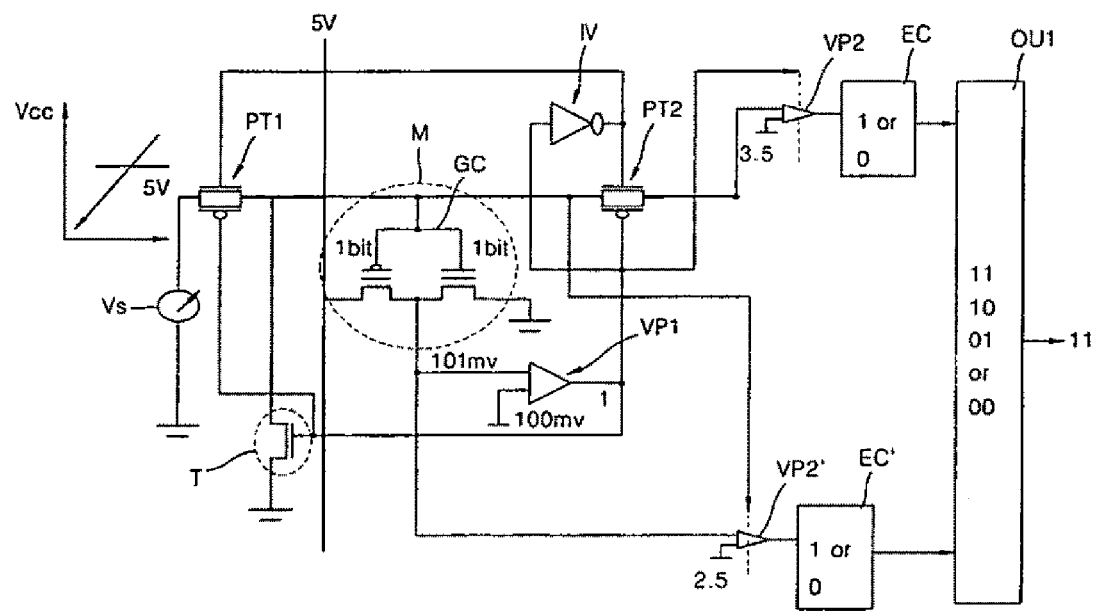

In the meantime, the circuit of FIG. 19 can be modified into other circuits having the same function. FIG. 20 shows such a modified example of the reading circuit of FIG. 19. The circuit of FIG. 20 will be described now, but a description of the same portions as in the circuit of FIG. 19 will be omitted.

Referring to FIG. 20, a third voltage comparator VP2' may be connected to an output terminal of the first memory device M, while a predetermined reference voltage, e.g., 2.5 V, is applied to the other input terminal of the first memory device M. A second encoder EC', which performs the same function as an encoder connected to an output terminal of a second comparator VP2 (hereinafter, a first encoder), may be connected to an output terminal of the third voltage comparator VP2'. Also, a third encoder OU1 may be connected to output terminals of the first and second encoders EC and EC'. When 0 V is applied to the common gate GC the third voltage comparator VP2' may compare an output voltage of the first memory device M with a reference voltage applied to the third voltage comparator VP2'. The third voltage comparator VP2' operates only when a signal corresponding to 0 V is given. For this operation, the third voltage comparator VP2' may be connected between first and second pass transistors PT1 and PT2. Accordingly, after the first or second input voltage may be applied to the common gate GC, as a voltage of 0 V is applied to the common gate GC, a predetermined voltage is output from the first memory device M and input to the third voltage comparator VP2'. Simultaneously, a signal corresponding to 0 V is applied to the third voltage comparator VP2' and thus, the third voltage comparator VP2' compares the voltage input from the first memory device M with the reference voltage and outputs the comparison result to the second encoder EC'. The third voltage comparator VP2' operates in the same manner as the second voltage comparator VP2 except signal for operation is different.

A voltage input from the first memory device M to the third voltage comparator VP2' may be an output voltage of the first memory device M obtained when 0 V is applied to the common gate GC and corresponds to one of output voltages of the first through fourth curves G1, G2, G3, and G4 at an input voltage of 0 V in FIG. 21.

During a process of slowly lowering a voltage applied to the common gate GC of the first memory device M, after the voltage applied to the common gate GC becomes the first input voltage and thus, the first voltage comparator VP1 outputs the comparator signal, when a voltage of 0 V is applied to the common gate GC, a voltage that the first memory device M can output may be an output voltage of the first curve G1 at an input voltage of 0 V (hereinafter, a first output voltage) or an output voltage of the second curve G2 at an input voltage of 0 V (hereinafter, a second output voltage) in FIG. 21. The first and second output voltages depend on bit data written in the second nonvolatile memory M2 of the first memory device M. That is, after a voltage of 0 V is applied to the common gate GC, if the first memory device M outputs the first output voltage, it can be regarded that predetermined bit data, e.g., "1", is read from the second nonvolatile memory M2. If the first memory device M outputs the second output voltage, it can be regarded that other bit data, e.g., "0", is read from the second nonvolatile memory M2. Thus, the third voltage comparator VP2' should be capable of outputting a signal corresponding to bit data "1" when the first output voltage is input from the first memory device M and capable of outputting a signal corresponding to bit data "0" when the second output voltage is input therefrom. Therefore, the reference voltage applied to the third voltage comparator VP2' is lower than the first output voltage and higher than the second output voltage.

Meanwhile, after the voltage applied to the common gate GC becomes the second input voltage and thus, the first voltage comparator VP1 outputs the comparator signal, when a voltage of 0 V is applied to the common gate GC, a voltage that the first memory device M can output is an output voltage of the third curve G3 at an input voltage of 0 V (hereinafter, a third output voltage) or an output voltage of the fourth curve G4 at an input voltage of 0 V (hereinafter, a fourth output voltage). The third and fourth output voltages depend on bit data written in the second nonvolatile memory M2. That is, after a voltage of 0 V is applied to the common gate GC, if the first memory device M outputs the third output voltage, it can be regarded that predetermined bit data, e.g., "1", is read from the second nonvolatile memory M2. If the first memory device M outputs the fourth output voltage, it can be regarded that other bit data, e.g., "0", is read from the second nonvolatile memory M2. Thus, the third voltage comparator VP2' should be capable of outputting a signal corresponding to bit data "1" when the third output voltage is input from the first memory device M and capable of outputting a signal corresponding to bit data "0" when the fourth output voltage is input therefrom. Therefore, the reference voltage applied to the third voltage comparator VP2' may be between the third and fourth output voltages.

Referring to FIG. 21, it can be observed that the third and fourth output voltages are different and also the first and second output voltages are different each other. Therefore, after the first input voltage is applied to the common gate GC of the first memory device M, when a voltage of 0 V is applied to the common gate GC, the reference voltage applied to the third voltage comparator VP2' may differ from the reference voltage applied to the third voltage comparator VP2' when the second input voltage is applied to the common gate GC and then a voltage of 0 V is applied to the common gate GC.

As explained above, the third voltage comparator VP2' starts to operate when a voltage of 0 V is applied to the common gate GC, compares the output voltage of the first memory device M with the reference voltage, and outputs a signal corresponding to bit data written in the second nonvolatile memory M2 of the first memory device M to the second encoder EC'.

As a result, in the reading circuit shown in FIG. 20, the second voltage comparator VP2 outputs only a signal corresponding to bit data written in the first nonvolatile memory M1 of the first memory device M, while the third voltage comparator VP2' outputs only a signal corresponding to bit data written in the second nonvolatile memory M2 thereof.

The first and second encoders EC and EC' respectively encode output signals of the second and third voltage comparators VP2 and VP2' to bit data "1" or "0" and outputs the bit data to the third encoder OU1. The third encoder OU1 combines the bit data input from the first encoder EC and the bit data input from the second encoder EC', encodes the combined bit data, and outputs 2-bit multi-bit data, for example, "11", "10", "01", or "00".

Hereinafter, a read operation of an array of the foregoing first memory device M, which is a 2-bit memory device, will be described with reference to FIG. 22.

Figure 22:
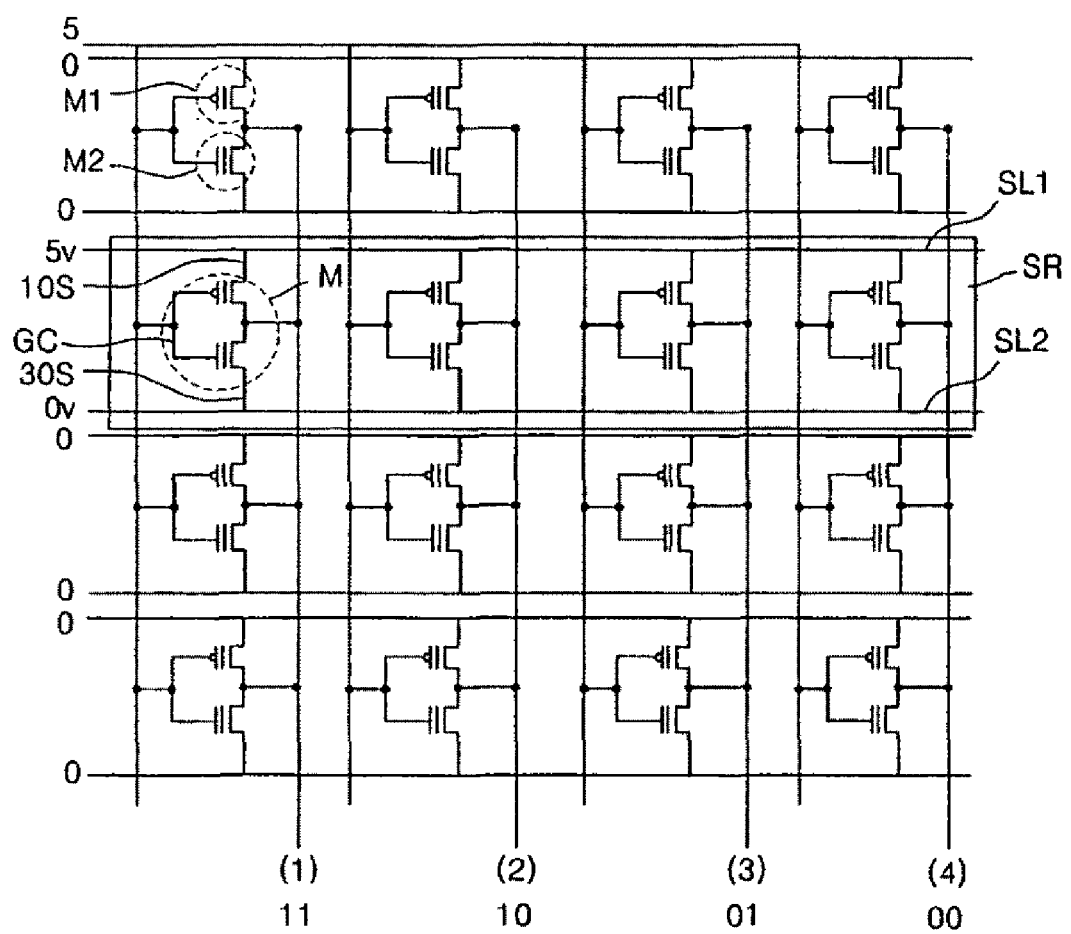
FIG. 22 illustrates an equivalent circuit diagram for how data is read from a row selected from a cell array including 2-bit memory devices when the nonvolatile memory devices shown in FIGS. 1 through 6 are the 2-bit memory devices.

FIG. 22 shows a memory cell array in which a plurality of first memory devices M may be arrayed in rows and columns. In FIG. 22, a row SR may be selected for a read operation.

Referring to FIG. 22, a power supply voltage, e.g., 5 V, may be applied to a common gate GC of each of the first memory devices M of the array. A predetermined voltage, e.g., 5 V, may be applied to a first source line SL1 that connects first impurity regions 10s of first nonvolatile memories M1 of the first memory devices M in the selected row SR. A voltage of 0 V may be applied to a second source line SL2 that connects second impurity regions 30s of second nonvolatile memories M2 thereof. Also, a voltage of 0 V may be applied to first impurity regions 10s of first nonvolatile memories M1 and second impurity regions 30s of second nonvolatile memories M2 of the first memory device M in unselected rows. Thus, even if a read voltage may be applied to a common gate GC of the first memory device M in the selected row, the first memory devices M in the unselected rows can remain disabled.

While the voltages are being applied to the common gate GC of the first memory device M, the first source line SL1 of the first nonvolatile memory M1, and the second source line SL2 of the second nonvolatile memory M2 as described above, the voltage applied to the common gate GC may be slowly lowered to 0 V. In this process, bit data written in the first memory device M can be read. This read operation may be performed in the same manner as described with reference to FIG. 19 or 20.

When all the bit data written in the selected first memory devices M may be the same, e.g., "11", applied voltages at which the selected first memory devices M start to be enabled would be the same. Therefore, the selected first memory devices M output written bit data at the same applied voltage. Output terminals of the first memory devices M in a column of the array are connected by a drain line DL. The bit data written in the selected first memory devices M are output through the drain line DL to which the selected first memory devices M are connected.

Meanwhile, bit data written in the selected first memory devices M may be respectively different. For example, as shown in FIG. 22, four first memory devices M may be located in a selected row. In this case, assuming that bit data written in a first first memory device M may be "11", bit data written in a second first memory device M may be "10", bit data written in a third first memory device M may be "01", and bit data written in a fourth first memory device M may be "00", while the voltage applied to the common gate GC of the selected first memory devices M may be being slowly lowered, the second first memory device M corresponding to the first curve G1 of FIG. 21 and the first first memory device M corresponding to the second curve G2 of FIG. 21 are firstly enabled. Thus, the bit data written in the first and second first memory devices M are firstly read. Thereafter, the third first memory device M corresponding to the fourth curve G4 of FIG. 21 and the fourth first memory device M corresponding to the third curve G3 are enabled so that bit data written therein are read.

Hereinafter, the read operation of a first memory device, which may be a 4-bit memory device, will be described with reference to FIG. 23.

Figure 23:
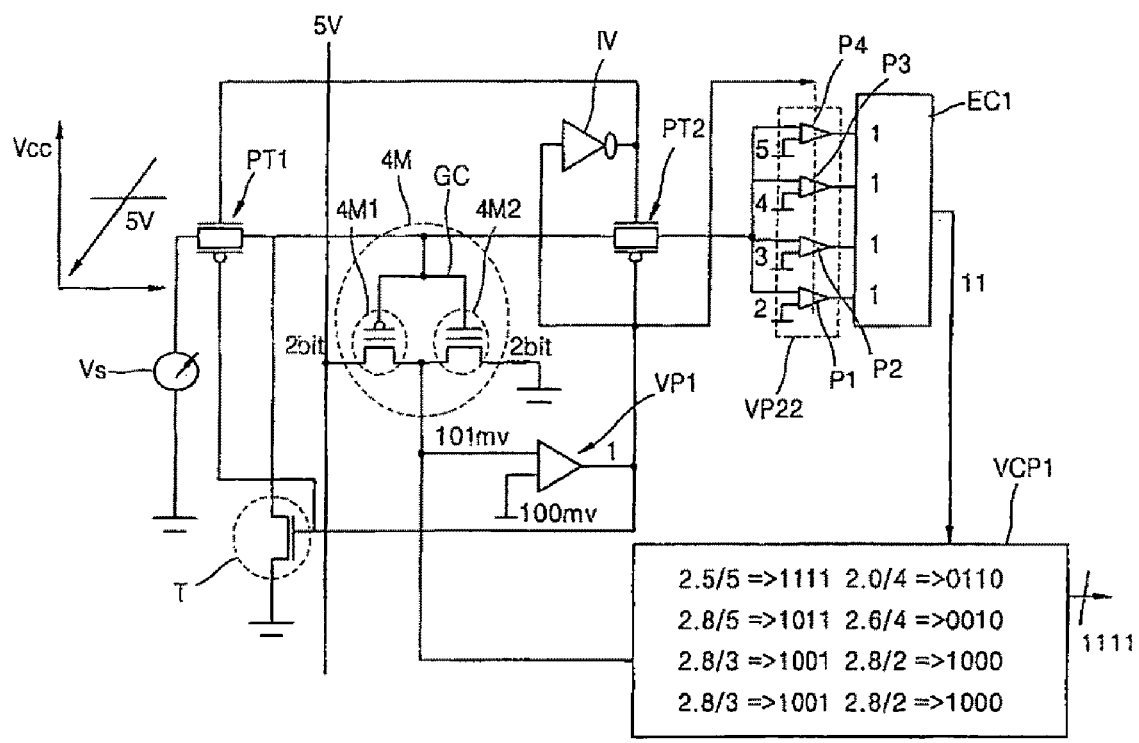
FIGS. 23 and 24 illustrate circuit diagrams for read operations when the nonvolatile memory devices shown in FIGS. 1 through 6 are 4-bit memory devices.

A reading circuit of the first memory device of FIG. 23, which may be the 4-bit memory device, may be generally the same as the reading circuit of the first memory device of FIG. 19, which may be the 2-bit memory device, except for a second voltage comparator and a voltage comparing circuit.

Specifically, while the second voltage comparator VP2 of FIG. 19 includes one comparator, a second voltage comparator VP22 of FIG. 23 includes four comparators P1, P2, P3, and P4. Also, the voltage comparing circuit VCP of FIG. 19 compares the voltage corresponding to the signal input from the second voltage comparator VP2 with the voltage input from the first memory device M and outputs 2-bit data, a voltage comparing circuit VCP1 of FIG. 23 undergoes the same process and then outputs 4-bit data.

The second voltage comparator VP22 of FIG. 23 will now be described in more detail.

$1^{st}$ through $4^{th}$ reference voltages are applied to second input terminals of the $1^{st}$ through $4^{th}$ comparators P1, P2, P3, and P4, respectively, and first input terminals thereof are commonly connected to the output terminal of a second pass transistor PT2.

A first memory device 4M, i.e., a 4-bit memory device (hereinafter, a 4-bit first memory device) includes a first nonvolatile memory 4M1 in which 2-bit data, namely, "11", "10", "01", or "00", can be written.

If bit data "11" may be written in the first nonvolatile memory 4M1, a voltage applied to a common gate GC of the 4-bit first memory device 4M becomes a third input voltage, an output voltage of the 4-bit first memory device 4M becomes higher than a reference voltage applied to the first voltage comparator VP1, e.g., 100 mV. Likewise, if bit data "10", "01", and "00" may be written in the first nonvolatile memory 4M1, respectively, as a voltage applied to the common gate GC of the 4-bit first memory device 4M becomes a fourth input voltage, a fifth input voltage, and a sixth input voltage, respectively, an output voltage of the 4-bit first memory device 4M becomes higher than a reference voltage applied to the first voltage comparator VP1, for example, 100 mV. Thus, the first voltage comparator VP1 outputs a signal corresponding to 1, a voltage applied from a power supply Vs to the common gate GC may be cut off in response to the signal corresponding to 1, and a voltage of 0 V may be applied from a transistor T of which source may be grounded to the common gate GC. Also, the second voltage comparator VP22 operates in response to the signal corresponding to 1. Thus, it may be measured which of the third through sixth input voltages may be the voltage applied to the common gate GC directly before the voltage of 0 V may be applied to the common gate GC. Via this process, it may be possible to read bit data written in the first nonvolatile memory 4M1.

In order to measure the third through sixth input voltages, the second voltage comparator VP22 includes the $1^{st}$ through $4^{th}$ comparators P1, P2, P3, and P4. Predetermined reference voltages, e.g., 2, 3, 4, and 5 V are applied to the $1^{st}$ through $4^{th}$ comparators P1, P2, P3, and P4, respectively. The reference voltages are relevant to the third through sixth input voltages. When the third through sixth input voltages are 5, 4, 3, and 2 V, respectively, the reference voltages applied to the $1^{st}$ through $4^{th}$ comparators P1, P2, P3, and P4 may be 2, 3, 4, and 5 V, respectively, as presented above. However, when the third through sixth input voltages have different values than described above, the reference voltages applied to the $1^{st}$ through $4^{th}$ comparators P1, P2, P3, and P4 also may have different values.

To facilitate the explanation of the 4-bit first memory device 4M, we suppose here that the third through sixth input voltages are 5, 4, 3, and 2 V, respectively, and the reference voltages applied to the $1^{st}$ through $4^{th}$ comparators P1, P2, P3, and P4 are 2, 3, 4, and 5 V, respectively.

As the third input voltage, e.g., 5 V, may be applied to the second voltage comparator VP22, the $1^{st}$ through $4^{th}$ comparators P1, P2, P3, and P4 each output a signal corresponding to "1". Thus, a signal corresponding to "1111" may be input to a first encoder EC1 connected to the second voltage comparator VP22.

As the fourth input voltage, i.e., 4 V, may be applied to the second voltage comparator VP22, the fourth comparator P4 outputs a signal corresponding to "0", while the $1^{st}$ through $3^{rd}$ comparators P1, P2, and P3 each output a signal corresponding to "1". Thus, a signal corresponding to "0111" may be input to the first encoder EC1.

As the fifth input voltage, i.e., 3 V, may be applied to the second voltage comparator VP22, the third and fourth comparators P3 and P4 each output a signal corresponding to "0", while the first and second comparators P1 and P2 each output a signal corresponding to "1". Thus, a signal corresponding to "0011" may be input to the first encoder EC1.

As the sixth input voltage, i.e., 2 V, may be applied to the second voltage comparator VP22, the second through fourth comparators P2, P3, and P4 each output a signal corresponding to "0", and the first comparator P1 outputs a signal corresponding to "1". Thus, a signal corresponding to "0001" may be input to the first encoder EC1.

The first encoder EC1 encodes the signal corresponding to "1111", "0111", "0011", or "0001" input from the second voltage comparator VP22 to "11", "10", "01", or "00" and outputs the encoded value to the voltage comparing circuit VCP1 of a CPU. The encoded value (11, 10, 01, or 00) to which the signal corresponding to "1111", "0111", "0011", or "0001" may be encoded may be arbitrarily determined. For example, the first encoder EC1 may encode "1111" to "01" or "0001" to "11". However, to facilitate explanation of the present invention, it may be assumed here that the signals corresponding to "1111", "0111", "0011", and "0001" are encoded to "11", "10", "01", and "00", respectively.

The voltage comparing circuit VCP1 analyzes the encoded signal input from the first encoder EC1, determines which of the third through sixth input voltages may be the voltage applied to the common gate GC, and perceives bit data written in the first nonvolatile memory 4M1.

For instance, when the encoded signal input from the first encoder EC1 may be "11", the voltage comparing circuit VCP1 determines that the voltage applied to the common gate GC may be the third input voltage. Based on the determination result, the voltage comparing circuit VCP1 perceives bit data "11" written in the first nonvolatile memory 4M1.

Bit data written in the first nonvolatile memory 4M1 may be read in the above-described manner.

Hereinafter, a process of reading bit data written in a second nonvolatile memory 4M2 of the 4-bit first memory device 4M will be described.

Directly after the third, fourth, fifth, or sixth input voltage may be applied to the common gate GC, when a voltage of 0 V may be applied to the common gate GC, an output voltage of the 4-bit first memory device 4M depends on bit data written in the second nonvolatile memory 4M2.

That is, when "11", "10", "01", or "00" may be written in the first nonvolatile memory 4M1, any one multi-bit data of "11", "10", "01", and "00" may be written in the second nonvolatile memory 4M2.

When "11" may be written in the second nonvolatile memory 4M2, a voltage output from the 4-bit first memory device 4M with the application of 0 V to the common gate GC will now be referred to as a third output voltage. When "10" is written in the second nonvolatile memory 4M2, a voltage output from the 4-bit first memory device 4M with the application of 0 V to the common gate GC will now be referred to as a fourth output voltage. When "01" is written in the second nonvolatile memory 4M2, a voltage output from the 4-bit first memory device 4M with the application of 0 V to the common gate GC will now be referred to as a fifth output voltage. Also, when "00" is written in the second nonvolatile memory 4M2, a voltage output from the 4-bit first memory device 4M with the application of 0 V to the common gate GC will now be referred to as a sixth output voltage. Here, the third through sixth output voltages are respectively different at any one of the third through sixth input voltages.

Therefore, directly after the voltage applied to the common gate GC reaches the third, fourth, fifth, or sixth input voltage, when a voltage of 0 V is applied to the common gate GC, the voltage comparing circuit VCP1 perceives the third, fourth, fifth, or sixth output voltage of the 4-bit first memory device 4M so that bit data written in the second nonvolatile memory 4M2 can be read.

The third through sixth output voltages are applied to the voltage comparing circuit VCP1. Since the third through sixth output voltages depend on bit data written in the first nonvolatile memory 4M1, the voltage comparing circuit VCP1 analyzes the encoded signal output from the first encoder EC1 and recognizes the relation between the bit data state of the first nonvolatile memory 4M1 and the third, fourth, fifth, or sixth output voltage.

For example, when the first encoder EC1 applies an encoding signal, i.e., "11", to the voltage comparing circuit VCP1 and the 4-bit first memory device 4M outputs the third output voltage to the voltage comparing circuit VCP1, the voltage comparing circuit VCP1 analyzes the encoding signal, i.e., 11, applied from the first encoder EC1 and decides that the third output voltage may be output from the 4-bit first memory device 4M with an application of 0 V to the common gate GC directly after the third input voltage is applied to the common gate GC. Based on the decision result, the voltage comparing circuit VCP1 calculates a ratio of the third output voltage to the third input voltage and decides that the third output voltage may be output from the 4-bit first memory device 4M with the application of 0 V to the common gate GC when bit data "11" may be written in the first nonvolatile memory 4M1 and bit data "11" may be written in the second nonvolatile memory 4M2. Consequently, when the third output voltage may be applied from the 4-bit first memory device 4M, the voltage comparing circuit VCP1 decides that bit data "11" may be written in the second nonvolatile memory 4M2. Then, the voltage comparing circuit VCP1 analyzes the encoding signal "11" output from the first encoder EC1 and decides that bit data "11" may be written in the first nonvolatile memory 4M1. Thus, the voltage comparing circuit VCP1 decides that multi-bit data "1111" may be written in the 4-bit first memory device 4M and outputs "1111". The contents described in the voltage comparing circuit VCP1 are numerical expressions of decisions of the voltage comparing circuit VCP1.

For instance, 2.5/5=>"1111" shows that when the third output voltage may be 2.5 V and the third input voltage may be 5 V, it may be decided that multi-bit data "1111" may be written in the 4-bit first memory device 4M.

As described above, while any one of the third through sixth input voltages may be applied to the common gate GC, the supply of power from the power supply Vs may be automatically cut off by the first pass transistor PT1. At the same time, the transistor T applies a voltage of 0 V to the common gate GC. Thus, the 4-bit first memory device 4M outputs a voltage. This output voltage contains information on the 2-bit data written in the second nonvolatile memory 4M2. Accordingly, since bit data written in the second nonvolatile memory 4M2 can be known by measuring a voltage output from the first memory device 4M with the application of 0 V to the common gate GC, any additional operation for reading the bit data written in the second nonvolatile memory 4M2 is not required. For this reason, time taken for a read operation of the nonvolatile memory device of the present invention can be shortened.

There may be a voltage curve between the first and second nonvolatile memories 4M1 and 4M2, which may be similar to the voltage curve shown in FIG. 21 obtained based on the complementary action between the first and second nonvolatile memories M1 and M2 of the first memory device M, but the voltage curve is not shown here as a matter of convenience.

Figure 24:
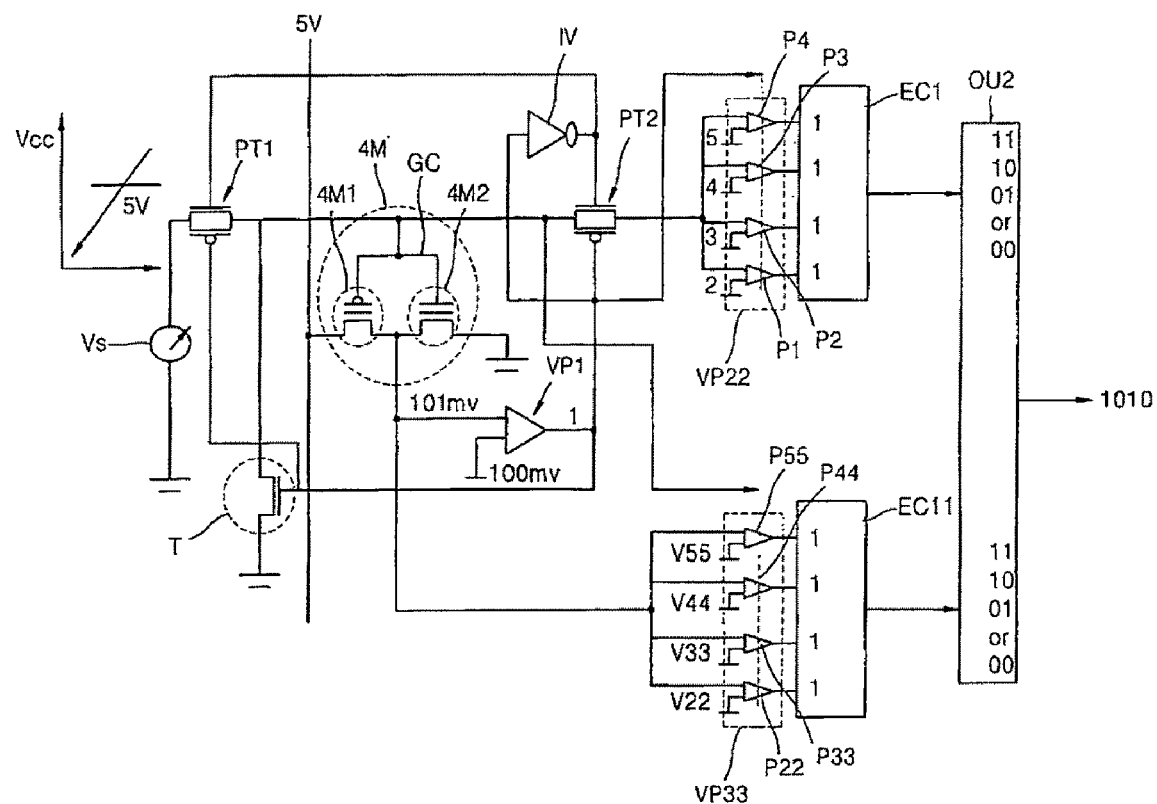

Meanwhile, the circuit shown in FIG. 23 can be modified into other circuits having the same function. For example, in the circuit shown in FIG. 23, a first unit, which reads only bit data written in the second nonvolatile memory 4M2, and a second unit, which combines an output signal of the first encoder EC1 and an output signal of the first unit and outputs multi-bit data written in the 4-bit first memory device 4M, can be used instead of the voltage comparing circuit VCP1. FIG. 24 shows an example of a circuit including the first unit and the second unit.

Referring to FIG. 24, a third voltage comparator VP33 may be connected to an output terminal of a 4-bit first memory device 4M. The third voltage comparator VP33 includes $1^{st}$ through $4^{th}$ comparators P22, P33, P44, and P55. The $1^{st}$ through $4^{th}$ comparators P22, P33, P44, and P55 operate only when a voltage of 0 V is applied to the third voltage comparator VP33. The third voltage comparator VP33 may be connected between the first and second pass transistors PT1 and PT2 so that the $1^{st}$ and $4^{th}$ comparators P22, P33, P44, and P55 can operate whenever the voltage of 0 V is applied to the common gate GC.

$1^{st}$ through $4^{th}$ reference voltages V22, V33, V44, and V55 are respectively applied to the $1^{st}$ through $4^{th}$ comparators P22, P33, P44, and P55 of the third voltage comparator VP33.

The 1st through 4th reference voltages V22, V33, V44, and V55 are determined considering the third through sixth output voltages.

That is, when bit data written in the second nonvolatile memory 4M2 is "00", the first reference voltage V22 may be equal to the sixth output voltage output from the 4-bit first memory device 4M with the application of 0 V to the common gate GC.

When bit data written in the second nonvolatile memory 4M2 is "01", the second reference voltage V33 may be equal to or lower than the fifth output voltage output from the 4-bit first memory device 4M with the application of 0 V to the common gate GC. However, the second reference voltage V33 may be higher than the sixth output voltage.

When bit data written in the second nonvolatile memory 4M2 is "10", the third reference voltage V44 may be equal to or lower than the fourth output voltage output from the 4-bit first memory device with the application of 0 V to the common gate GC. However, the third reference voltage V44 may be higher than the fifth output voltage.

When bit data written in the second nonvolatile memory 4M2 is "11", the fourth reference voltage V55 may be equal to or lower than the third output voltage output from the 4-bit first memory device 4M with the application of 0 V to the common gate GC. However, the fourth reference voltage V55 may be higher than the fourth output voltage.

As the 1st through 4th reference voltages V22, V33, V44, and V55 are respectively applied to the 1st through 4th comparators P22, P33, P44, and P55, if the third output voltage is applied from the output terminal of the 4-bit first memory device 4M to the third voltage comparator VP33, the 1st through 4th comparators P22, P33, P44, and P55 each output a signal corresponding to "1". Thus, a signal corresponding to "1111" is input to the second encoder EC11. If the fourth output voltage is applied to the third voltage comparator VP33, while the 1st through 3rd comparators P22, P33, and P44 each output a signal corresponding to "1", the fourth comparator P44 outputs a signal corresponding to "0". Thus, a signal corresponding to "0111" is input to the second encoder EC11. If the fifth output voltage is applied to the third voltage comparator VP33, while the first and second comparators P22 and P33 each output a signal corresponding to "1", the third and fourth comparators P44 and P55 each output a signal corresponding to "0". Thus, a signal corresponding to "0011" is input to the second encoder EC11. If the sixth output voltage is applied to the third voltage comparator VP33, while the second through fourth comparators P33, P44, and P55 each output a signal corresponding to "0", the first comparator P22 outputs a signal corresponding to "1". Thus, a signal corresponding to "0001" is input to the second encoder EC11.

As described above, the signal corresponding to "1111", "0111", "0011", or "0001" is input from the third voltage comparator VP33, the second encoder EC11 encodes the input signal to bit data "11", "10", "01", or "00" according to the rules and transmits the bit data to the third encoder OU2.

The third encoder OU2 may be connected to the first and second encoders EC1 and EC11. The third encoder OU2 not only receives the bit data "11", "10", "01", or "00" from the second encoder EC11 but also receives bit data "11", "10", "01" or "00" from the first encoder EC1. The bit data received from the first encoder EC1 may be bit data written in the first nonvolatile memory 4M1 of the 4-bit first memory device 4M, and the bit data received form the second encoder EC11 may be bit data written in the second nonvolatile memory 4M2 thereof. The third encoder OU2 combines the bit data received from the first encoder EC1 and the bit data received from the second encoder EC11 and outputs 4-bit data written in the 4-bit first memory device 4M. In the 4-bit data output from the third encoder OU2, the first two bits are received from the first encoder EC1, and the last two bits are received from the second encoder EC11.

In the 4-bit first memory device 4M, since the first and second nonvolatile memories 4M1 and 4M2 are arbitrarily selected, the construction of the 4-bit data may differ from the above description.

Figure 25:
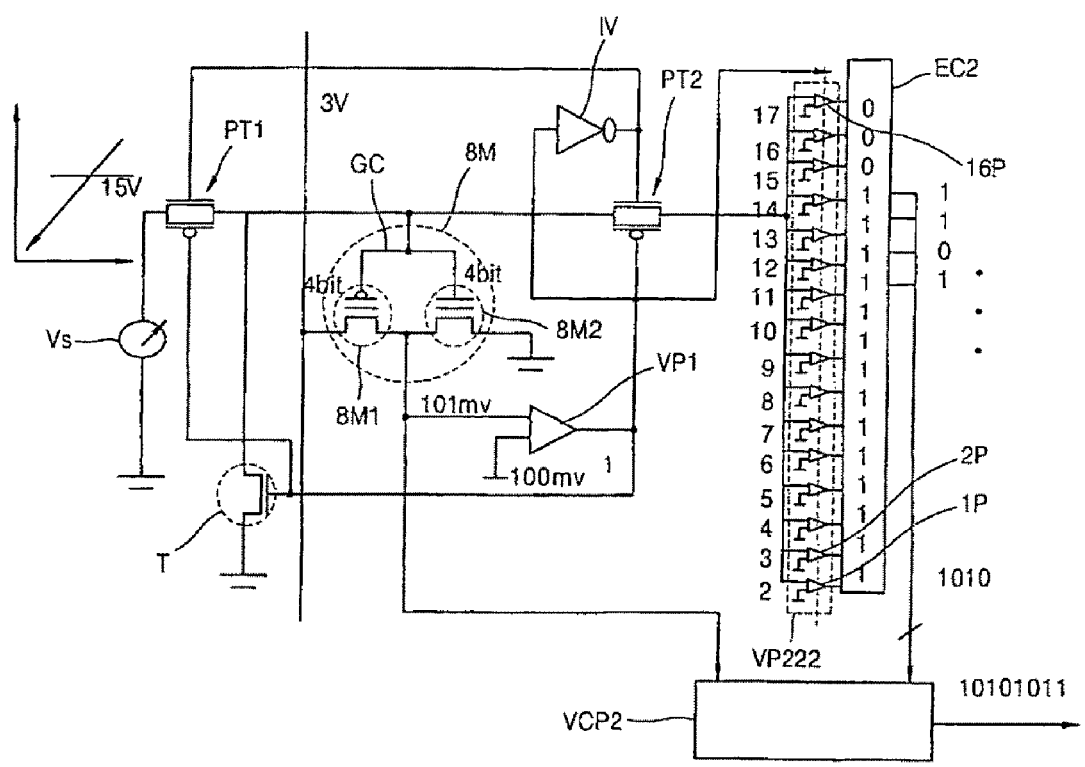
FIGS. 25 and 26 illustrate circuit diagrams for read operations when the nonvolatile memory devices shown in FIGS. 1 through 6 are 8-bit memory devices.

FIG. 25 is a circuit diagram showing a read operation of an 8-bit first memory device 8M including a 4-bit first nonvolatile memory 8M1 and a 4-bit second nonvolatile memory 8M2.

The construction of a reading circuit of the 8-bit first memory device shown in FIG. 25 may be the same as the construction of the reading circuit of the 2-bit first memory device M shown in FIG. 19 or the reading circuit of the 4-bit first memory device 4M except for applied voltages and the number of comparators included in voltage comparators.

In FIG. 25, the same reference numerals are used to denote the same elements as in the circuit shown in FIG. 19, and a description thereof will not be repeated here.

Referring to FIG. 25, a second voltage comparator VP222 may be connected to the second pass transistor PT2, and a first encoder EC2 may be connected to the second voltage comparator VP22. A voltage comparing circuit VCP2 may be connected to an output terminal of the 8-bit first memory device 8M and the first encoder EC2. The second voltage comparator VP222 includes 1st through 16th comparators 1P, 2P, ..., and 16P. Each of the 1st through 16th comparators 1P, 2P, ..., and 16P has two input terminals. One input terminal of each of the 1st through 16th comparators 1P, 2P, ..., and 16P may be commonly connected to the second pass transistor PT2, and reference voltages are applied to the other input terminals thereof.

While a voltage applied from a power supply Vs to the common gate GC of the 8-bit first memory device 8M is being linearly lowered, when the applied voltage becomes 1st through 16th input voltages, the 8-bit first memory device 8M starts to be enabled. That is, among the 1st through 16th input voltages, the 8-bit first memory device 8M outputs a voltage, e.g., 101 mV, higher than the reference voltage applied to a first voltage comparator VP1, i.e., 100 mV. Thus, the first voltage comparator VP1 operates whenever the 1st through 16th input voltages are applied to the 8-bit first memory device 8M. The 1st through 16th input voltages contain information on 4-bit data written in the first nonvolatile memory 8M1. Accordingly, by sensing which of the 1st through 16th input voltages the first voltage comparators VP1 operates at, the 4-bit data written in the first nonvolatile memory 8M1 can be read. On inputting any one of the 1st through 16th input voltages to the common gate GC, the supply of power from the power supply Vs may be cut off, and the input voltage applied to the common gate GC may be applied to the second voltage comparator VP222. At the same time, the first voltage comparator VP1 outputs a signal corresponding to "1" to the second voltage comparator VP222 so that the 1st through 16th comparators 1P, 2P, ..., and 16P of the second voltage comparator VP222 each compare the input voltage input thereto with the reference voltage and outputs the comparison result to the first encoder EC2. 1st through 16th reference voltages are applied to the 1st through 16th comparators 1P, 2P, ..., and 16P, respectively. The 1st through 16th reference voltages are the sixteenth through first input voltages applied to the common gate GC of the 8-bit first memory device 8M, respectively. Since the 1st through 16th input voltages are respectively different, the 1st through 16th reference voltages are also respectively different. Accordingly, sixteen signals output from the second voltage comparator VP222 in response to the $1^{st}$ through $16^{th}$ input voltages are respectively different.

For example, once the fifth input voltage, e.g., 13 V, is applied to the second voltage comparator VP222, the fifth input voltage may be input to all the $1^{st}$ through $16^{th}$ comparators 1P, 2P, ..., and 16P at the same time and compared with the reference voltages applied to the respective comparators 1P, 2P, ..., and 16P. As a result, the first comparator 1P to which a reference voltage of 2 V is applied through the twelfth comparator 12P to which a reference voltage of 13 V is applied each output a signal corresponding to "1", while the thirteenth through sixteenth comparators 13P, 14P, 15P, and 16P, to each of which a reference voltage higher than 13 V may be applied, each output a signal corresponding to "0". Thus, the second voltage comparator VP222 outputs a signal corresponding to "0000111111111111". Once the first input voltage, for example, 17 V, is input to the second voltage comparator VP222, the second voltage comparator VP222 outputs a signal corresponding to "1111111111111111" through the same process.

As described above, since the second voltage comparator VP222 outputs 16 signals each of which has 16 bits corresponding to sixteen data states of the 4-bit first nonvolatile memory 8M1, design rules can be determined such that the 16 signals output from the second voltage comparator VP222 correspond one-to-one to the sixteen data states of the 4-bit first nonvolatile memory 8M1.

According to the design rules, the first encoder EC2 encodes the 16-bit signal input from the second voltage comparator VP222 to one of sixteen multi-bit data ("0000", "0001", ..., and "1111") that can be written in the 4-bit first nonvolatile memory 8M1 and outputs a signal corresponding to the encoded multi-bit data to the voltage comparing circuit VCP2. For example, when a signal corresponding to "1111111111111111" is input to the second voltage comparator VP222, the second voltage comparator VP222 encodes the signal to "1111" and a signal corresponding to "1111" to the voltage comparing circuit VCP2.

A signal input from the second voltage comparator VP222 to the first encoder EC2, for example, a signal corresponding to "1111111111111111", depends on the input voltage applied to the second voltage comparator VP222. Therefore, a signal output from the first encoder EC2 to the voltage comparing circuit VCP2 also depends on the input voltage applied to the second voltage comparator VP222. In other words, the output signal of the first encoder EC2 contains information on the input voltage applied to the second voltage comparator VP222. Accordingly, the voltage comparing circuit VCP2 can determine the input voltage applied to the second voltage comparator VCP2, i.e., the input voltage applied to the common gate GC, based on the signal input from the first encoder EC2. Because the input voltage applied to the common gate GC depends on multi-bit data written in the 4-bit first nonvolatile memory 8M1, by determining which of the $1^{st}$ through $16^{th}$ input voltages may be applied to the common gate GC, multi-bit data written in the 4-bit first nonvolatile memory 8M1 can be read.

Figure 27:
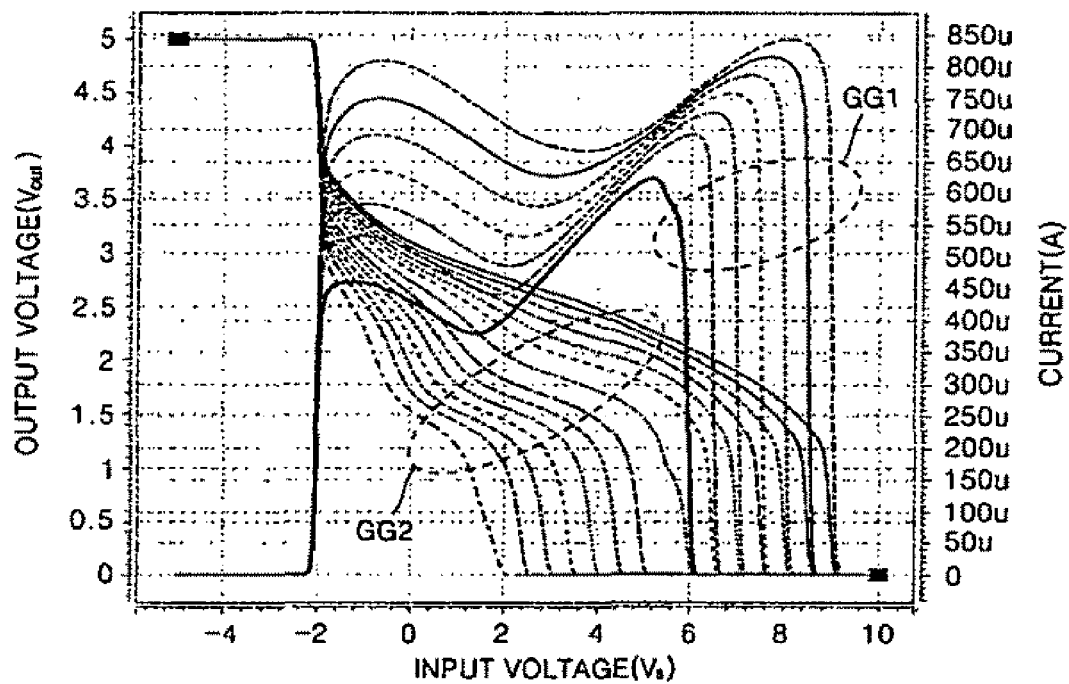
FIG. 27 illustrates a graph of voltage versus current and input voltage versus output voltage when the nonvolatile memory devices shown in FIGS. 1 through 6 are 8-bit memory devices.

The 8-bit first memory device 8M has a voltage curve as shown in FIG. 27, similar to the voltage curve of the 2-bit first memory device M shown in FIG. 21.

In FIG. 27, a first group GG1 of curves show current-voltage (I-V) characteristics of the 8-bit first memory device 8M, while a second group GG2 of curves show voltage characteristics, i.e., output voltages versus applied voltages.

Like the respective curves of the first group GG1, the respective curves of the second group GG2 are related to multi-bit data that can be written in the 8-bit first memory device 8M. Accordingly, multi-bit data written in the 8-bit first memory device 8M can be read using the second group GG2 of curves.

Referring to the second group GG2, it can be observed that the curves start from respectively different voltages and have respectively different output voltages at a voltage of 0 V. In the second group GG2, the starting of the respective curves of the second group GG2 means activation of the 8-bit first memory device 8M. Thus, it can be inferred that the voltages at which the respective curves of the second group GG2 start are the $1^{st}$ through $14^{th}$ input voltages applied to the common gate GC of the 8-bit first memory device 8M. Curves related to the fifteenth and sixteenth input voltages are omitted as a matter of convenience.

In the 8-bit first memory device 8M including the reading circuit shown in FIG. 25, when the voltage applied to the common gate GC of the 8-bit first memory device 8M becomes one of the $1^{st}$ through $16^{th}$ input voltages, one curve may be selected from the second group GG2 of curves shown in FIG. 27.

When one curve is selected from the second group GG2, a value obtained at a voltage of 0 V of the selected curve, i.e., an output voltage, is determined. The value obtained at 0 V of the selected curve may be a voltage, which may be output from the 8-bit first memory device 8M when a voltage of 0 V is applied to the common gate GC of the 8-bit first memory device 8M after a voltage applied from the power supply Vs to the common gate GC may be cut off as the voltage applied to the common gate GC becomes one of the $1^{st}$ through $16^{th}$ input voltages. When the voltage of 0 V is applied to the common gate GC, the output voltage depends on 16 multi-bit data that can be written in the 4-bit second nonvolatile memory 8M2. Accordingly, when 0 V is applied to the common gate GC, multi-bit data written in the 4-bit second nonvolatile memory 4M2 can be known from the output voltage measured at an output terminal of the 8-bit first memory device 8M. The output voltage may be applied to the voltage comparing circuit VCP2.

Like the voltage comparing circuit VCP1 of the reading circuit (refer to FIG. 23) of the 4-bit first memory device 4M, the voltage comparing circuit VCP2 determines which of sixteen multi-bit data that can be written in the 4-bit first nonvolatile memory 8M2 the output voltage corresponds to. That is, the voltage comparing circuit VCP2 reads multi-bit data written in the 4-bit first nonvolatile memory 8M2.

The voltage comparing circuit VCP2 reads 4-bit data, "1111", "1110", ..., or "0000" written in the 4-bit first nonvolatile memory 8M1 based on the signal output from the first encoder EC2. Then, when a voltage of 0 V is applied to the common gate GC, the voltage comparing circuit VCP2 reads 4-bit multi-bit data written in the 4-bit second nonvolatile memory 8M2 based on the output voltage of the 4-bit first memory device 8M. Thereafter, the voltage comparing circuit VCP2 combines the read 4-bit multi-bit data and outputs 8-bit data written in the 8-bit first memory device 8M, e.g., "10101011".

Meanwhile, the circuit shown in FIG. 25 can be modified into other circuits having the same function. For example, in the circuit shown in FIG. 25, a first unit, which reads multi-bit data written in the second nonvolatile memory 8M2, and a second unit, which combines multi-bit data written in the first and second nonvolatile memories 8M1 and 8M2, and outputs multi-bit data written in the 8-bit first memory device 8M, can be used instead of the voltage comparing circuit VCP2.

Figure 26:
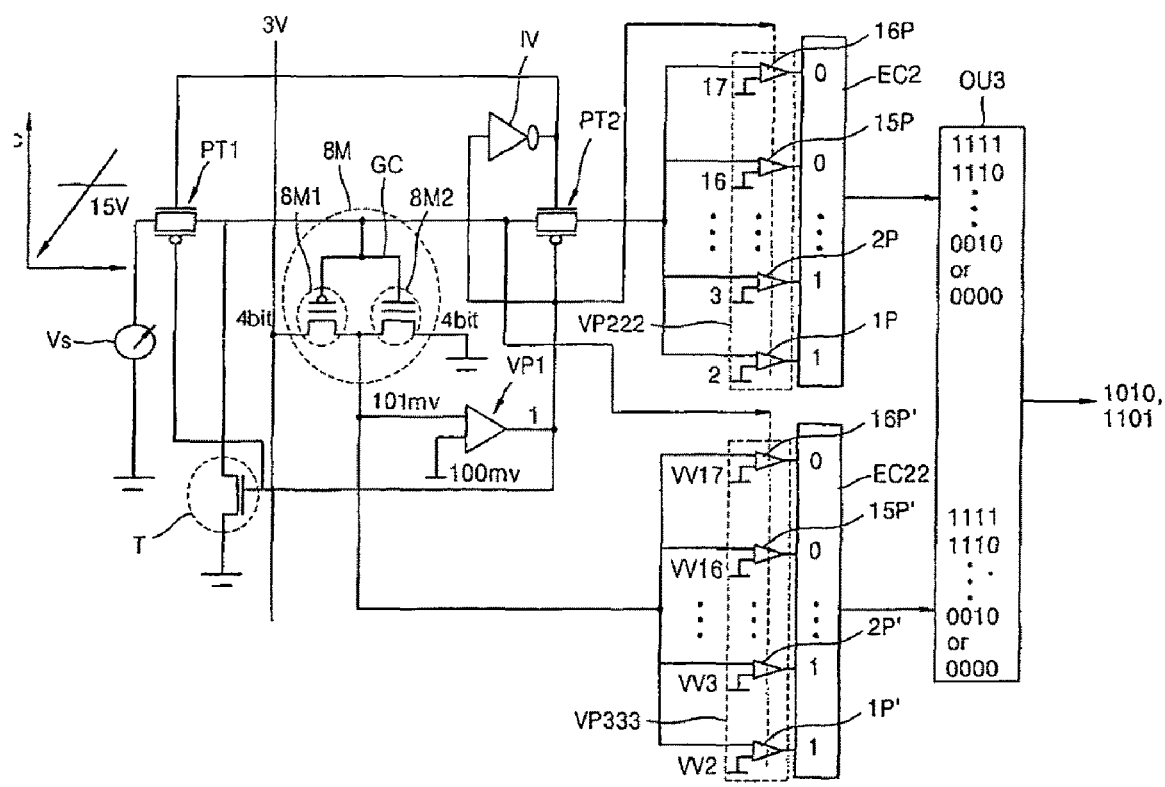

FIG. 26 shows an example of a circuit including the first unit and the second unit. The circuit of FIG. 26 will be described now, but a description of the same portions as in the circuit of FIG. 25 will be omitted.

Referring to FIG. 26, a third voltage comparator VP333 may be connected to an output terminal of an 8-bit first memory device 8M. A second encoder EC22 may be connected to the third voltage comparator VP333. The third encoder OU3 may be connected to the first encoder EC2 and a second encoder EC22.

The third voltage comparator VP333 may be one of units of reading multi-bit data written in the 4-bit first nonvolatile memory 8M2, and operates at a voltage of 0 V. The third voltage comparator VP333 may be connected between a first pass transistor PT1 and a second pass transistor PT2. The third voltage comparator VP333 includes $17^{th}$ through $32^{nd}$ comparators 1P', 2P', ..., and 16P'. The $17^{th}$ through $32^{nd}$ comparators 1P', 2P', ..., and 16P' read 4-bit data written in the 4-bit second nonvolatile memory 8M2 in the same manner as the $1^{st}$ through $16^{th}$ comparators 1P, 2P, ..., and 16P of the second voltage comparator VP222, which read 4-bit multi-bit data written in the 4-bit first nonvolatile memory 8M1.

$17^{th}$ through $32^{nd}$ reference voltages VV2, VV3, ..., and VV17 are applied to the $17^{th}$ through $32^{nd}$ comparators 1P', 2P', ..., and 16P', respectively. The $17^{th}$ through $32^{nd}$ reference voltages VV2, VV3, ..., and VV17 are determined considering sixteen multi-bit data that can be written in the 4-bit second nonvolatile memory 8M2. The sixteen multi-bit data that can be written in the 4-bit second nonvolatile memory 8M2 are directly related to $1^{st}$ through $16^{th}$ output voltages output from the 8-bit first memory device 8M when a voltage of 0 V is applied to the common gate GC after a voltage applied to the common gate GC becomes a $1^{st}$, $2^{nd}$, ..., or $16^{th}$ input voltage. Therefore, the $17^{th}$ through $32^{nd}$ reference voltages VV2, VV3, ..., and VV17 are preferably determined considering the $1^{st}$ through $16^{th}$ output voltages. The $1^{st}$ through $16^{th}$ output voltages may have gradually reduced values, respectively. Thus, the $1^{st}$ output voltage may be the highest, and the $16^{th}$ output voltage may be the lowest.

The $17^{th}$ reference voltage VV2 may be equal to the $16^{th}$ output voltage, which may be lowest among the $1^{st}$ through $16^{th}$ output voltages. The $18^{th}$ reference voltage VV3 may be equal to or lower than the $15^{th}$ output voltage and higher than the $16^{th}$ output voltage. The $19^{th}$ reference voltage VV4 may be higher than the $15^{th}$ output voltage and lower than or equal to the $14^{th}$ output voltage. The $20^{th}$ reference voltage VV5 may be higher than the $14^{th}$ output voltage and lower than or equal to the $13^{th}$ output voltage VV6. The $21^{st}$ reference voltage VV6 may be higher than the $13^{th}$ output voltage and lower than or equal to the $12^{th}$ output voltage. The $22^{nd}$ reference voltage VV7 may be higher than the $12^{th}$ output voltage and lower than or equal to the $11^{th}$ output voltage. The $23^{rd}$ reference voltage VV8 may be higher than the $11^{th}$ output voltage and lower than or equal to the $10^{th}$ output voltage. The $24^{th}$ reference voltage VV9 may be higher than the $10^{th}$ output voltage and lower than or equal to the $9^{th}$ output voltage. The $25^{th}$ reference voltage VV10 may be higher than the $9^{th}$ output voltage and lower than or equal to the $8^{th}$ output voltage. The $26^{th}$ reference voltage VV11 may be higher than the $8^{th}$ output voltage and lower than or equal to the $7^{th}$ output voltage. The $27^{th}$ reference voltage VV12 may be higher than the $7^{th}$ output voltage and lower than or equal to the $6^{th}$ output voltage. The $28^{th}$ reference voltage VV13 may be higher than the $6^{th}$ output voltage and lower than or equal to the $5^{th}$ output voltage. The $29^{th}$ reference voltage VV14 may be higher than the $5^{th}$ output voltage and lower than or equal to the $4^{th}$ output voltage. The $30^{th}$ reference voltage VV15 may be higher than the $4^{th}$ output voltage and lower than or equal to the $3^{rd}$ output voltage. The $31^{st}$ reference voltage VV16 may be higher than the $3^{rd}$ output voltage and lower than or equal to the $2^{nd}$ output voltage. The $32^{nd}$ reference voltage VV17 may be higher than the $2^{nd}$ output voltage and lower than or equal to the $1^{st}$ output voltage.

Therefore, when the $1^{st}$, $2^{nd}$, ..., or $16^{th}$ output voltage may be applied to the third voltage comparator VP333, sixteen 16-bit signals output from the third voltage comparator VP333 are respectively different. Accordingly, the sixteen multi-bit data that can be written in the 4-bit second nonvolatile memory 8M2 can correspond one-to-one to the sixteen 16-bit signals. Thus, by analyzing a signal output from the third voltage comparator VP333, i.e., a 16-bit signal, 4-bit multi-bit data written in the 4-bit second nonvolatile memory 8M2 can be read.

For example, assuming that three 16-bit signals among the sixteen 16-bit signals output from the third voltage comparator VP333 are "1111111111111111", "0111111111111111", and "0011111111111111" and 3 multi-bit data corresponding to the three 16-bit signals among the sixteen multi-bit data that can be written in the 4-bit second nonvolatile memory 8M2 are "1111", "1110", and "1101", when a 16-bit signal output from the third voltage comparator VP333 is "0111111111111111", it can be known that 4-bit multi-bit data "1110" is read from the 4-bit second nonvolatile memory 8M2.

The second encoder EC22 encodes a 16-bit signal output from the third voltage comparator VP333 and outputs 4-bit data corresponding to the signal.

The third encoder OU3 combines 4-bit data input from the first encoder EC2 and 4-bit data input from the second encoder EC22 and outputs 8-bit data. The 8-bit data output from the third encoder OU3 may be multi-bit data written in the 8-bit first memory device 8M.

A logic device including the foregoing first memory device (M, 4M, or 8M) according to the present invention will now be described.

<A NAND Type Logic Device>

Figure 28:
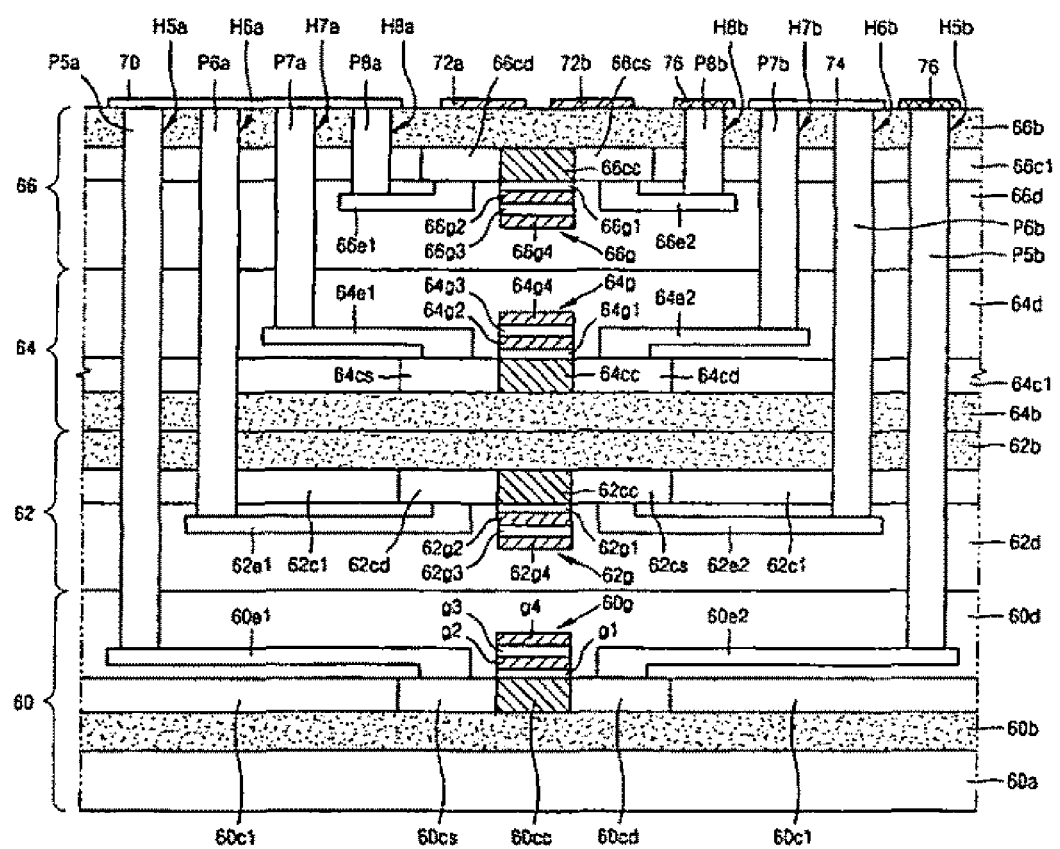
FIG. 28 illustrates a cross-sectional view of a NAND type logic device including one of the nonvolatile memory devices shown in FIGS. 1 through 6.

Referring to FIG. 28, a NAND type logic device according to an embodiment of the present invention (hereinafter, a NAND device of the present invention) includes an n-type first nonvolatile memory 60, a p-type first nonvolatile memory 62, a p-type second nonvolatile memory device 64, and an n-type second nonvolatile memory 66, which are sequentially stacked. The p-type first nonvolatile memory 62 and the n-type second nonvolatile memory 66 are turned over and stacked such that a gate stacked structure 62g of the p-type first nonvolatile memory faces a gate stacked structure 60g of the n-type first nonvolatile memory 60 and a gate stacked structure 64g of the p-type second nonvolatile memory 64 faces a gate stacked structure 66g of the n-type second nonvolatile memory 66.

The n-type first nonvolatile memory 60 includes a first substrate 60a, an insulating layer 60b disposed on the first substrate 60a, STI layers 60c1, a first impurity region 60cs, a second impurity region 60cd, and a channel region 60cc, which are disposed on the insulating layer 60b, the gate stacked structure 60g disposed on the channel region 60cc, and a first contact pad layer 60e1 and a second contact pad layer 60e2, which are connected to the first and second impurity regions 60c and 60cd, respectively, and extend over the STI layers 60c1. The channel region 60cc may be disposed between the first and second impurity regions 60cs and 60cd. The gate stacked structure 60g includes a first insulating layer g1, a data storage layer g2, a second insulating layer g3, and a control gate g4, which are sequentially stacked. The extending length of the first and second contact pad layers 60e1 and 60e2 over the STI layers 60c1 may be arbitrarily determined. However, as shown in FIG. 28, when contact pad layers 60e1, 60e2, 62e1, 62e2, 64e1, 64e2, 66e1, and 66e2 of the n-type first and second nonvolatile memories 60 and 66 and the p-type first and second nonvolatile memories 62 and 64 are disposed on the same vertical surface, an extending portion of each of the first and second contact pad layers 60e1 and 60e2 of the n-type first nonvolatile memory 60 may be longer than an extending portion of each of the contact pad layers 62e1, 62e2, 64e1, 64e2, 66e1, and 66e2 of the other nonvolatile memories 62, 64, and 66. If the first impurity region 60cs is a source region, the second impurity region 60cd is a drain region, and vice versa. The gate stacked structure 60g and the first and second contact pad layers 60e1 and 60e2 are covered by a first ILD 60d having a planar surface.

The p-type first nonvolatile memory 62 includes an insulating layer 62b, STI layers 62c1, a channel region 62cd, a first impurity region 62cd, a second impurity region 62cs, a first contact pad layer 62e1, a second contact pad layer 62e2, and a gate stacked structure 62g. The STI layers 62c1 and the channel region 62cc are disposed on one surface of the insulating layer 62b, which faces the n-type first nonvolatile memory 62b. The channel region 62cc may be disposed between the STI layers 62c1. The gate stacked structure 62g may be disposed on the channel region 62cc. The gate stacked structure 62g includes a first insulating layer 62g1, a data storage layer 62g2, a second insulating layer 62g3, and a control gate 62g4, which are sequentially stacked. The first and second contact pad layers 62e1 and 62e2 are connected to the first and second impurity regions 62cd and 62cs, respectively, and extend over the STI layers 62c1. As shown in FIG. 28, when tie first contact pad layers 60e1 and 62e1 and the second contact pad layers 60e2 and 62e2 of the n- and p-type first nonvolatile memories 60 and 62 are disposed on the same vertical surface, the extending length of the first and second contact pad layers 62e1 and 62e2 of the p-type first nonvolatile memory 62 over the STI layers 62c1 may be shorter than the extending length of the first and second contact pad layers 60e1 and 60e2 of the n-type first nonvolatile memory 60 over the STI layers 60c1. However, if the first and second contact pad layers 60e1 and 60e2 of the n-type first nonvolatile memory 60 are disposed on a different vertical surface than a vertical surface on which the first and second contact pad layers 62e1 and 62e2 of the p-type first nonvolatile memory 62 are disposed, the extending length of the first and second contact pad layers 62e1 and 62e2 of the p-type first nonvolatile memory 62 over the STI layers 62c1 may be arbitrarily determined. Therefore, the extending length of the first and second contact pad layers 62e1 and 62e2 may be equal to or shorter than the extending length of the first and second contact pad layers 60e1 and 60e2 disposed thereunder. The first and second contact pad layers 62e1 and 62e2 and the gate stacked structure 62g are covered by a second ILD 62d having a planar surface. The surface of the first ILD 60d may be bonded to the surface of the second ILD 62d.

The p-type second nonvolatile memory 64 includes an insulating layer 64b, a semiconductor substrate (not shown) disposed on the insulating layer 64b and including a channel region 64cc, a first impurity region 64cs, and a second impurity region 64cd, and a gate stacked structure 64g disposed on the channel region 64cc. The p-type second nonvolatile memory 64 further includes a first contact pad layer 64e1 and a second contact pad layer 64e2, which have one terminals connected to the first and second impurity regions 64cs and 64cd, respectively, and the other terminals extending over the STI layers 64c1, respectively. The first and second impurity regions 64cs and 64cd are doped with p-type conductive impurities having a predetermined concentration. The extending length of the first and second contact pad layers 64d1 and 64e2 over the STI layers 64c1 may be shorter than the extending length of the first and second contact pad layers 62e1 and 62e2 of the n-type first nonvolatile memory 62 over the STI layers 62c1. If the first and second contact pad layers 64e1 and 64e2 of the p-type second nonvolatile memory 64 are disposed on a different vertical surface than a vertical surface on which the first and second contact pad layers 62e1 and 62e2 of the n-type first nonvolatile memory 62, the extending length of the first and second contact pad layers 64e1 and 64e2 may be equal to or longer than the extending length of the first and second contact pad layers 62e1 and 62e2. The gate stacked structure 64g includes a first insulating layer 64g1, a data storage layer 64g2, a second insulating layer 64g3, and a contact gate 64g4, which are sequentially stacked. The first and second contact pad layers 64e1 and 64e2 and the gate stacked structure 64g are covered by a third interlayer dielectric 64d having a planar surface.

The n-type second nonvolatile memory 66 includes an insulating layer 66b. A semiconductor substrate (not shown) may be disposed on the insulating layer 66b and includes a channel region 66cc, a first impurity region 66cd, and a second impurity region 66cs. The first and second impurity regions 66cd and 66cs are doped with n-type conductive impurities having a predetermined concentration. STI layers 66c1 are disposed on the insulating layer 66b around the semiconductor substrate. A gate stacked structure 66g may be disposed on the channel region 66cc. The gate stacked structure 66g includes a first insulating layer 66g1 as a tunneling layer, a data storage layer 66g2, a second insulating layer 66g3, and a control gate 66g4, which are sequentially stacked. One terminals of the first and second contact pad layers 66e1 and 66e2 are connected to the first and second impurity regions 66cd and 66cs, respectively. The other terminals of the first and second contact pad layers 66e1 and 66e2 extend over adjacent STI layers 66c1. The extending length of the first and second contact pad layers 66e1 and 66e2 over the STI layers 66c1 may be shorter than the extending length of the first and second contact pad layers 64e1 and 64e2 of the p-type second nonvolatile memory 64 over the adjacent STI layers 64c1. Unlike shown in FIG. 28, if the first and second contact pad layers 66e1 and 66e2 of the n-type second nonvolatile memory 66 are disposed on a different vertical surface than a vertical surface on which the first and second contact pad layers 64e1 and 64e2 of the p-type second nonvolatile memory 64 are disposed, the extending length of the first and second contact pad layers 66e1 and 66e2 may be equal to or longer than the extending length of the first and second contact pad layers 64e1 and 64e2. The first and second contact pad layers 64e1 and 64e2 and the gate stacked structure 66g are covered by a fourth ILD 66d having a planar surface. The surface of the fourth ILD 66d may be bonded to the surface of the third ILD 64d.

A first via hole H5a and a second via hole H5b may be formed in a stacked structure (hereinafter, a first stacked structure) including the insulating layer 66b, the STI layers 66c1, and the fourth ILD 66d of the n-type second nonvolatile memory 66, the third ILD 64d, the STI layers 64c1, and the insulating layer 64b of the p-type second nonvolatile memory 64, the insulating layer 63b, the STI layers 62c1, and the second ILD 62d of the p-type first nonvolatile memory 62, and the first ILD 60d of the n-type first nonvolatile memory 60. The first and second via holes H5a and H5b may expose the first and second contact pad layers 60e1 and 60e2, respectively, and are filled with a first conductive plug P5a and a second conductive plug P5b, respectively. Also, a third via hole H6a and a fourth via hole H6b may be formed in a stacked structure (hereinafter, a second stacked structure) including the insulating layer 66b, the STI layers 66c1, and the fourth ILD 66d of the n-type second nonvolatile memory 66, the third ILD 64d, the STI layers 64c1, and the insulating layer 64d of the p-type second nonvolatile memory 64, and the insulating layer 62b, the STI layers 62c1, and the second ILD 62d of the p-type first nonvolatile memory 62. The third and fourth via holes H6a and H6b may expose the first and second contact pad layers 62e1 and 62e2, respectively, and may be filled with a third conductive plug P6a and a fourth conductive plug P6b, respectively. Also, a fifth via hole H7a and a sixth via hole H7b may be formed in a stacked structure (hereinafter, a third stacked structure) including the insulating layer 66b, the isolation layer 66c1, and the fourth ILD 66d of the n-type nonvolatile memory 66 and the third ILD 64d of the p-type second nonvolatile memory 64. The fifth and, sixth via holes H7a and H7b may expose the first and second contact pad layers 64e1 and 64e2, respectively, and may be filled with a fifth conductive plug P7a and P7b, respectively. Also, a seventh via hole H8a and an eighth via hole H8b may be formed in a stacked structure (hereinafter, a fourth stacked structure) including the insulating layer 66b, the STI layers 66c1, and the fourth ILD 66d of the n-type second nonvolatile memory 66. The seventh and eight via holes H8a and H8b may expose the first and second contact pad layers 66e1 and 66e2, respectively, and may be filled with a seventh conductive plug P8a and an eight conductive plug P8b, respectively. On the insulating layer 66b of the n-type second nonvolatile memory 66, a first pad layer 70, a second pad layer 74, and a third pad layer 76 are disposed. The first pad layer 70 connects the first, third, fifth, and seventh conductive plugs P5a, P6a, P7a, and P8a, and the second pad layer 74 connects the fourth and sixth conductive plugs P6b and P7b. Also, the third pad layer 76 connects the second and eight conductive plugs P5b and P8b. The third pad layer 76 may be disposed around the second pad layer 74. The second and third pad layers 74 and 76 are out of contact with each other.

A first gate pad layer 72a and a second gate pad layer 72b are disposed on the insulating layer 66b of the n-type second nonvolatile memory 66. The first and second gate pad layers 72a and 72b are out of contact with each other. The first gate pad layer 72a may be connected to the gate stacked structure 60g of the n-type first nonvolatile memory 60 and the gate stacked structure 62g of the p-type first nonvolatile memory 62. Also, the second gate pad layer 72b may be connected to the gate stacked structure 64g of the p-type second nonvolatile memory 64 and the gate stacked structure 66g of the n-type second nonvolatile memory 66.

Although not shown in FIG. 28, in order to connect the first gate pad layer 72a and the gate stacked structures 60g and 62g and connect the second gate pad layer 72b and the gate stacked structures 64g and 66g, a first gate via hole may be formed in the first stacked structure and exposes the control gate g4 of the gate stacked structure 60g of the n-type first nonvolatile memory 60. A second gate via hole may be formed in the second stacked structure and exposes the control gate 62g4 of the gate stacked structure 62g, a third gate via hole may be formed in the third stacked structure and exposes the control gate 64g4 of the gate stacked structure 64g, and a fourth gate via hole may be formed in the fourth stacked structure and exposes the control gate 66g4 of the gate stacked structure 66g. The $1^{st}$ through $4^{th}$ gate via holes are filled with $1^{st}$ through $4^{th}$ gate conductive plugs (not shown), respectively. The first and second gate conductive plugs are connected to the first gate pad layer 72a, and the third and fourth gate conductive plugs are connected to the second gate pad layer 72b. The $1^{st}$ through $4^{th}$ gate conductive plugs are out of contact with one another. Accordingly, it may be preferable that the gate stacked structures 60g, 62g, 64g, and 66g have respectively different lengths. For example, the gate stacked structure 60g may have the smallest length and the gate stacked structure 66g may have the greatest length.

Figure 29:
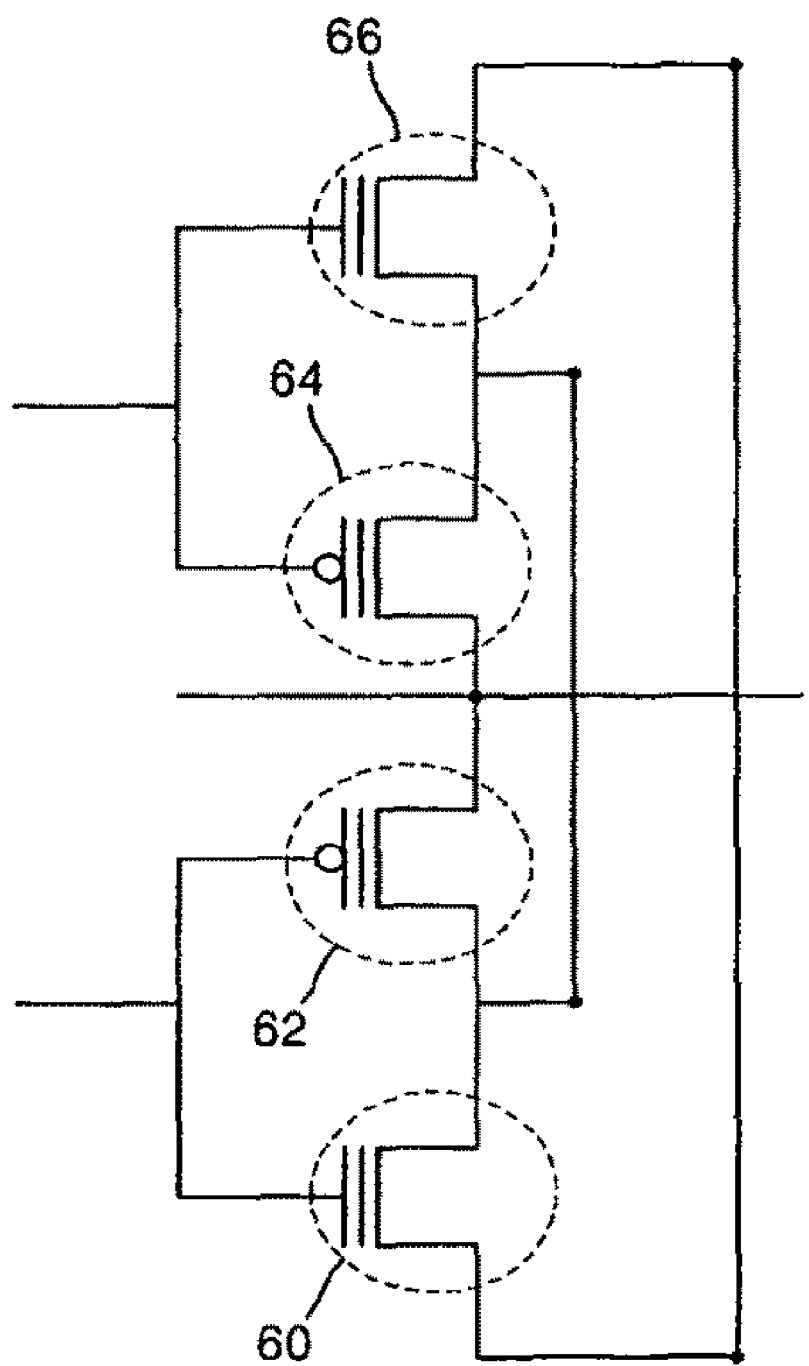
FIG. 29 illustrates an equivalent circuit of the NAND type logic device shown in FIG. 28.

FIG. 29 illustrates an equivalent circuit of the above-described NAND device.

<A NOR Type Logic Device>

Hereinafter, a NOR type logic device according to an embodiment of the present invention will be described with reference to FIG. 30, but a description of the same portions as in the NAND device shown in FIG. 28 will not be presented here. The same reference numerals are used to denote the same elements.

Figure 30:
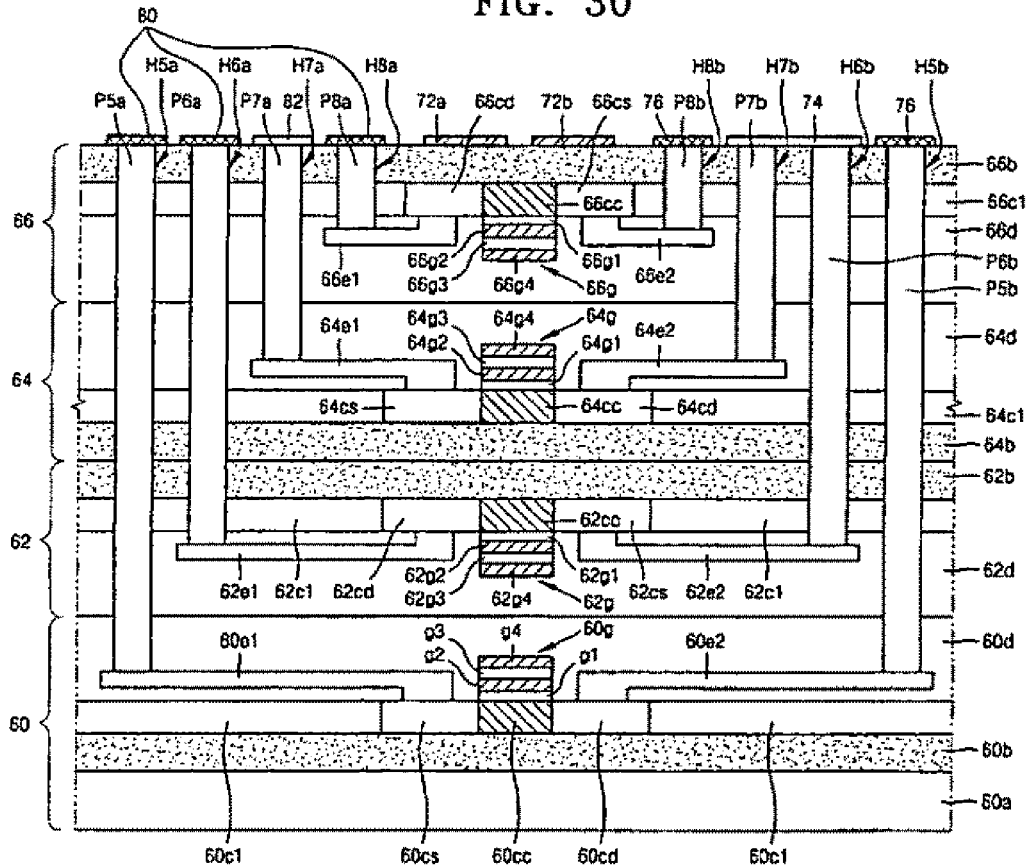
FIG. 30 illustrates a cross-sectional view of a NOR type logic device including one of the nonvolatile memory devices shown in FIGS. 1 through 6.

Referring to FIG. 30, like the NAND device, a NOR type logic device according to the embodiment of the present invention (hereinafter, a NOR device of the present invention) includes an n-type first nonvolatile memory 60; a p-type first nonvolatile memory 62, a p-type second nonvolatile memory 64, and an n-type second nonvolatile memory 66, which are sequentially stacked. Further, the NOR device includes $1^{st}$ through $8^{th}$ conductive plugs P5a, P5b, P6a, P6b, P7a, P7b, P8a, and P8b. A fourth pad layer 80 and a fifth pad layer 82 are disposed on the insulating layer 66b. The fourth pad layer 80 may be connected to the first, third, and seventh conductive plugs P5a, P6a, and P8a, and the fifth pad layer 82 may be connected to the fifth conductive plug P7a. The fourth pad layer 80 may be disposed out of contact with the fifth pad layer 82 around the fifth pad layer 82. The remaining structural characteristics of the NOR device are the same as those of the above-described NAND device.

Figure 31:
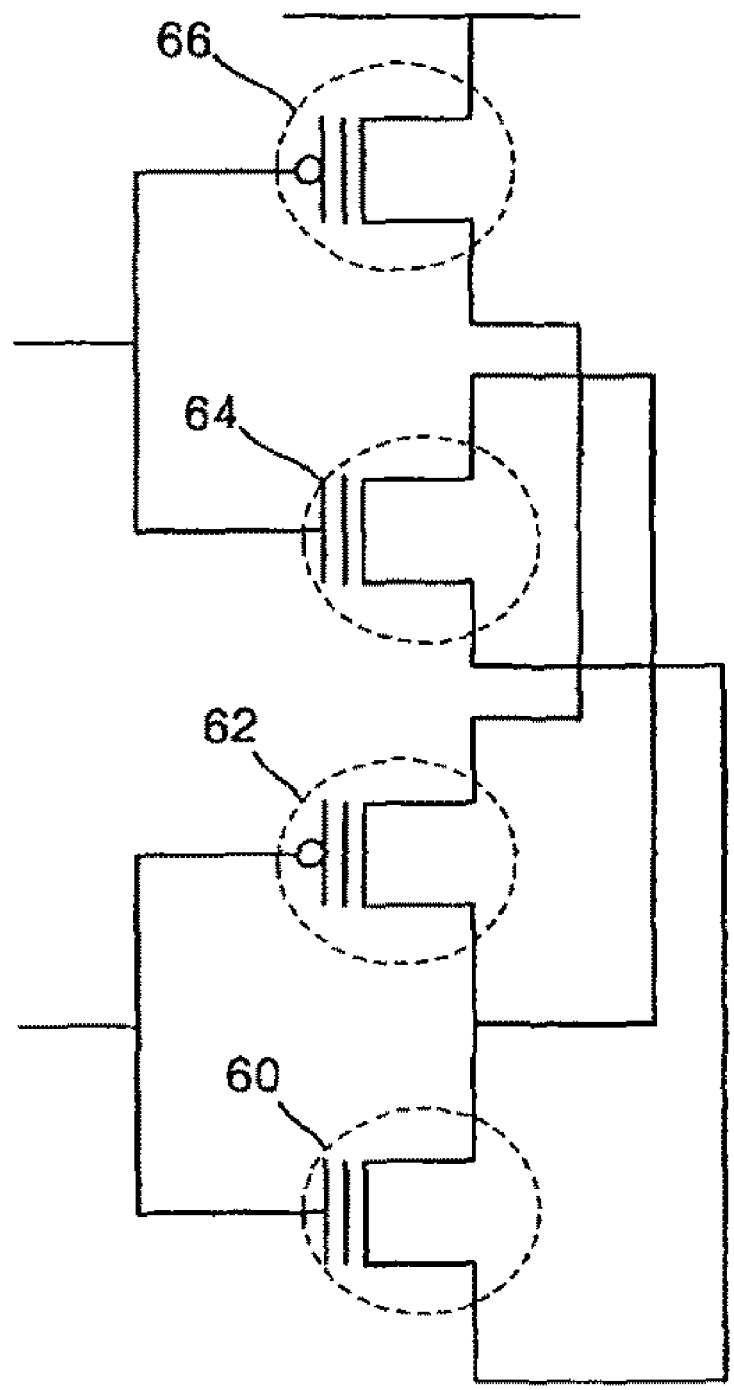
FIG. 31 illustrates an equivalent circuit of the NOR type logic device shown in FIG. 30.

FIG. 31 illustrates an equivalent circuit of the NOR device shown in FIG. 30.

In the NAND device and the NOR device shown in FIGS. 28 and 30, respectively, at least one of the first contact pad layers 60e1, 60e2, 64e1, and 64e1 and the second contact pad layers 60e2, 62e2, 64e2, 66e2 may have a different form.

For example, the first and second contact pad layers 60e1 and 60e2 may extend onto the STI layers 60b instead of being disposed apart from the STI layers 60b.

Also, the first and second contact pad layers 66e1 and 66e2 of the n-type second nonvolatile memory 66 may be removed. Instead, like the third and fourth conductive plugs PL33 and PL44 shown in FIG. 2, a via hole may be formed in the insulating layer 66b such that the first and second impurity regions 66cd and 66cs are exposed, and a conductive plug may be filled in the via hole.

<Method of Manufacture>

Hereinafter, a method of manufacturing the first memory device shown in FIG. 1 will be described with reference to FIGS. 32 through 40.

Figure 32:
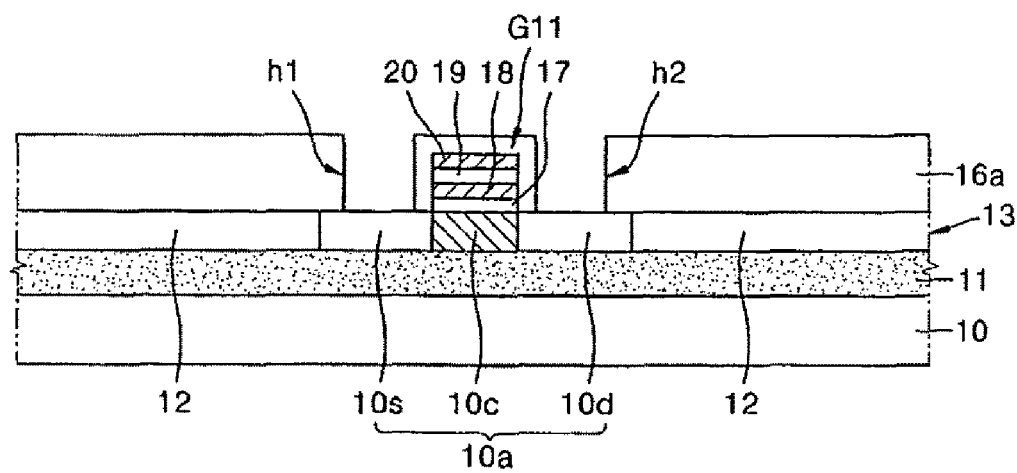
FIGS. 32 through 40 illustrate cross-sectional views of stages in a method of manufacturing the nonvolatile memory device shown in FIG. 1.

Referring to FIG. 32, the insulating layer 11 may be formed on the first semiconductor substrate 10. The first semiconductor substrate 10 may be an n-type <110> silicon substrate. STI layers 12 are formed at predetermined regions of the insulating layer 11. A semiconductor layer 10a may be formed on the insulating layer 11 between the STI layers 12. The first impurity region 10s and the second impurity region 10d are formed in the semiconductor layer 10a, and the channel region 10c may be formed between the first and second impurity regions 10s and 10d. The first and second impurity regions 10s and 10d are formed by implanting p-type conductive impurities having a predetermined concentration into a given region of the semiconductor layer 10a. One of the first and second impurity regions 10s and 10d serves as a source region, and the other serves as a drain region. The first gate stacked structure G11 may be formed on the channel region 10c. In order to form the first gate stacked structure G11, the first insulating layer 17, the data storage layer 18, the second insulating layer 19, and the control gate 20 are sequentially stacked on the entire surfaces of the semiconductor layer 10a and the STI layers 12 and patterned in reverse order in alignment with the channel region 10c. The first and second insulating layers 17 and 19 may be formed of silicon oxide ($SiO_2$) or other equivalent insulating materials. The data storage layer 18 may be a trapping layer in which predetermined carriers, for example, holes can be trapped, for example, a silicon nitride ($Si_3N_4$) layer or a high-k layer. The control gate 20 may be formed of polysilicon, but other conductive materials can be used. Holes trapped in the data storage layer 18 remain trapped until a predetermined emission voltage may be externally applied. That is, the data storage layer 18 remains nonvolatile until the emission voltage may be applied thereto.

After the first gate stacked structure G11 may be formed, the first ILD 16a may be formed on the semiconductor layer 10a and the STI layers 12 so as to cover the first gate stacked structure G11. Next, the first contact hole H1 and a second contact hole H2 are formed in a first ILD layer 16a and expose the first and second impurity regions 10s and 10d, respectively.

Figure 33:
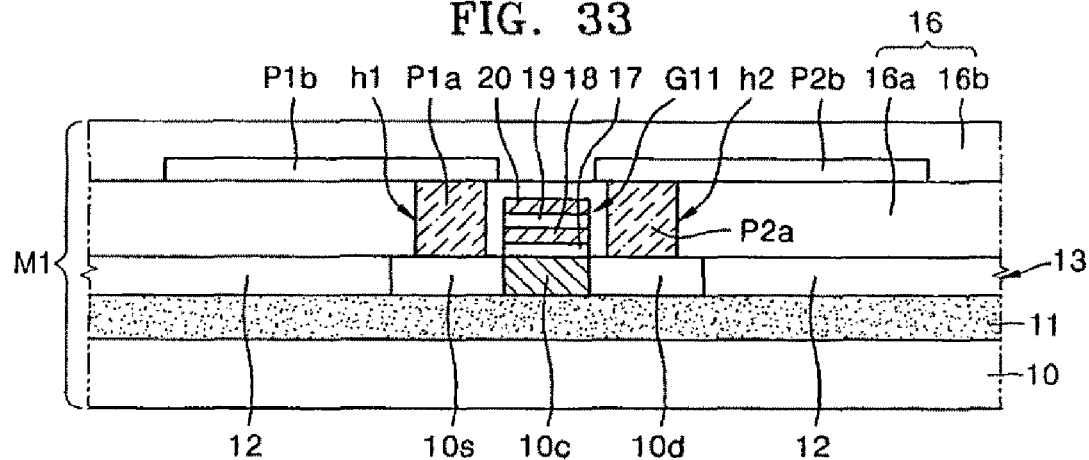

Thereafter, as shown in FIG. 33, the first and second contact holes H1 and H2 are filled with a first conductive plug P1a and a second conductive plug P2a, respectively. A first conductive layer P1b and a second conductive layer P2b are formed on the first ILD 16a such that they are connected to the first and second conductive plugs P1a and P2a, respectively. The first and second conductive layers P1b and P2b are used as pad layers. The first conductive plug P1a and the first conductive layer P1b corresponds to the first contact pad layer P1 shown in FIG. 1, and the second conductive plug P2a and the second conductive layer P2b corresponds to the second contact pad layer P2 shown in FIG. 1.

Thereafter, a second ILD layer 16b may be formed on the first ILD layer 16a so as to cover the first and second conductive layers P1b and P2b. A planarization process may be performed on the second ILD 16b so that the second ILD 16b can have a planar surface. As a result, the p-type first nonvolatile memory M1 shown in FIG. 1 is completed.

Figure 34:
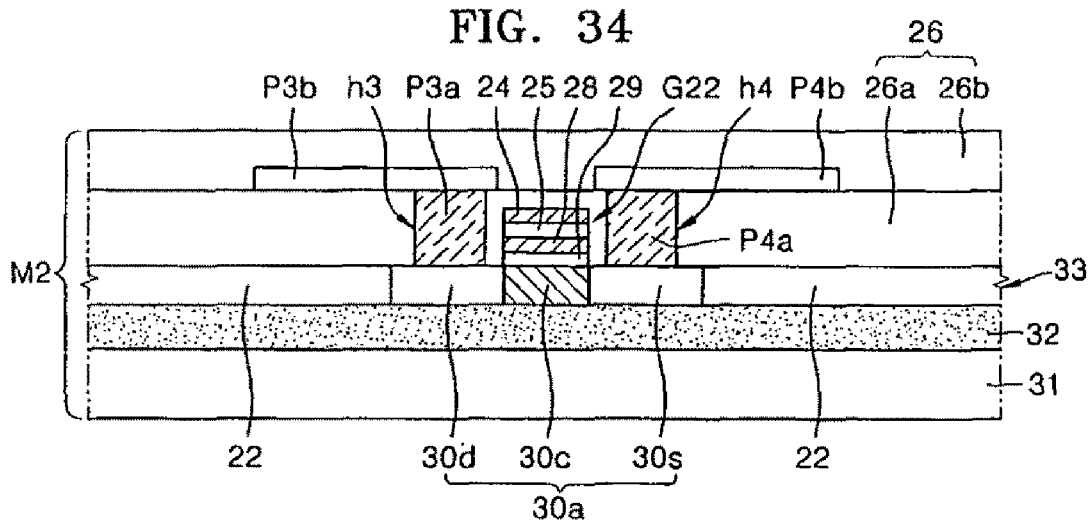

In order to form the n-type second nonvolatile memory M2 shown in FIG. 1, an insulating layer 32 may be formed on a substrate 31 as shown in FIG. 34. STI layers 22 are formed at predetermined regions of the insulating layer 32. A semiconductor layer 30a may be formed on the insulating layer 32 between the STI layers 22. The first impurity region 30d and the second impurity region 30s are formed in given regions of the semiconductor layer 30a. The channel region 30c may be formed in the semiconductor layer 30a between the first and second impurity regions 30d and 30s. The first and second impurity regions 30d and 30s may be formed by implanting n-type conductive impurities having a predetermined concentration into the given regions of the semiconductor layer 30a. One of the first and second impurity regions 30d and 30s serves as a source region, and the other serves as a drain region.

Next, the second gate stacked structure G22 may be formed on the channel region 30c. The second gate stacked structure G22 can be formed in the same method as the method of forming the first gate stacked structure G11. In this case, the data storage layer 28 of the second gate stacked structure G22 may be a trapping layer having predetermined trap sites in which predetermined carriers, for example, electrons, can be trapped. For example, the data storage layer 28 may be a silicon nitride layer, or may be other dielectric layer having trap sites in which electrons can be trapped, e.g., a high-k layer. Electrons trapped in the data storage layer 28 remain trapped until a predetermined emission voltage may be externally applied. That may be, the state remains unchanged until the emission voltage is applied.

After the second gate stacked structure G22 is formed, a first ILD layer 26a may be formed on the STI layers 22 and the semiconductor layer 30a so as to cover the second gate stacked structure G22. The first contact hole H3 and the second contact hole H4 are formed in the first ILD layer 26a and expose the first and second impurity regions 30d and 30s, respectively. Then, the first and second contact holes H3 and H4 may be filled with a first conductive plug P3a and a second conductive plug P4a, respectively. A first conductive layer P3b and a second conductive layer P4b are formed on the first ILD layer 26a so that they are connected to the first and second conductive plugs P3a and P4a, respectively.

The first and second conductive layers P3b and P4b are formed to predetermined lengths, preferably, to smaller lengths than the lengths of the first and second conductive layers P1b and P2b, respectively. However, if the first and second conductive layers P3b and P4b and the first of the n-type first nonvolatile memory M2 and the first and second conductive layers P1b and P2b of the p-type first nonvolatile memory M1 are not formed on the same vertical surface, the lengths of the first and second conductive layers P1b and P2b may be equal to or longer than those of the first and second conductive layers P3b and P4b, respectively.

A second ILD layer 26b maybe formed on the first ILD layer 26a so as to cover the first and second conductive layers P3b and P4b. A planarization process may be performed on the second ILD layer 26b so that the second ILD layer 26b can have a planar surface. As a result, the n-type second nonvolatile memory M2 shown in FIG. 1 is completed.

Figure 35:
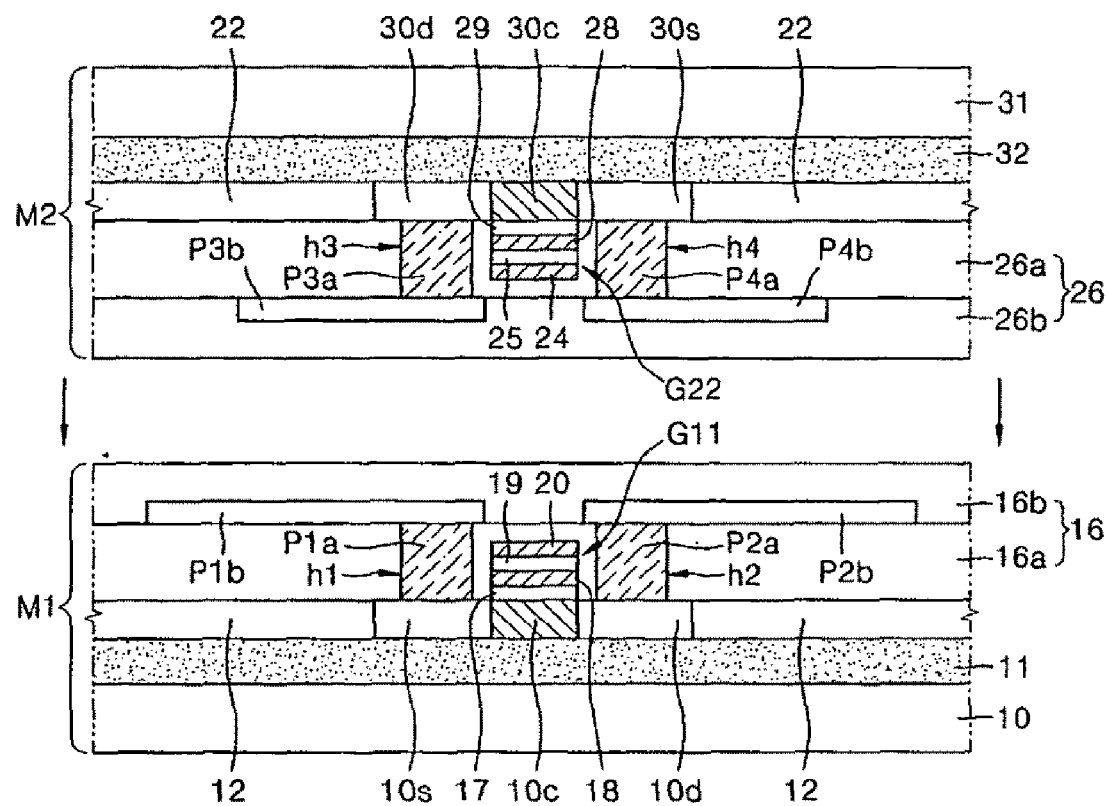
Figure 36:
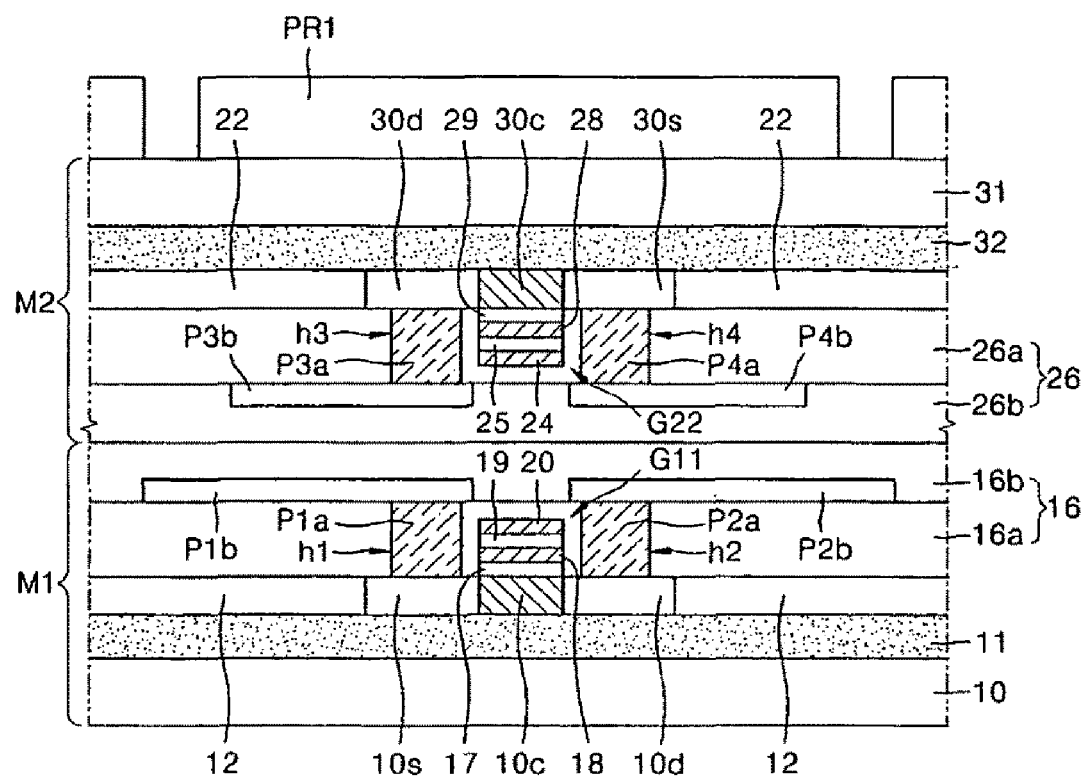

After the p-type first nonvolatile memory M1 and the n-type second nonvolatile memory M2 are formed, as shown in FIG. 35, the n-type second nonvolatile memory M2 may be inverted and aligned above the p-type first nonvolatile memory M1. Thereafter, the n-type second nonvolatile memory M2 may be aligned with put on the p-type first nonvolatile memory M1. Thus, as shown in FIG. 36, the second ILD layer 26b of the n-type nonvolatile memory M2 comes into contact with the second ILD layer 16b of the p-type nonvolatile memory M1. In this state, the p-type first nonvolatile memory M1 and the n-type second nonvolatile memory M2 are compressed and bonded to each other.

As a result, a bottom surface of the first substrate 31 of the n-type second nonvolatile memory M2 faces upward. However, a description of the n-type first nonvolatile memory M2 will be presented on the assumption that the n-type first nonvolatile memory M2 upright, as a matter of convenience. In other words, although it may be illustrated in FIGS. 36 and 37 that other elements of the n-type first nonvolatile memory M2 are disposed under the first substrate 31, the elements of the n-type second nonvolatile memory M2 will be described on the assumption that they are disposed on the first substrate 31.

Referring to FIG. 36, after the bonding process, a photoresist layer PR1 may be coated to a predetermined thickness on the first substrate 31 of the n-type first nonvolatile memory M2. Then, in order to expose the first and second conductive layers P1b and P2b of the p-type first nonvolatile memory M1, a photolithography process and a developing process are performed, thereby exposing predetermined regions of the n-type first nonvolatile memory M2. By using the photoresist layer PR1 as an etch mask, the first substrate 31, the insulating layer 32, the STI layers 22, and the first and second ILDs 26*a* and 26*b* of the n-type first nonvolatile memory M2 and the second ILD 16B of the p-type first nonvolatile memory M1, which constitute a stacked structure (hereinafter, a fifth stacked structure), are sequentially etched.

Figure 37:
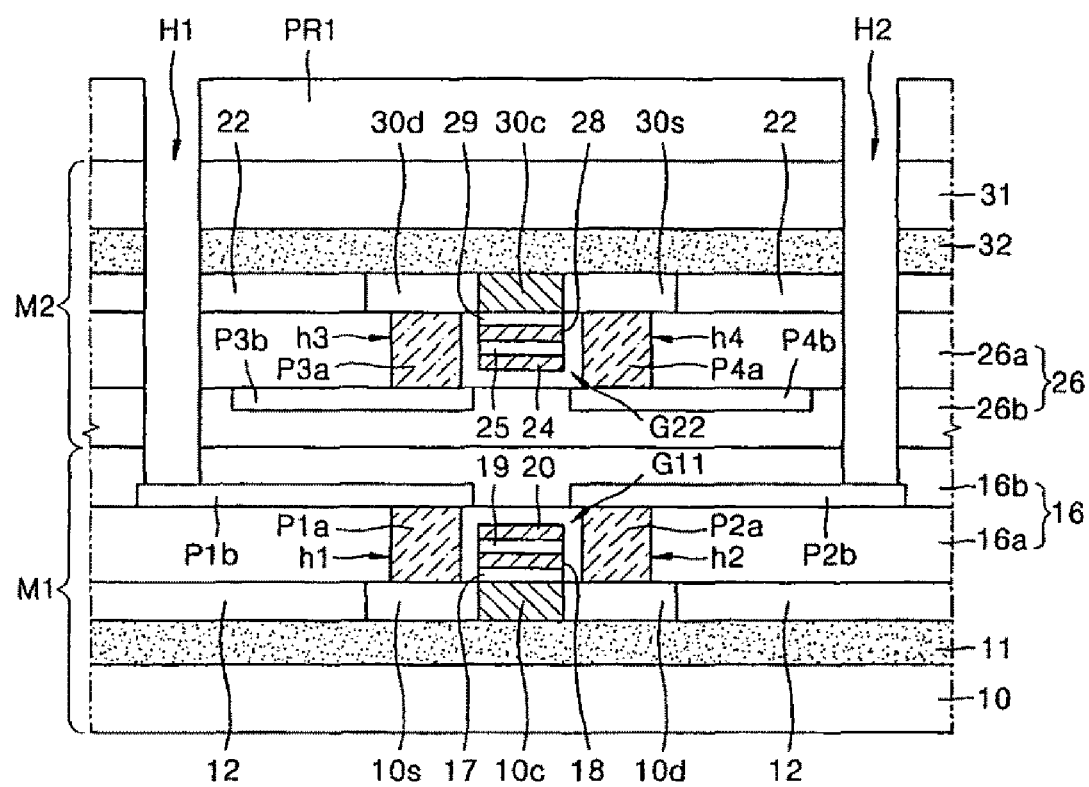

As a result, as shown in FIG. 37, the first via hole H1 and the second via hole H2 are formed in the fifth stacked structure such that they expose the first and second conductive layers P1*b* and P2*b* of the p-type first nonvolatile memory M1. The photoresist layer PR1 may be removed by ashing and stripping. Thereafter, the first and second via holes H1 and H2 are filled with first and second conductive plugs PL1 and PL2, respectively.

Figure 38:
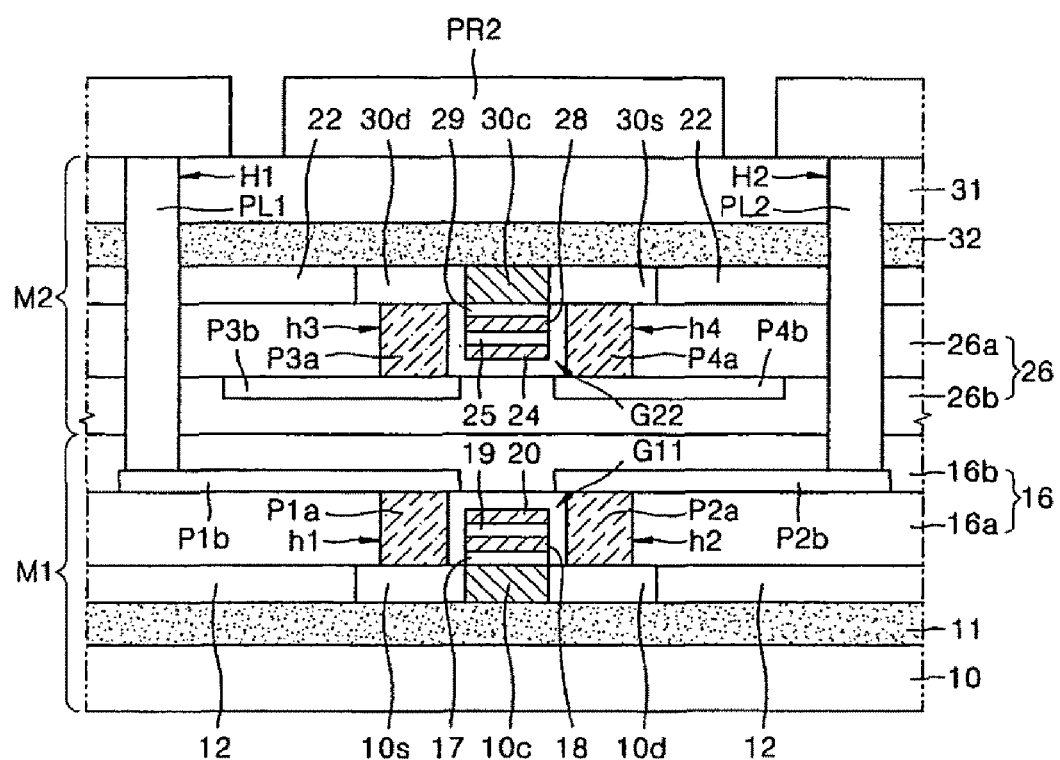

Referring to FIG. 38, a new photoresist layer PR2 may be coated to a predetermined thickness on the first substrate 31 of the n-type first nonvolatile memory M2. A photolithography process and a developing process are performed on the photoresist layer PR2 and thus, predetermined regions of the first substrate 31 corresponding to the first and second conductive layers P3*b* and P4*b* of the n-type first nonvolatile memory M2 are exposed. By using the photoresist layer PR2 as an etch mask, the first substrate 31, the insulating layer 32, the STI layers 22, and the first ILD 26*a* of the n-type first nonvolatile memory M2, which constitute a stacked structure (hereinafter, a sixth stacked structure), are sequentially etched.

Figure 39:
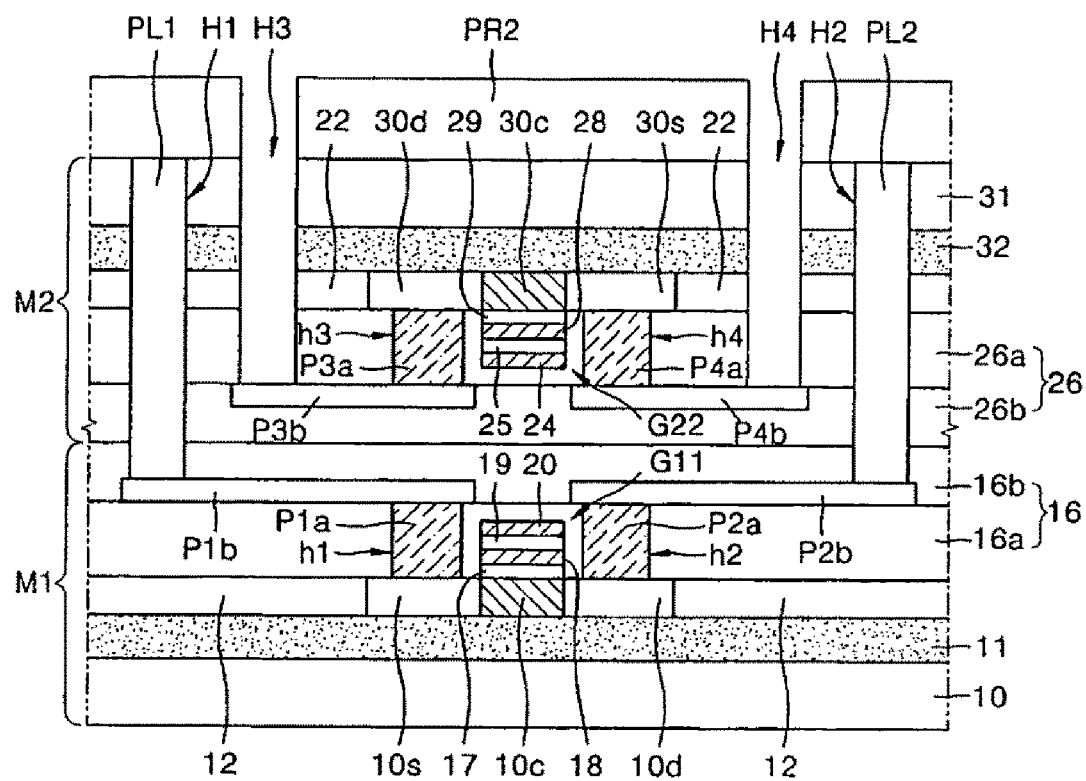

Thus, as shown in FIG. 39, the third via hole H3 and the fourth via hole H4 are formed in the sixth stacked structure such that they expose the first and second conductive layers P3*b* and P4*b*, respectively. Thereafter, the photoresist layer PR2 may be removed.

Figure 40:
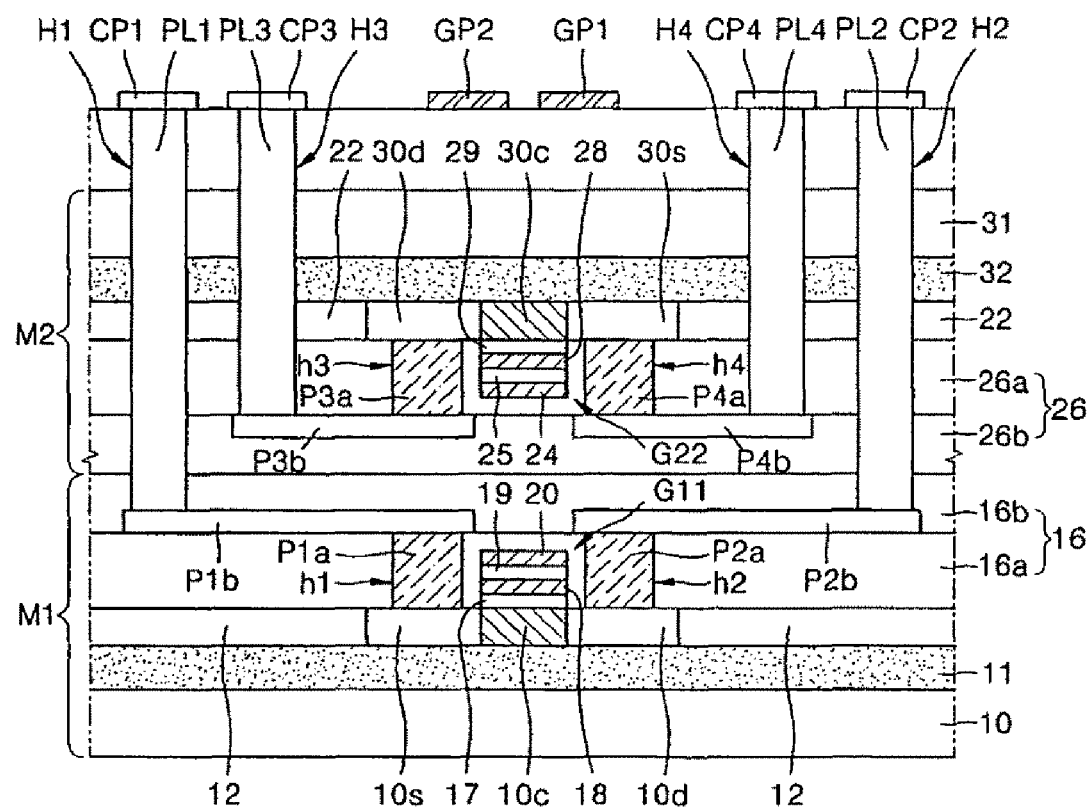

Thereafter, as shown in FIG. 40, the third and fourth via holes H3 and H4 are filled with a third conductive plug PL3 and a fourth conductive plug PL4, respectively. Then, $1^{st}$ through $4^{th}$ contact pads CP1, CP2, CP3, and CP4 are formed on the first substrate 31 of the n-type first nonvolatile memory M2 and cover the entire surfaces of the $1^{st}$ through $4^{th}$ conductive plugs PL1, PL2, PL3, and PL4, respectively. In this case, the $1^{st}$ through $4^{th}$ contact pads CP1, CP2, CP3, and CP4 are separated apart from one another. Thereafter, a process of exposing the first and second gate stacked structures G11 and G22, specifically, a process of exposing the control gates 20 and 24 of the first and second gate stacked structures G11 and G22, may be performed.

Meanwhile, as shown in FIG. 40, as the first and second nonvolatile memories M1 and M2 are bonded to each other, the second gate stacked structure G22 may be disposed on the first gate stacked structure G11. Accordingly, the second gate stacked structure G22 may be preferably formed to a smaller height than the first gate stacked structure G11 to facilitate the process of exposing the control gates 20 and 24 of the first and second gate stacked structures G11 and G22.

By forming the second gate stacked structure G22 to a smaller height than the first gate stacked structure G11, a process of exposing the control gate 20 of the first gate stacked structure G11 (hereinafter, a first process) and a process of exposing the control gate 24 of the second gate stacked structure G22 (hereinafter, a second process) may be separately performed. Thus, the influence of the first process on the second gate stacked structure G22 can be prevented. For example, exposure of the second gate stacked structure G22 due to the first process can be prevented. Likewise, the influence of the second process on the first gate stacked structure G11 can be prevented.

Although not shown in FIG. 40, as a result of the first process, a first gate via hole may be formed in a stacked structure (hereinafter, a seventh stacked structure) including the first substrate 31, the insulating layer 32, the STI layers 22, and the first and second ILDs 26*a* and 26*b* of the n-type first nonvolatile memory M2 and the first and second ILDs 16*a* and 16*b* of the p-type first nonvolatile memory M1. Also, as a result of the second process, a second gate via hole may be formed in the sixth stacked structure. After the first and second gate via holes are formed, they are filled with conductive plugs. Then, a first gate contact pad GP1 and a second gate contact pad GP2 are formed on the first substrate 31 such that they cover the conductive plugs filled in the first and second gate via holes. The first and second gate contact pads GP1 and GP2 are separated apart from each other. However, while using the memory device shown in FIG. 40, the first and second gate contact pads GP1 and GP2 may be integrally connected.

Meanwhile, before the p-type first nonvolatile memory M1 and the n-type first nonvolatile memory M2 are bonded, the first substrate 31 of the n-type first nonvolatile memory M2 may be removed or thinned. After the first and second gate stacked structures G11 and G22 are formed, the first and second contact holes h1 and h2 and the first and second conductive plugs P1*a* and P2*a* may not be formed, but only the first and second conductive layers P1*b* and P2*b* may be formed. Likewise, the first and second conductive layers P3*b* and P4*b* of the first nonvolatile memory M2 may be formed in the same manner.

Also, a single semiconductor substrate, for example, an n-type silicon substrate, can be used in place of the first substrate 10 and the insulating layer 11 of the first nonvolatile memory M1. In this case, the STI layers 12 and the first and second impurity regions 10*s* and 10*d* are formed in the n-type silicon substrate. The first substrate 31 and the insulating layer 32 of the second nonvolatile memory M2 may be replaced by a single semiconductor substrate, for example, a p-type <100> silicon substrate. In this case, the STI layers 22 and the first and second impurity regions 30*s* and 30*d* are formed in the p-type silicon substrate.

When the p-type silicon substrate may be used instead of the first substrate 31 and the insulating layer 32 in the second nonvolatile memory M2, before the first and second nonvolatile memories M1 and M2 are bonded, the first substrate 31 should be thinned.

To make the first substrate 31 thinner, when the p-type single silicon substrate may be prepared, an impurity layer may be formed to a predetermined depth in the p-type single silicon substrate. In this case, the STI layers 22 and the first and second impurity regions 30*d* and 30*s* are formed above the impurity layer in the p-type single silicon substrate. Before the bonding process, the p-type single silicon substrate may be separated at a position where the impurity layer may be formed. The impurity layer may be an H layer or a layer of a mixture of He and B, which may be formed by injecting impurity ions to the p-type single silicon substrate.

Figure 41:
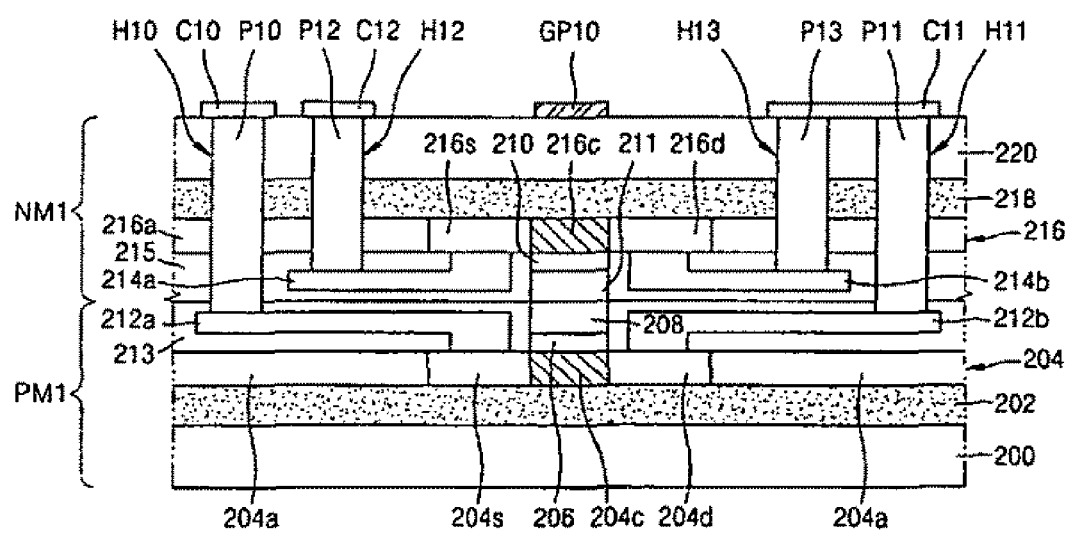
FIG. 41 illustrates a cross-sectional view of a CMOSFET manufactured in the same manner as a nonvolatile memory device according to an embodiment of the present invention.

The nonvolatile memory device and the method of manufacturing the same according to the present invention can be applied to a CMOSFET, and FIG. 41 shows an example of the CMOSFET to which the scope of the present invention may be applied. The CMOSFET shown in FIG. 41 may be disposed on a SOI substrate, but may be disposed on a single silicon substrate. Referring to FIG. 41, the CMOSFET of the present invention includes a P-MOSFET PM1 and an N-MOSFET NM1, which are sequentially stacked. The P-MOSFET PM1 and the N-MOSFET NM1 are bonded to each other such that gate electrodes 208 and 211 contact each other.

The P-MOSFET PM1 includes an insulating layer 202 disposed on a first substrate 200. A semiconductor layer 204 may be disposed on the insulating layer 202. The semiconductor layer 204 includes STI layers 204a and a first impurity region 204s, a second impurity region 204d, and a channel region 204c, which are disposed between the STI layers 204a. The channel region 204c may be disposed between the first and second impurity regions 204s and 204d. One of the first and second impurity regions 204s and 204d is a source region, and the other is a drain region. The first and second impurity regions 204s and 204d are doped with p-type conductive impurities having a predetermined concentration. A gate insulating layer 206 and a gate electrode 208 are sequentially stacked on the channel region 204c. The gate electrode 208 may be a single or multiple layer. A first contact pad layer 212a and a second contact pad layer 212b are disposed on the first and second impurity regions 204s and 204d, respectively. The first and second contact pad layers 212a and 212b extend over the semiconductor layer 204.

As shown in FIG. 41, the first and second contact pad layers 212a and 212b extend on the adjacent STI layers 204a, but any one of them may extend on other member than the STI layer 204a. That is, an angle between the first and second contact pad layers 212a and 212b may be 180°, but may be more or less than 180°. The first and second contact pad layers 212a and 212b and the lateral surfaces of the gate electrode 208 and the gate insulating layer 206 are covered by a first ILD 213. The top surfaces of the first ILD 213 and the gate electrode 208 form a planar surface.

The N-MOSFET NM1 may be turned over and bonded onto the first ILD 213. However, it will be described hereinafter on the assumption that the N-MOSFET NM1 is not turned over, as a matter of convenience.

Referring to FIG. 41, the N-MOSFET NM1 includes an insulating layer 218 disposed on a second substrate 220. A semiconductor layer 216 may be disposed on the insulating layer 218 and includes STI layers 216a, a first impurity region 216s and a second impurity region 216d, which are doped with n-type conductive impurities having a predetermined concentration, and a channel region 216c. The first and second impurity regions 216s and 216d are disposed between the STI layers 216a, and the channel region 216c may be disposed between the first and second impurity regions 216s and 216d. A gate insulating layer 210 and a gate electrode 211 are sequentially stacked on the channel region 216c. A first contact pad layer 214a and a second contact pad layer 214b are disposed on the first and second impurity regions 216s and 216d, respectively. The first and second contact pad layers 214a and 214b extend over adjacent STI layers 216a. The description of the first and second contact pad layers 212a and 212b of the P-MOSFET PM1 can be applied likewise to the first and second contact pad layers 214a and 214b of the N-MOSFET NM1. If the first and second contact pad layers 212a and 212b of the P-MOSFET PM1 and the first and second contact pad layers 214a and 214b of the N-MOSFET NM1 are disposed on the same vertical surface as shown in FIG. 41, the extending length of the first and second contact pad layers 214a and 214b over the STI layers 216a may be smaller than the extending length of the first and second contact pad layers 212a and 212b over the STI layers 204a. In the N-MOSFET NM1, the first and second contact pad layers 214a and 214b and the lateral surfaces of the gate insulating layer 210 and the gate electrode 211 are covered by a second ILD 215. The top surfaces of the gate electrode 211 and the second ILD 215 form a planar surface. The planar surface formed by the gate electrode 211 and the second ILD 215 may be bonded to the planar surface formed by the gate electrode 208 and the first ILD 213 of the P-MOSFET PM1. The top surface of the gate electrode 211 may be bonded to that of the gate electrode 208. A first via hole H10 and a second via hole H11 are formed in a stacked structure including the second substrate 220, the insulating layer 218, the STI layers 216a, and the second ILD 215 of the N-MOSFET NM1 and the first ILD 213 of the P-MOSFET PM1. The first and second via holes H10 and H11 expose the first and second contact pad layers 212a and 212b, respectively and are filled with a first conductive plug P10 and a second conductive plug P12, respectively. A third via hole H12 and a fourth via hole H13 are formed in a stacked structure including the second substrate 220, the insulating layer 218, the STI layers 216a, and the second ILD 215 of the N-MOSFET NM1. The third and fourth via holes H12 and H13 expose the first and second contact pad layers 214a and 214b, respectively, and are filled with a third conductive plug P12 and a fourth conductive plug P13, respectively.

Assuming that a surface of the second substrate 220 on which the insulating layer 218 may be formed may be referred to as a first surface and a surface of the second substrate 220 opposite the first surface, i.e., on which the insulating layer is not formed, may be referred to as a second surface, a first contact pad C10 may be disposed on the second surface of the second substrate 220 such that it contacts the first conductive plug P10. A second contact pad C11 may be disposed on the second surface such that it contacts the second and fourth conductive plugs P11 and P13. A third contact pad C12 may be disposed on the second surface such that it contacts the third conductive plug P12.

The first substrate 200 and the insulating layer 202 of the P-MOSFET PM1 may be replaced by an n-type single silicon substrate. In this case, the STI layers 204a and the first and second impurity regions 204s and 204d may be disposed on the n-type single silicon substrate. Similarly, the second substrate 220 and the insulating layer 218 of the N-MOSFET NM1 may be replaced by a p-type single silicon substrate, and the STI layers 216a and the first and second impurity regions 216a and 216b may be disposed on the p-type single silicon substrate.

In the CMOSFET shown in FIG. 41, the N-MOSFET NM1 and the P-MOSFET PM1 are stacked in an arbitrary order. Accordingly, the P-MOSFET PM1 may be stacked on the N-MOSFET NM1.

By stacking the P-MOSFET PM1 and the N-MOSFET NM1 vertically, the area occupied by the CMOSFET in a memory device can be reduced. Also, in the present invention, the P-MOSFET PM1 and the N-MOSFET NM1 are formed on different substrates, and then the substrates are bonded to each other, thereby completing the CMOSFET. In this process, a manufacturing process can be shortened as compared to when a P-MOSFET and an N-MOSFET are formed in different positions of a plane.

Figure 42:
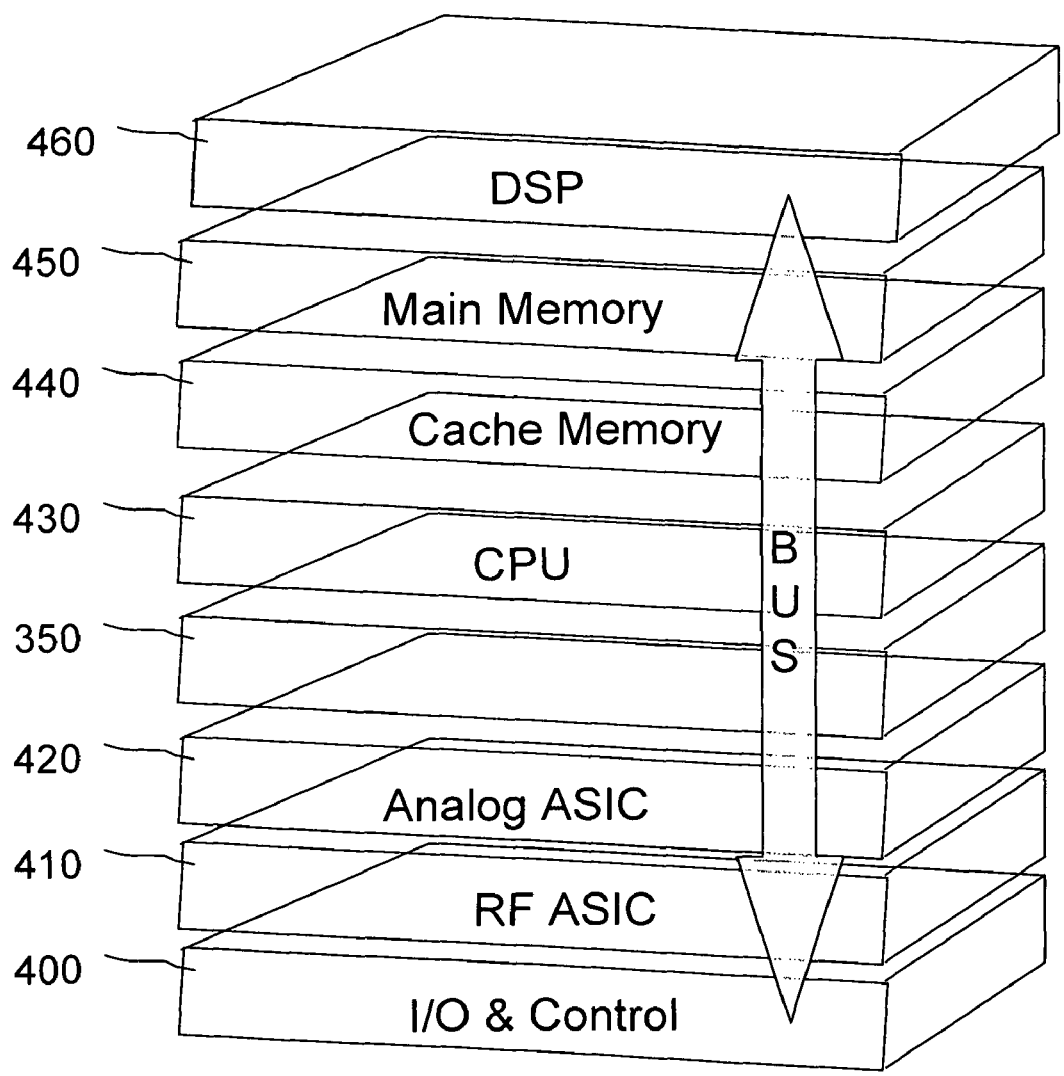
FIG. 42 illustrates a perspective view of a semiconductor device including the CMOSFET shown in FIG. 41.

Moreover, if the CMOSFET includes the P-MOSFET PM1 and the N-MOSFET NM1, which are vertically stacked, as shown in FIG. 41, the CMOSFET and other semiconductor components having predetermined functions, for example, CPUs, memories, digital and analog blocks may be vertically stacked. FIG. 42 shows an example of such semiconductor device including the CMOSFET shown in FIG. 41 and other semiconductor components, which are sequentially stacked.

Referring to FIG. 42, the semiconductor device includes a CMOSFET 350, which may be the same as the CMOSFET shown in FIG. 41. Under the CMOSFET 350, an input/output (I/O) & control block 400, a radio-frequency (RF) application specific integrated circuits (ASIC) block 410, and an analog ASIC block 420 are sequentially stacked. Over the analog ASIC 420, a CPU 430, a cache memory 440, a main memory 450, and a digital signal processing chip 460 are sequentially stacked.

As described above, the nonvolatile CMOS memory device of the present invention includes a p-type nonvolatile memory and an n-type nonvolatile memory, which are 3-dimensionally stacked. To form the nonvolatile CMOS memory device, the p- and n-type nonvolatile memories are formed on separate substrates, and then the substrates are bonded to each other.

Accordingly, the mobility of the memory device can be improved, a well process required for forming the two nonvolatile memories on a single substrate can be omitted to simplify the entire process, and the integration density of the memory device can be increased more than when the two nonvolatile memories are disposed in different positions.

Also, since a unit memory cell may be a CMOS memory including nonvolatile PMOS and NMOS memories, at least two bits can be stored per cell, and one chip can include both a CMOS memory and a CMOS logic.

Also, data may be read based on an output voltage detecting method using a complementary action between the nonvolatile PMOS and NMOS memories so that the restrictions of bit scale-up can be overcome.

Further, after the data state of any one of the nonvolatile PMOS and NMOS memories may be read, the data state of the other can be read using a curve showing a complementary relationship therebetween. Thus, a read operation can be shortened.

Moreover, write and erase operations are performed not in block units but in cell units, thereby improving operating speed and reducing power dissipation.

Exemplary embodiments of the present invention have been disclosed herein, and although specific terms are employed, they are used and are to be interpreted in a generic and descriptive sense only and not for purpose of limitation. For example, those of ordinary skill in the art can bond the first and second nonvolatile memories using an additional bonding member. Also, the data storage layer may be formed of a multiple layer. Further, the P- and N-type nonvolatile memories or the P-MOSFET and N-MOSFET may be secured to each other using flip chip bonding. Accordingly, it will be understood by those of ordinary skill in the art that various changes in form and details may be made without departing from the spirit and scope of the present invention as set forth in the following claims.

What is claimed is:

1. An erasing method of a nonvolatile memory device including a first nonvolatile memory including a first substrate having first and second impurity regions of a first type, and a first channel region and a first gate stacked structure disposed on the first channel region; and a second nonvolatile memory including a second substrate having first and second impurity regions of a second type, different from the first type, and a second channel region and a second gate stacked structure disposed on the second channel region, the first and second nonvolatile memories having a complementary relationship, upper surfaces of the first and second nonvolatile memories being contiguous, the method comprising:
applying a voltage difference to first and second impurity regions of at least one of the first and second nonvolatile memories such that there is an electric potential difference therebetween; and
erasing data written in the at least one of the first and second nonvolatile memories by applying an erase voltage to a corresponding gate stacked structure in the at least one of the first and second nonvolatile memories,
wherein applying the voltage difference includes applying a first voltage difference between the first and second impurity regions of the second type such that there is a first electric potential difference therebetween, and erasing data includes erasing data written in the second nonvolatile memory by applying a first erase voltage to the second gate stacked structure.

2. The method as claimed in claim 1, further comprising, before erasing the data, reading and confirming data written in the first and second nonvolatile memories.

3. The method as claimed in claim 1, wherein:
applying the voltage difference further includes applying a second voltage difference between the first and second impurity regions of the first type such that there is a second electric potential difference therebetween; and
erasing data includes erasing data written in the first nonvolatile memory by applying a second erase voltage to the first gate stacked structure.

4. The method as claimed in claim 3, further comprising, before erasing the data written in the first nonvolatile memory, reading and confirming data written in the first and second nonvolatile memories.

5. The method as claimed in claim 1, further comprising:
applying a second voltage between the first and second impurity regions of the first type such that there is a second electric potential difference therebetween; and
writing data to the first nonvolatile memory by applying a write voltage to the first gate stacked structure.

6. The method as claimed in claim 3, further comprising:
writing data to the second nonvolatile memory by applying a write voltage to the second gate stacked structure.

7. The method as claimed in claim 1, wherein the first and second impurity regions of the first type have no electric potential difference therebetween.

8. An erasing method of a nonvolatile memory device including a first nonvolatile memory including a first substrate having first and second impurity regions of a first type, and a first channel region and a first gate stacked structure disposed on the first channel region., and a second nonvolatile memory including a second substrate having first and second impurity regions of a second type, different from the first type, and a second channel region and a second gate stacked structure disposed on the second channel region, the first and second nonvolatile memories having a complementary relationship, upper surfaces of the first and second nonvolatile memories being contiguous, the method comprising:
applying a voltage difference to first and second impurity regions of at least one of the first and second nonvolatile memories such that there is an electric potential difference therebetween; and
erasing data written in the at least one of the first and second nonvolatile memories by applying an erase voltage to a corresponding gate stacked structure in the at least one of the first and second nonvolatile memories,
wherein applying the voltage difference includes:
applying a first voltage difference between the first and second impurity regions of the first type such that there is a first electric potential difference therebetween;
applying a second voltage difference between the first and second impurity regions of the second type such that there is a second electric potential difference therebetween; and
erasing data includes:
erasing data written in the first nonvolatile memory by applying a first erase voltage to the first gate stacked structure; and
erasing data written in the second nonvolatile memory by applying a second erase voltage to the first gate stacked structure.

9. The method as claimed in claim 8, wherein the first and second voltage differences are the same.

10. The method as claimed in claim 8, wherein the first and second erase voltages are the same.

* * * * *